(12) United States Patent
Gressel et al.

(10) Patent No.: US 7,206,797 B2
(45) Date of Patent: Apr. 17, 2007

(54) RANDOM NUMBER SLIP AND SWAP GENERATORS

(75) Inventors: Carmi David Gressel, Kibbutz Urim (IL); Alex Shevachman, Beer Sheva (IL); Evgeny Aizman, Petah Tikva (IL); Michael Slobodkin, Arad (IL); Simon Cooper, Ashdod (IL)

(73) Assignee: M-Systems Flash Disk Pioneers Ltd., Omer (IL)

( * ) Notice: Subject to any disclaimer, the term of this patent is extended or adjusted under 35 U.S.C. 154(b) by 710 days.

(21) Appl. No.: 10/413,430

(22) Filed: Apr. 14, 2003

(65) Prior Publication Data

US 2004/0205095 A1    Oct. 14, 2004

(51) Int. Cl.
    *G06F 7/58*    (2006.01)
(52) U.S. Cl. .................................... 708/250; 708/252
(58) Field of Classification Search ................ 708/250, 708/252
    See application file for complete search history.

(56) References Cited

U.S. PATENT DOCUMENTS

| | | | |
|---|---|---|---|
| 5,706,218 A | 1/1998 | Hoffman | |
| 6,065,029 A * | 5/2000 | Weiss | 708/251 |
| 6,993,542 B1 * | 1/2006 | Meiyappan | 708/250 |
| 2004/0006580 A1 * | 1/2004 | Miller | 708/250 |

FOREIGN PATENT DOCUMENTS

WO    WO 00/42484    7/2000

OTHER PUBLICATIONS

Gressel, C. and I. Dror, "Holy Cows or Mad Cows Study of the X.9.31 1997 Draft for Use of the Rabin and RSA Cryptosystems on Digital Signatures in Financial Services", 3rd Mediterranean Workshop on Coding and InformationIntegrity, Ein Boqeq, Oct. 1997.
Blum, L., Blum, et al, "A Simple Unpredictable Pseudo-Random Generator", SIAM Journal of Computing, vol. 15, No. 2, May 1986.

(Continued)

*Primary Examiner*—D. H. Malzahn
(74) *Attorney, Agent, or Firm*—Ladas and Parry LLP

(57) ABSTRACT

A microelectronic apparatus and method for generating random binary words including at least one clocked pseudorandom binary number sequence generator normally operative to generate a cyclic output sequence of binary numbers, each number including a string of binary symbols, the cyclic output sequence including a basic sequence which is generated repeatedly, at least one bit stream generator generating a clocked bit stream including a stream of binary symbols of a first type occasionally interrupted by a binary symbol of a second type, wherein a first varying time interval between the occasional interruptions is intractably correlated to the output sequence of the number sequence generator, wherein each occurrence of an interruption of the stream of binary symbols of the first type by a binary symbol of the second type causes a pseudorandom modification of the cyclic output sequence of the number sequence generator and a sampling device operative to sample the cyclic output sequence of binary numbers thereby to generate a sampled output sequence including at least one sampled binary word.

20 Claims, 40 Drawing Sheets

OTHER PUBLICATIONS

Maurer, U.M., A Universal Statistical Test for Random Bit Generators, Journal of Cryptography, vol. 5 No. 2, 1992, pp. 89-106.
Federal Information Processing Standards Publication, FIPS PUB 140-2, NIST, issue of May 25, 2001, pp. 35-37 and p. 55.
Claude E. Shannon, Bell Laboratories Memorandum Article, "Analogue of the Vernam System for Continuous Time Series", May 10, 1943, pp. 144-146.
Knuth, D.E., Seminumerical Algorithms—The Art of Computer Programming, vol. 2, Addison-Wesley, Reading, Mass., 1981, pp. 38 to 73.
Dixon, R.C., Spread Spectrum Systems, Wiley-Interscience, New York, 1976, Chapter 3, pp. 86 to 91.
"The Intel® Random Number Generator", Intel Platform Security Division, 1999, pp. 4-12.

* cited by examiner

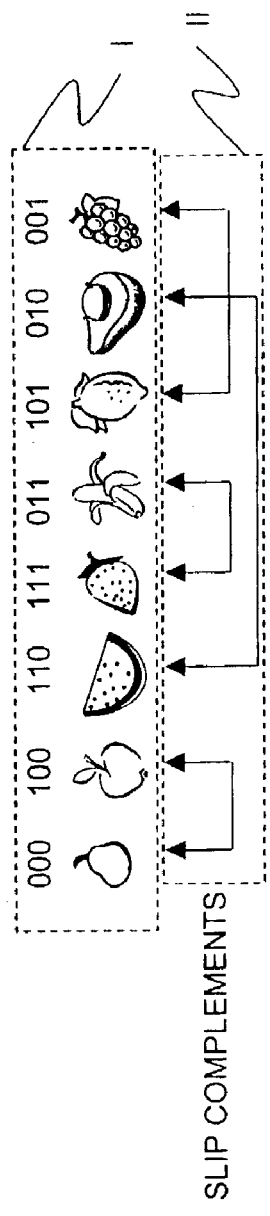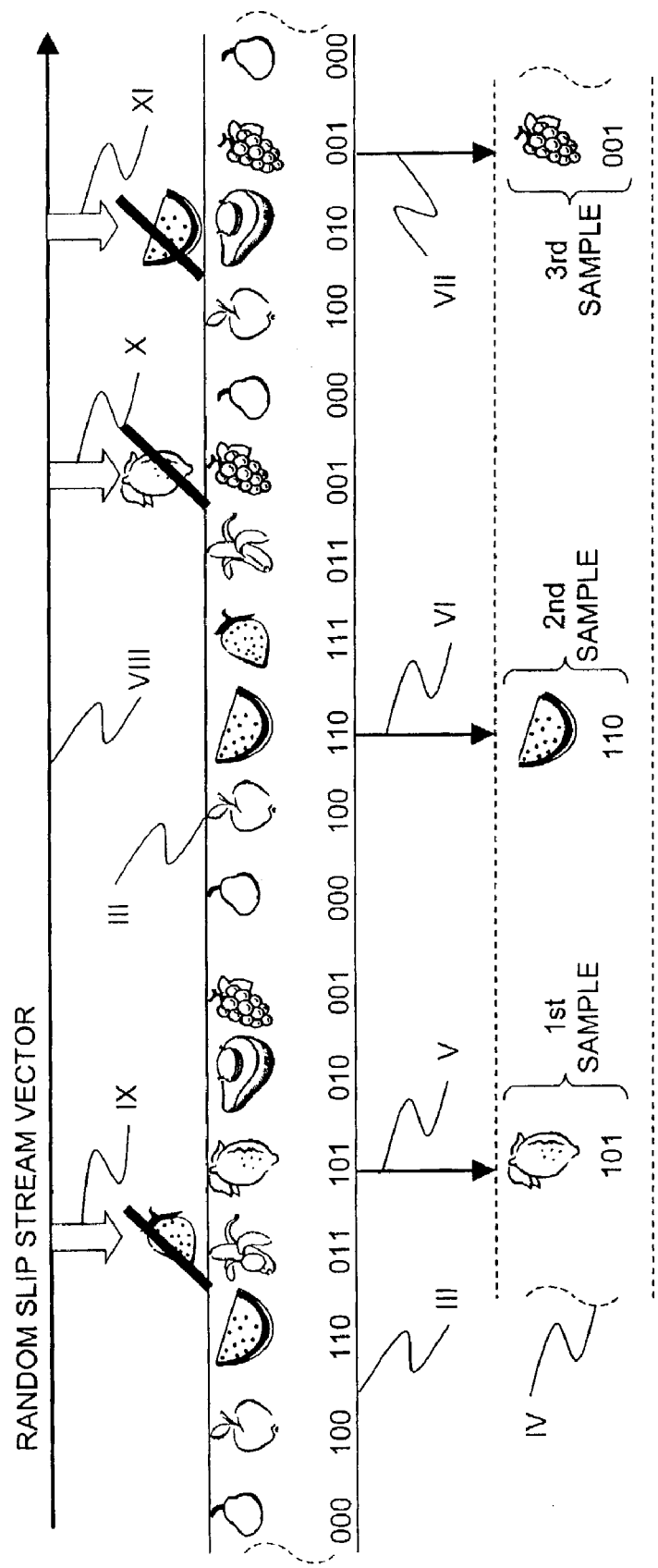

FIG. 22A (PRIOR ART)

| Run Length | Aver # of Runs in 10K | Max Deviation Percent | Max Deviation Number of Runs | Required Resultant Interval |
|---|---|---|---|---|
| 1 | 2500 | ±7.4% | ±185 | 2315 – 2685 |
| 2 | 1250 | ±10.9% | ±136 | 1114 – 1386 |
| 3 | 624 | ±15.7% | ±98 | 527 – 723 |
| 4 | 312 | ±23% | ±72 | 240 – 384 |
| 5 | 156 | ±34% | ±53 | 103 – 209 |

FIG. 22B

| Run Length | Aver # of Runs in 10K | Max Deviation Percent | Max Deviation Number of Runs | Required Resultant Interval |
|---|---|---|---|---|
| 6 | 78 | ±50% | ±39 | 39 – 111 |
| 7 | 39 | ±73% | ±28 | 11 – 67 |
| 8 | 20 | -100% - +106% | -20 - +21 | 0 – 21 |
| 9 | 9.75 | -100% -+155% | | 0 – 15 |
| 10 | 4.88 | -100% -+227% | | 0 – 11 |
| 11 | 2.44 | -100% -+331% | | 0 – 8 |
| 12 | 1.22 | -100% -+480% | | 0 – 6 |
| 13 | 0.61 | -100% -+706% | | 0 – 4 |
| 14 | .30 | -100% -+1030% | | 0 – 3 |
| 15 | 0.15 | | | |
| 16 | 0.08 | | | |
| 17 | 0.04 | | | |
| 18 | 0.02 | | | |
| 19 | 0.01 | | | |
| 20 | 0.005 | | | |
| 21 | 0.005 | | | |
| 22 | 0.002 | | | |
| 23 | 0.001 | | | |
| 24 | 0.0006 | | | |
| 25 | 0.0003 | Longest allowable | | |

RANDOM NUMBER SLIP AND SWAP GENERATORS

FIELD OF THE INVENTION

The present invention relates to microelectronic logic and analog apparatus operative to generate strings of random symbols and random noise.

BACKGROUND OF THE INVENTION

Conventional prior art random number generators and associated technologies are described in the following documents:

Intel's U.S. Pat. No. 5,706,218;
Applicant's PCT published application, WO 00/42484;
Gressel, C. and I. Dror, "Holy Cows or Mad Cows Study of the X.9.31 1997 Draft for use of the Rabin and RSA Cryptosystems on Digital Signatures in Financial Services", 3rd Mediterranean Workshop on Coding and Information Integrity, Ein Boqeq, October 1997;
Blum, L., Blum, M. and Shub, M., "A Simple Unpredictable Pseudo-Random Generator", SIAM Journal of Computing, Vol. 15, No.2, May 1986.
Maurer, U. M., "A Universal Statistical Test for Random Bit Generators", Journal of Cryptography, Volume 5 Number 2, 1992, pages 89–106;
Federal Information Processing Standards Publication, FIPS PUB 140-2, NIST, issue of May 25, 2001, pages 35–37 and page 55;
Specification No. TS 102 221 V3.0.0F-06921 published by the European Telecommunications Standards Institute 2000;
Claude E. Shannon, Bell Laboratories Memorandum article, "Analogue of the Vernam System for Continuous Time Series", May 10, 1943, pages 144–146;
Knuth, D. E., Seminumerical Algorithms—The Art of Computer Programming, Vol 2, Addison-Wesley, Reading, Mass., 1981, pages 38 to 73;
Dixon, R. C., Spread Spectrum Systems, Wiley-Interscience, New York, 1976, Chapter 3, pages 86 to 91; and
Texas Instrument's OMAP Preliminary User's Manual Security Features, January 2001, particularly FIG. 7-15.

The disclosures of all publications mentioned in the specification and of the publications cited therein are hereby incorporated by reference.

SUMMARY OF THE INVENTION

Producing unbiased, unpredictable binary strings is a prerequisite for many modern numerical applications. Unpredictable and computationally "difficult to predict" sequences are used for lotteries, gaming machines, cryptographic challenges, and testing apparati, where exhaustive random testing often should complement or replace closed form rigorous mathematical proofs.

Most physical sources of randomality suffer from biased recurrent patterns that reduce the entropy of an output analog signal or a digital sequence. Strong correlations between two recorded outputs allow a hacker to predict future data, given past results. Accepted engineering practice uses such physical sources as inputs to scramblers, numerical hashers, modular arithmetic multipliers or pseudorandom number generators to achieve unpredictable results.

The purpose of a preferred embodiment of the present invention is to produce sequences of binary digits (ones and zeroes) that are computationally extremely difficult to predict, either as a unit or as a part of a system that complies with known rules and regulations. Such sequences are often called binary strings or random numbers. The present invention can then, typically, preclude the necessity of additional pseudo-randomizers for many applications.

Common methods for generating random sequences are based on two or more uncorrelated oscillators. Autonomous oscillating devices or pseudorandom linear feedback shift registers are driven by such oscillators sampled at random periods at a slower uncorrelated random frequency as in Intel's U.S. Pat. No. 5,706,218 and as in Gressel, C. and I. Dror, "Holy Cows or Mad Cows Study of the X.9.31 1997 Draft for use of the Rabin and RSA Cryptosystems on Digital Signatures in Financial Services", 3rd Mediterranean Workshop on Coding and Information Integrity, Ein Boqeq, October. 1997. Physically generated random sequences generally undergo subsequent "entropy enhancement" in a computation that involves a random compression or scramble.

Blum, L., Blum, M. and Shub, M., "A Simple Unpredictable Pseudo-Random Generator", SIAM Journal of Computing, Vol. 15, No. 2, May 1986, (hereinafter "Blum") suggested a method for generating an acceptable random number sequence from biased (colored) random strings emanating from physical sources. Blum suggests using a large prime number N, and a large sampled random number B to produce an unpredictable number, $B^2 \mod N$.

In a popular smart card integrated circuit, ST16CF54, manufactured by ST Microelectronics, a variation of the Blum generator is used as an entropy enhancer in which the concatenated outputs of two random feed back registers generate two 512 bit random strings, B and N. These are input into a modular arithmetic coprocessor to generate a 512 bit string:

$[(B^2) \, 2^{(-512)}] \mod N$.

Such strings typically pass the popular Maurer test, described in Maurer, U. M., "A Universal Statistical Test for Random Bit Generators", Journal of Cryptography, Volume 5, Number 2, 1992, (hereinafter "Maurer").

Such circuitry and method is adequate for most computational testing devices, for noise generation, or for gaming purposes, but does not qualify for certification for mobile phone circuitry, or for Common Criteria as described in the Federal Information Processing Standards Publication, FIPS PUB 140-2, NIST, Statistical and Random Number Generator Tests, pages 35–37 and 55, Gaithersburg, Md. 10899-8900, issued May 25, 2001, henceforth FIPS140-2. Also an autonomous oscillating generator is not acceptable for the European Telecommunications Standards Institute 2000, TS 102 221 V3.0.0F-06921 for Universal Integrated Circuit Card (UICC) interface, sections 5.1.4, 5.2.3 and 5.3.3, Clock CLK (contact C3), Sophia Antipolis, France, (henceforth "ETSI CLK").

ETSI CLK teaches that to avert radiation of interference frequencies for certain telecommunication implementations "no 'internal clock' UICC shall be used". The "internal clock" refers to an oscillating device, included in a microelectronic oscillation generating device, as opposed to a primary clock, external to the device and also termed herein a "system clock", which is activating a preferred embodiment, whilst the mobile telephone is in broadcast mode. This may imply that in certain instances, a second internal oscillator may typically be used to establish a random initial condition, prior to activating a radio frequency broadcast.

The FIPS 140-2 specification's constraints are more difficult to achieve, as they color the spectrum in a very structural way, precluding a simple scramble, in a Blum "generator", or other pseudo-randomizing method. It is believed that by coloring, the accepted possible output of numbers (the complete spectrum) will either preclude certain parts of the spectrum of possible numbers or reduce or exaggerate the frequency at which such numbers may appear in a histogram of all accepted numbers ("shading" or "exaggerating" a particular "color" in the spectrum).

Many mathematical functions, which can be implemented in hardware or software, produce sequences, which pass all tests for randomness for almost all numerical inputs. Such functions are called pseudo-random, since if an observer knew both the input and the function, he could know the "pseudo-random" output. There is no complete randomness, but a number is called random and unpredictable, or intractably difficult to compute, if an observer has insufficient or little knowledge or control of the inner variables of a generator at a given time of sampling, and would have difficulty using his limited knowledge to predict future outputs. Non-predictability means that the output of the feedback shift register is a sampling that has an intractably externally indiscernible correlation to a previous sampling of a plurality of sequence generator outputs and is computationally difficult to predict without knowledge of the internal state of the microelectronic random number string generator.

Conceptually, included in the embodiments of the generators described above are central processing units, CPUs, and finite state machines, FSMs. Finite state machines are logic control devices that typically control sequential processes. The FSMs typically assure that a programmer can only enhance or enable operation of the preferred embodiments. The CPU when programmed with secured immutable memory, with "frozen" methods of sampling typically ensures intractably computable correlation between the state of the number generating logic and the clock period of the sample. According to one preferred embodiment of the present invention, the FSM audits, "on the fly", the qualities of the random strings to ensure a more even histogram of words of the output strings.

Prior art FIG. 22A illustrates the relevant FIPS 140-2 specifications for random number segments whose run length is 1–5. FIG. 22B is a table derived from the table of FIG. 22A for random number segments whose run length is 6–25.

The output of a logic device is parsed into n bit words, 32>=n>=16. FIPS 140-2 specifies that two consecutive words should not be identical. (A removal of a second word identical to a previous binary word in an ideal device might sacrifice randomality in an infinitely long string, but in a practical device, the act of removing such a repetition typically creates a warning signal, suggesting a faulty clocking of the device).

"Runs" are binary sequences of all ones or all zeroes. The above-referenced FIPS 140-2 document specifies a long and short runs test.

In the long "run" test on a 20,000 bit concatenated string in a FIPS 140-2 compliant application there should never occur a run of length longer than 25. Typically, random strings are composed of sampled words of 8, 16, 24 or 32 bit lengths. Typically, these concatenated longer strings are, by definition, almost completely unpredictable.

Therefore, compensation is typically achieved such that the number of same symbols in a run on the right hand side of one word added to the number of same symbols in a run on the left hand side of the next concatenated word, is typically at least two bits less than the length of the sum of the lengths of the two words, and also should be less than 26. This might imply that in each independent 8 bit sample, there should always be at least one "1" and one "0". Typically, 16 or 24 bit samples are be parsed into two sections, and there should be at least one "1" and one "0" in each of the two parsed sections. In a 32-bit sample device, there should be three such sections, with the sum of the left hand and right hand section no larger than 27 bits. In the preferred embodiment wherein only the 16 least significant bits of a 24 bit (parsed in two 12 bit sections) random word are sampled, the longest theoretical long run might be 30 bits long.

A further FIPS 140-2 short run demand, to be tested on random 20,000 bit sampled concatenations based on the statistics of large numbers, wherein the allowable deviation from the average number of single literals (same symbols "1" or "0") is 7.4% of the average. The allowable deviation increases by a factor of about 1.44 for each subsequent length, as shown in FIG. 22. FIG. 22B shows an extrapolation of the FIPS statistics, to demonstrate the number of longer strings that may be expected, if the maximum lengths are limited to 14, in 16 bit independent samples, and if the maximum lengths are limited to 22, in 24 and 32 bit independent samples.

Practically, for eight bit words, two combinations (all ones and all zeroes) out of $2^8$ (=256) possible combinations have been eliminated, a total distortion of less than 1%. For a longer parsed section the distortion is further reduced.

The FIPS 140-2 document of May 25, 2001 includes a "monobit test" on any random 20,000 bit string where X is the number of "1" symbols in the string and the test is passed if 9,725<X<10,275. Stated differently, the number of "1" and "0" symbols should be reasonably close to equal.

The FIPS 140-2 document also describes a "poker test" where the 20,000 bit string is parsed into consecutive 4 bit nibbles. The number of each of the possible 4 bit values is counted and stored. f(i) denotes the number of each 4 bit value, i, where $0<=i<=15$. The function which evaluates may be:

$\mathrm{SigmaI} = ([f(i)]^2 \text{ summated over i, and}$ $X = (16/5000)*(\mathrm{SigmaI}) - 5000,$ The test is successful if 2.16<X<46.17.

To give a sense of acceptable deviation, if all 16 four bit value i counters samplings were completely equal, there might be 312.5 nibbles of each of the sixteen possible nibbles and X might be equal to zero. If, however, half of the nibbles had 290 samplings and the other half of the nibbles had exactly 335 samplings, then X might be equal to about 29.

Achieving a guaranteed binary string that complies with the FIPS 140-2 and with other tests might require re-parsing of the scrambler output, and running checks for long runs and concatenated adjacent identical words, In contrast the devices of the present invention, can be cost effective to produce acceptable long strings.

In addition to the criteria from FIPS 140-2, many statistical tests have been suggested in the literature, as described in Knuth, D. E., Seminumerical Algorithms—The Art of Computer Programming, Vol 2, Addison-Wesley, Reading, Mass., 1981. Simulations of all of the suggested generators sampled no sooner than once every clock shift, comply with all of the standard tests.

All of the embodiments are based on the logic of randomly distorted pseudorandom binary sequences, as produced by maximum length linear feedback shift registers, (LFSRs). These sequences may be produced in a compact form using LFSRs with glue logic, which distorts the sequences by changing the stage of the register in a given sequence at random periods, and/or by changing the feedback taps in an LFSR, which quickly changes the sequence produced by clocking the LFSR.

Linear Feedback Shift Registers are linear in the sense that any sequence in the register is followed by another (only one) defined sequence in the register, cyclically, until all sequences have been generated. Non-linear LFSRs can generate more than one sequence from any given sequence.

LFSRs can be configured as in the embodiments presented herein, or equivalently with feedback schemes as suggested in Dixon, R. C., Spread Spectrum Systems, Wiley-Interscience, New York, 1976, Chapter 3, or by table look up devices.

If an adversary or hacker knows $2^n$ (2 to the power of n) bits of a sequence of an unmodified n bit LFSR, he or she can easily derive the feedback configuration, which produced the sequence. If an oracle knows the configuration of an unmodified LFSR, and he/she can sample the contents of the device at a given clock cycle, if he/she can know the number of clock cycles that occurred before or after the known clock period, he/she can derive the contents at such given instant. All of the embodiments preferably have elements, which prevent the hacker from estimating the stage of the output at a given sampling, as all embodiments contain non-linear functionality derived from random sources.

The embodiments shown and described herein preferably include modifications and additional logic devices that utilize random sources that mask the changes of configurations and mask the knowledge of the true contents of a modified LFSR at a given time. The devices are organized in a manner such that a hacker or an adversary cannot force the random generator to produce a string that is "made to order" or a string that the adversary might possibly predict, in part or in total, or a string adversary might by knowing one part of a sequence, be assisted in being able to derive with reasonable success, any other part of the sequence.

The "stage" of an n bit LFSR is one of the ($2^n-1$) clocked n bit sequences, which can be produced in a maximum length configuration. Normally, the progress from one stage to the next stage in the sequence is enacted by a clock which right shifts the values in each of the flip flops, and simultaneously shifts in the feedback bit into the leftmost flip-flop. The feedback bit is typically an XORed result of pairs of tapped flip-flop outputs.

If the feedback bit is two's complemented (XORed) with a random "1" and shifted into the leftmost flip-flop, the contents are altered to a stage "forward" which might "normally occur" an equiprobable natural number, smaller than $2^n$, of clock cycles later, as illustrated and explained herein. According to a preferred embodiment of the present invention, sampling is typically enacted only randomly and preferably not more often than once in 64 system clock cycles.

A Random Slip of an LFSR, is defined as the change caused by this random complement of the feedback signal.

The number of clocks between one sampled stage to the next sampled sequence is defined as the distance between the two stages or the random distance. The absolute distance between any two stages of an n bit LFSR in a Random Slip is a random number from 1 to ($2^n-2$)/2, as is illustrated in a five bit LFSR example.

A Random Swapped distortion of the feedback on an LFSR, is defined as a change in the configuration of the XORed taps from the register. A random swap changes the sequence of stages of the register, whereas a random slip changes the stage of the sequence.

In FIGS. 1A–3B, random swaps and random slips are shown for simplicity implemented on five bit LFSRs but this 5 bit length is just an example and is not intended to be limiting.

In those embodiments wherein the sampled word is a concatenation of more than one LFSR, typically, the registers are all of different lengths, in order to lengthen the natural deterministic synchronized numerical sequence, and to allow the occurrence of longer than 14 bit single symbol runs.

Concatenated LFSRs are typically driven and sampled using a higher uncorrelated frequency to drive the LFSRs, and at least one of lower frequencies for typically random sampling. Typically, the LFSRs' cyclic progressions are decoupled, such that knowing the output of one, might not reveal the sequence of a second generator; thereby preventing a lock-in to a deterministic sequence. This decoupling is typically achieved by use of the Random Swap, the Random Slip, or a temporary deceleration of the LFSR clock frequency. Typically, in such concatenated configurations the registers are decoupled using one of the decoupling methods described herein.

Establishing the initial condition, e.g., bringing the first sampling of the register to a random state unknown to an external "observer", is of utmost importance, and virtually impossible without at least one random phenomenon which occurred previous to the first sampling. In these preferred embodiments, typically, the devices will be operative for more than 10 million clock cycles prior to sampling outputs for use.

In mobile phones, and other wireless communication devices, activation of a second non-correlated high frequency oscillator potentially interferes with the operation of a signal produced by such a device, therefore precluding activation of the oscillator when the wireless device is in a communication mode. Initial random conditioning to a random initial state of the device for a length of time with an autonomous oscillator, whilst an external binary stream slips and/or swaps the stages and feedback configurations, can cause the device to be in an intractably difficult to detect state, such that for many uses, an additional physically generated phenomenon might not be advantageous.

A method to prevent an observer from obtaining any knowledge from the sampled sequences of the internal state of the binary string generator is described wherein the CPU at intervals enacts a sampling of a binary word generator which is stored in an intermediate storage register, wherein such word is XORed (added modulo 2) to the previously stored word in the intermediate storage register and is latched into the output port of the entire generating apparatus. XORing two blind (unread) samples yields a third sample. Typically, the XORed "sum" of any two output words is an acceptable word. The FIPS 140-2 specification has put limitations on which accepted sampled words may be concatenated in a random order. To be compliant with FIPS 140-2 specifications, a filtering method on the output words is implemented. An auditing FSM is provided, which enables the CPU to audit the proper workings of the XOR generator, and to enable the CPU to correct the bias of ones or zeroes caused by the filtering method.

In FIPS 140-2 compliant devices wherein a specified word, e.g., an all one string in a 12 bit output word is not acceptable, and that word is replaced with another word with one bit modified to a zero output, the entropy (spectrum) of the output has been lowered, as there are now two acceptable words with the same probability. An embodiment of an FSM is demonstrated which audits such bias.

A status register device operative to sense faulty operation of the binary string generator, and/or reoccurrence of modified words, and/or automatic re-sampling in the event of two adjacent suspect words is described. Such problems can arise if a clocking device is faulty, and the same result is recorded consecutively, where the central processor is typically operative to force the device to perform a checklist of faults and/or atypical outputs.

Random phenomena occurring in standard semiconductor devices serve to enhance the randomality of the initial operating conditions of the device. These embodiments are not typically dependent on the "random physical phenomena". A list of such random physical aberrations typically might include, flip flops powering on to an unpredictable one or a zero when a device is powered up; normal noise variance in operational amplifiers, and the varying frequency of autonomous oscillators caused by sensitivity to temperature of the silicon substrate or the external supplied voltage.

Once these initial conditions have been established, the hacker should not be able to deduce or even properly estimate the internal state of the generator at any given future time during a powered up session.

It is assumed that a given device, when powered up, enters a given state, even if this assumption is proved incorrect. Obviously, if, at power up, the state is random or even partially random, e.g., some commercial flip flops "awaken" at power up, with a probability of about half in a one state, such randomness only enhances the entropy.

Chaos devices, in the purely digital sense, are sequential generators that map into known sequences with known inputs. When chaos functions are translated into their analog equivalents, the mapping is not deterministic, but is inevitably biased. According to a preferred embodiment of the present invention, a simple "tent" chaos device is provided, which is periodically traumatized with a random digitally derived voltage to force the chaos device into a new temporary metastable condition.

The idealized next sampled output voltage as a function of the previous sampled output of such an analog "tent" chaos device can be estimated as:

$Vout=2 Vin$ for $0<Vin<0.5\ VDD$, and $Vout=2VDD-2\ Vin$ for $0.5\ VDD\ (Vin<VDD$.

In an ideal analog configuration, one half of the values are more than one half VDD, and the other half of the expected values are less than one half VDD. If 0.5 VDD is the threshold value of a comparator, then the output of the comparator is typically a string of "1" and "0" logic values.

Such a sequence might have a very long period (number of stages) if it were a digital machine, typically, with a high resolution numerical processor, assuming that it gets stuck on zero (Vout=0 if Vin=VDD), or that it oscillates between 0.4 VDD and 0.8 VDD, as follows:
if Vout/in=0.4 VDD then Vin/out=0.8 VDD and vice versa (an oscillator); and if Vin=0 then Vout=0 (a "stuck on zero" situation).

In a stable analog implementation, recurrent mappings into a colored random stream, and possible oscillating streams are typically expected. It is unexpected that such a sequence will "get stuck on zero"; as the normal maximum voltage output of an amplifier is less than VDD, therefore cannot force the output to zero voltage, and the minimum output of such a device is typically at a small offset value.

In a conventional LFSR configuration, there is always the danger that on power on, or at an intermittent glitch, all flip-flops may be reset to zero. This is a common problem in many first generation random number generators. In preferred embodiments, a multi-input NOR gate configuration connected to all but the n'th output of an n stage LFSR forces the feedback to a "1", precluding the all zero stage, and assuring that such LFSRs never contribute to a long run of zeroes, or to a "stuck on zero" constant output".

In preferred embodiments, the existence of an all "1" output is also precluded by a multi-input NAND gate which detects the existence of "1"s in all but one of the outputs, and forces a zero into the remaining output bit.

An n bit word is defined as "suspect" when an above mentioned NOR or NAND gate forces either a one or a zero into an output bit. In preferred embodiments, the occurrence of suspect long runs of ones or zeroes are sampled, e.g., the forcing output of either the multi-input NOR or NAND gate, along with the output. Such suspect NOR or NAND outputs should be sampled by the CPU or other finite state machine which processes the sampled output. Alternate incidence of suspect occurrences might typically be disregarded, as each "suspect" output represents two equiprobable instances; i.e., in a very large histogram of all sampled output words, typically, the probability that such suspect words might appear is almost double the norm. Removing both the long runs of ones and zeroes enhances the numerical balance of output ones and zeroes, as found in normal LFSR sequences where only the all zero sequence is removed.

XORing two strings, the first string being random or pseudorandom and the second string not being correlated to the first string, typically produces a string that has a similar degree of randomality. Similarly, XORing two strings, where both strings are random or pseudorandom, typically produces a string that has a similar randomality. In both cases, the output string is one of the statistically assumed equiprobable outputs of the system. In all cases, when the strings are sampled after random waits from one sampling to the next, it is typically intractably difficult for a hacker or adversary to estimate the inner state of such a generator, in order to estimate future or past output strings.

Methods are suggested for demonstrating the processing of two step initialization of the preferred embodiment of FIG. 10, wherein the second uncorrelated clock is enabled at most for a short initialization, interval, typically operative in wireless communication environments.

In the first step, a condition of unpredictability is achieved, either by single clock mode activation for a known random time interval, or in the dual clock mode for a typically shorter time interval.

The second non-deterministic pre-session test and initialization sequence is operative to ascertain that the least significant observable output bits of the 15 and 17 bit nLFSRs are toggled, thereby proving that the primary clock is operative. Assuming that the first step output is unpredictable, the second step test procedure maintains unpredictability and assures that the primary clock is functioning properly therefore operative to shift both nLFSRs at full clock frequency.

Session unpredictability is assured in devices with finger operated keypad switches, actuated for short random intervals. For such intervals the primary clock is enabled for the length of the keystroke, if at start of the interval the primary clock was not enabled, and conversely, for the interval of the keystroke is disabled, if before the key stroke, the primary clock was enabled, then for the interval of the keystroke, the primary clock is disabled.

There is thus provided, in accordance with a preferred embodiment of the present invention, microelectronic apparatus for generating random binary words including at least one clocked pseudorandom binary number sequence generator normally operative to generate a cyclic output sequence of binary numbers, each number including a string of binary symbols, the cyclic output sequence including a basic sequence which is generated repeatedly, at least one bit stream generator generating a clocked bit stream including a stream of binary symbols of a first type occasionally interrupted by a binary symbol of a second type, wherein a first varying time interval between the occasional interruptions is intractably correlated to the output sequence of the number sequence generator, wherein each occurrence of an interruption of the stream of binary symbols of the first type by a binary symbol of the second type causes a pseudorandom modification of the cyclic output sequence of the number sequence generator, and a sampling device operative to sample the cyclic output sequence of binary numbers thereby to generate a sampled output sequence including at least one sampled binary word.

Further in accordance with a preferred embodiment of the present invention, the sampling device is operative to sample responsive to receipt of CPU requests and wherein sampling responsive to at least one CPU request occurs a random waiting interval after the CPU request has been made.

Still further in accordance with a preferred embodiment of the present invention, the sampling device is operative to sample responsive to receipt of CPU requests and wherein sampling responsive to at least one CPU request occurs during the clock cycle immediately following the CPU request.

Additionally in accordance with a preferred embodiment of the present invention, the pseudorandom modification includes a pseudorandom displacement.

Further in accordance with a preferred embodiment of the present invention, the clocked pseudorandom binary number sequence generator includes a feedback shift register and wherein the pseudorandom displacement is caused by complementing the serial feedback bit in the feedback shift register using pulsed "1" bits which are externally generated at intractably difficult to estimate intervals of time.

Still further in accordance with a preferred embodiment of the present invention, the pseudorandom modification of the cyclic output sequence includes a pseudorandom cycle rearrangement.

Additionally in accordance with a preferred embodiment of the present invention, the pseudorandom cycle rearrangement is caused by a Random Swap of the set of feedback taps actuated by an externally generated pulsed "1" bit at an intractably difficult to estimate clock period.

Also provided, in accordance with another preferred embodiment of the present invention, is a sampling device including an interface for receiving a CPU request to sample an at least pseudorandom binary stream and a sampler operative to sample the binary stream, responsive to at least one CPU request received by the interface, after a random waiting interval has elapsed.

Further in accordance with a preferred embodiment of the present invention, the pseudorandom modification includes a random slip in which a portion of the cyclic output sequence is omitted.

Still further in accordance with a preferred embodiment of the present invention, the pseudorandom modification includes a random swap in which the basic sequence is modified.

Further in accordance with a preferred embodiment of the present invention, the random swap includes a permutation of the basic sequence.

Still further in accordance with a preferred embodiment of the present invention, the at least one bit stream generator includes at least two bit stream generators generating first and second streams, wherein each occurrence of an interruption of the first stream by a binary symbol of the second type causes a random slip in which a portion of the cyclic output sequence is omitted and each occurrence of an interruption of the second stream by a binary symbol of the second type causes a random swap in which the basic sequence is modified.

Also provided, in accordance with still another preferred embodiment of the present invention, is microelectronic apparatus for generating binary words including at least one clocked pseudorandom binary number sequence generator normally operative to generate a cyclic output sequence of binary numbers, each number including a string of binary symbols, the cycling output sequence including a basic sequence which is generated repeatedly, at least one bit stream generator generating a clocked bit stream including a stream of binary symbols of a first type occasionally interrupted by a binary symbol of a second type, wherein each occurrence of an interruption of the stream of binary symbols of the first type by a binary symbol of the second type causes a pseudorandom modification of the cyclic output sequence of the number sequence generator, and wherein the pseudorandom modification includes a random slip in which a portion of the cyclic output sequence is omitted.

Further provided, in accordance with yet another preferred embodiment of the present invention, is microelectronic apparatus for generating binary words including at least one clocked pseudorandom binary number sequence generator normally operative to generate a cyclic output sequence of binary numbers, each number including a string of binary symbols, the cycling output sequence including a basic sequence which is generated repeatedly, at least one bit stream generator generating a clocked bit stream including a stream of binary symbols of a first type occasionally interrupted by a binary symbol of a second type, wherein each occurrence of an interruption of the stream of binary symbols of the first type by a binary symbol of the second type causes a pseudorandom modification of the cyclic output sequence of the number sequence generator, and wherein the pseudorandom modification includes a random swap in which the basic sequence is modified.

Further in accordance with a preferred embodiment of the present invention, the pseudorandom modification also includes a random slip in which a portion of the cyclic output sequence is omitted.

Also provided, in accordance with another preferred embodiment of the present invention, is a method for operating a confidential process symbiotically with a random number generation process, the method including operating a confidential process radiating an indicative signal in parallel with a random number generator radiating a random signal and a pseudo-random number generator radiating a pseudo-random signal, including using an output of the random number generator as a seed for the pseudo-random number generator, wherein the confidential process, the random number generator and the pseudo-random number generator have an overlapping detection range in which the random signal, the pseudo-random signal and the indicative signal are all detectable, thereby to enhance unpredictability of the confidential process by superimposing the random and pseudo-random signals onto the indicative signal.

Also provided, in accordance with another preferred embodiment of the present invention, is apparatus for enhancing the randomness of an output binary stream, the apparatus including at least one random binary stream generator, and apparatus for generating an output binary stream by combining a plurality of n-bit samplings of the at least one random binary stream generated by the at least one random binary stream generator.

Further in accordance with a preferred embodiment of the present invention, the apparatus for generating includes XOR apparatus for XORING the plurality of n-bit samplings.

Also provided, in accordance with a preferred embodiment of the present invention, is a method for generating a sequence of random numbers including using an nLFSR to generate an nLFSR generated string, operating a random slip actuating triggering process which randomly and without correlation to the LSFR generates at least one slip actuating triggers respectively triggering at least one slip generating process, thereby to define a modified string including the nLFSR generated string to which the at least one slip generating processes have been applied, wherein each slip generating process, responsive to occurrence of a slip actuating trigger, reverses the most significant bit of a current number in the nLFSR generated string, and operating a random sampling triggering process which, randomly and without correlation to the nLSFR and without correlation to the random slip actuating triggering process, triggers a sampling of the modified string, thereby to generate a subsequence of the modified string which includes an output string of random numbers.

Also provided, in accordance with another preferred embodiment of the present invention, is a random number generator operative in conjunction with a keypad having at least one key-switches, the random number generator including random number generating apparatus which is reinitializable to enhance its unpredictability, and iterative reinitialization apparatus for iteratively reinitializing the random number generating apparatus, including performing a plurality of reinitializing iterations, wherein the number of reinitializing iterations performed by the iterative reinitialization apparatus is determined by at least one attribute of the user's manipulation of at least one key-switches.

Further in accordance with a preferred embodiment of the present invention, the reinitializing iterations are performed by the iterative reinitialization apparatus only while a particular set of at least one key-switches is depressed.

Still further in accordance with a preferred embodiment of the present invention, the reinitializing iterations are performed by the iterative reinitialization apparatus only while a particular set of at least one key-switches is elevated.

Additionally provided, in accordance with another preferred embodiment of the present invention, is a method for generating an output random number sequence, the method including using an nLFSR to generate a plurality of interim random number sequences, generating a pseudorandom sequence, uncorrelated to the nLFSR, of nLFSR sequence-alternating triggers, and generating an output random number sequence including setting values of the output random number sequence equal to corresponding values being generated for an individual one of the interim random number sequences until a sequence-alternating trigger occurs, and, following occurrence of each sequence-alternating trigger, setting values of the output random number sequence equal to corresponding values being generated for another one of the interim random number sequences, until a further sequence-alternating trigger occurs.

Further provided, in accordance with another preferred embodiment of the present invention, is a random number generating method including providing a monolithic single-chip integrated circuit including a random number generator performing a random number generating process and an intermediate latch, using the intermediate latch to mask internal variables of the random number generating process by wordwise XOR.

Further in accordance with a preferred embodiment of the present invention, at least one wordwise XOR function is employed to mask the internal state of variables generated by at least one source of randomality internal to the random number generator.

Still further in accordance with a preferred embodiment of the present invention, the at least one internal source of randomality includes at least one nLFSR and the step of using includes performing at least one nLFSR masking wordwise XOR operation.

Further in accordance with a preferred embodiment of the present invention, the at least one internal source of randomality includes at least one oscillator and the step of using includes performing at least one oscillator masking wordwise XOR operation.

Still further in accordance with a preferred embodiment of the present invention, the at least one internal source of randomality includes at least one chaos generator and the step of using includes performing at least one chaos generator masking wordwise XOR operation.

Further in accordance with a preferred embodiment of the present invention, each wordwise XOR function is typically applied to at least one pair of random samples generated by at least one internal sources of randomality in the random number generator.

Also provided, in accordance with another preferred embodiment of the present invention, is a monolithic single chip integrated circuit including a random number generator performing a random number generating process having a plurality of internal variables, the process producing a random output, an internal XOR masking intermediate latch operative to receive the random output and at least a portion of the plurality of internal variables from the random number generator and to mask at least one of the plurality of internal variables of the random number generating process by wordwise XOR, thereby to generate an internal XOR masked output, and an output port for receiving the internal XOR masked output.

Further in accordance with a preferred embodiment of the present invention, the random output generated by the random number generator is a function of at least a portion of the plurality of internal variables.

BRIEF DESCRIPTION OF THE DRAWINGS

The present invention will be understood and appreciated from the following detailed description, taken in conjunction with the drawings in which:

FIG. 4A is a simplified pictorial illustration of a basic sequence of 8 binary words which repeats cyclically in a pseudorandom sequence from which random numbers are to be generated;

FIG. 4B is a simplified pictorial illustration of a random slip stream and of a random sequence which is preferably derived by randomly modifying a pseudo random sequence formed from the basic sequence of FIG. 4A, each time a random slip occurs in the random slip stream, and of a preferred sampling process sampling the pseudorandom sequence;

FIG. 22A is a prior art table showing various acceptable ranges, according to the FIPS-140-2 standard of May 2001;

FIG. 22B is a table derived from the table of FIG. 22A showing various parameters which may characterize the runs present in a 10K binary string composing sequential samples from a random number generator;

DETAILED DESCRIPTION OF A PREFERRED EMBODIMENT

Figures 1A, 1B:
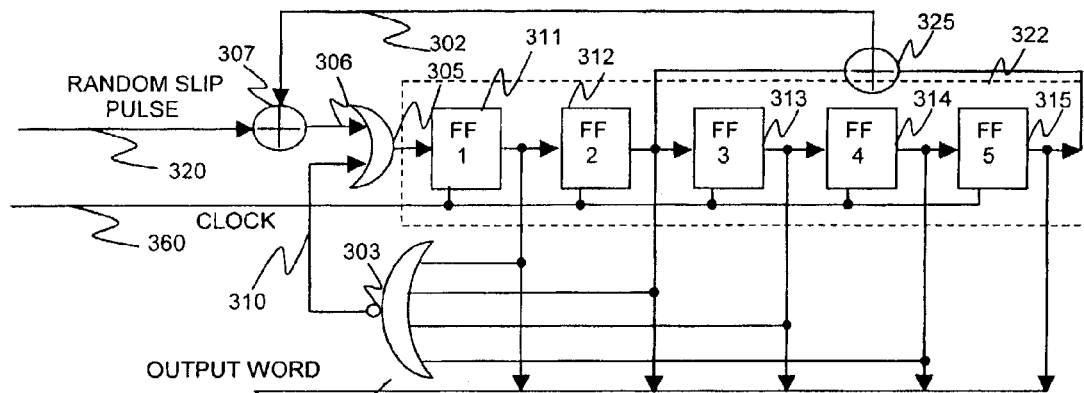
FIG. 1A is a simplified functional block diagram of microelectronic apparatus for generating binary words preferably comprising at least one clocked pseudorandom binary number sequence generator normally operative to generate a cyclic output sequence of binary numbers, wherein random slips occasionally occur thereby altering the output sequence with an output table containing the entire unaltered sequence and the random jumps typically activated by inputs of random slip pulses.
FIG. 1B is a table of a preferred sequence of pseudo-random words generated by the apparatus of FIG. 1A and of the absolute cyclic distance resulting from slip displacements, and a graphic display of displacements which may be caused by slip pulses in FIG. 1A.

The following terms are used in the specification and drawings:

0, Zero: The smaller digit in the binary set. In digital electronics, generally defined as the voltage less than an intermediate threshold voltage.

1, One: The larger digit in the binary set. In digital electronics, generally defined as the voltage more than an intermediate threshold voltage.

AND logic gate: An electronic logic gate that outputs a one, only when all inputs are equal to one; else outputs a zero. An AND gate is depicted in 470, FIG. 2. The function name of logic gate AND may also be used as a transitive verbal participle, e.g., ANDing a one and a zero to output logic zero.

Audit: The function of the 8 Bit Status Monitor in the second preferred embodiment, which records warning signal data from the last six samplings of the random number generator.

Autocorrelation: In the binary sense, a measure of entropy or mutual relationships between two binary strings wherein a binary n bit "base" string is replicated typically to double length and the "base" string is "compared" to the longer replicated string, (XORed to the string as it is offset bit-digit by bit-digit), and the number of like (hits) and number of unlike (misses) comparisons is counted as each comparison is recorded). In a perfect pseudo-random sequence, the number of hits and misses is balanced for all comparisons, except for the single comparison (zero offset) when the string is compared to "itself", when there might be n hits.

Balance: In a perfect pseudo-random sequence of binary digits, the number of ones and zeroes is equal. In a long random uncolored binary sequence, the balance of ones and zeroes is "almost" equal. In the FIPS 140-2 specification, the deviation from equality is defined. In the second preferred embodiment, the warning signals point to suspect 12 bit strings as being all ones or all zeroes. A better balance can be attained for very long sequences, if such strings are alternately not used.

Binary: A system in which there are only two possibilities. In binary arithmetic, this is defined as arithmetic radix of two, in electronic logic this is defined as either binary symbol, 0 or 1.

Binary Stream: A bit stream of typically undefined ones and zeroes.

Binary Symbol or Character: Either a "1" or a "0".

Bit: The abbreviation of binary digit, a single one or zero.

Bus: A plurality of conductors or lines.

Byte: The binary symbol string, operated on as a unit, typically comprising 8 bits, and typically shorter than a binary word.

Chaos: Chaotic methods and devices in microelectronic devices are typically time dependent computational procedures or electronic devices that typically criss cross the boundary between meta-stability and stability. Hence, typically they may alternately show signs of utter confusion, and predictable recognizable patterns.

Clock: The device, typically an electronic oscillator that generates periodic signals for synchronization of processes. In both preferred embodiments, randomness is typically initiated by simultaneously activating a primary clock, also termed herein a "system clock", and a second uncorrelated clock, such that randomizing events occur at intractably difficult to estimate intervals. A typical clock cycle occupies a time interval, called a period. Typically, during the majority of the first half of the period the clock cycle signal is stable at a binary one voltage, and during the majority of the second half of the clock period, the voltage is stable at a binary zero level.

Figure 10:
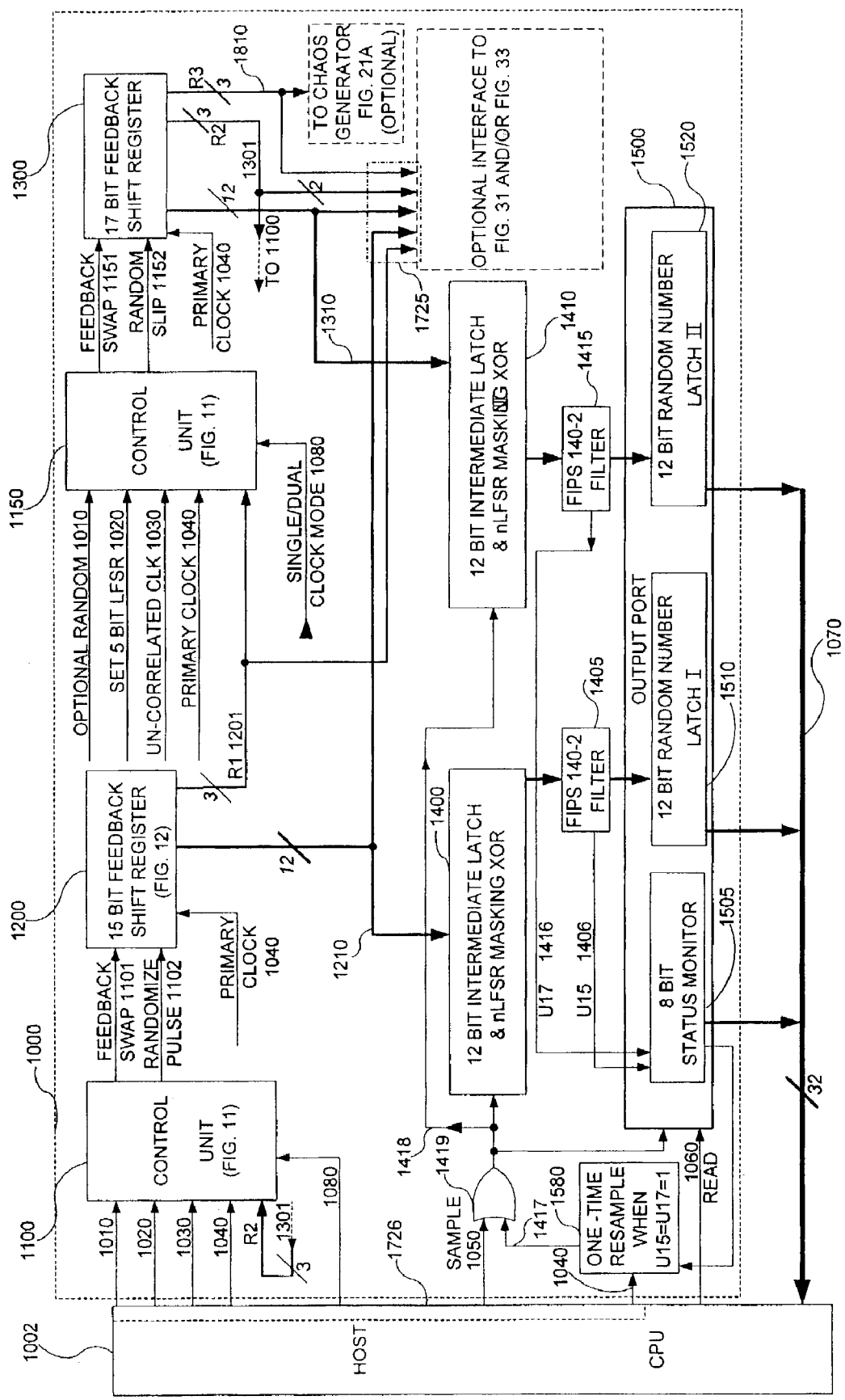
FIG. 10 is a simplified functional block diagram of a random number generator preferably comprising with an optional balance, status, and resample actuator, operative upon request to generate a sample word, derived from a plurality of previously generated sample words and a monitor recording status conditions of the outputs of six previous sampled 24 bit words.

Clock Modes: Two clock modes are described: Single clock mode and dual clock mode. In single clock mode, only a primary clock, e.g. primary clock 1040 in FIG. 10, is operative. Primary clock 1040, when operative, typically activates all nLFSRs in the random number generator. In dual clock mode, both a primary clock and an additional, slower, uncorrelated clock, derived from an oscillator typically uncorrelated to the primary clock, are operative. Clock 1030 in FIG. 10 is an example of a slow or uncorrelated clock. Clock 1030, when operative, typically forces all nLFSRs in the random number generator into an unpredictable condition.

Figure 6:
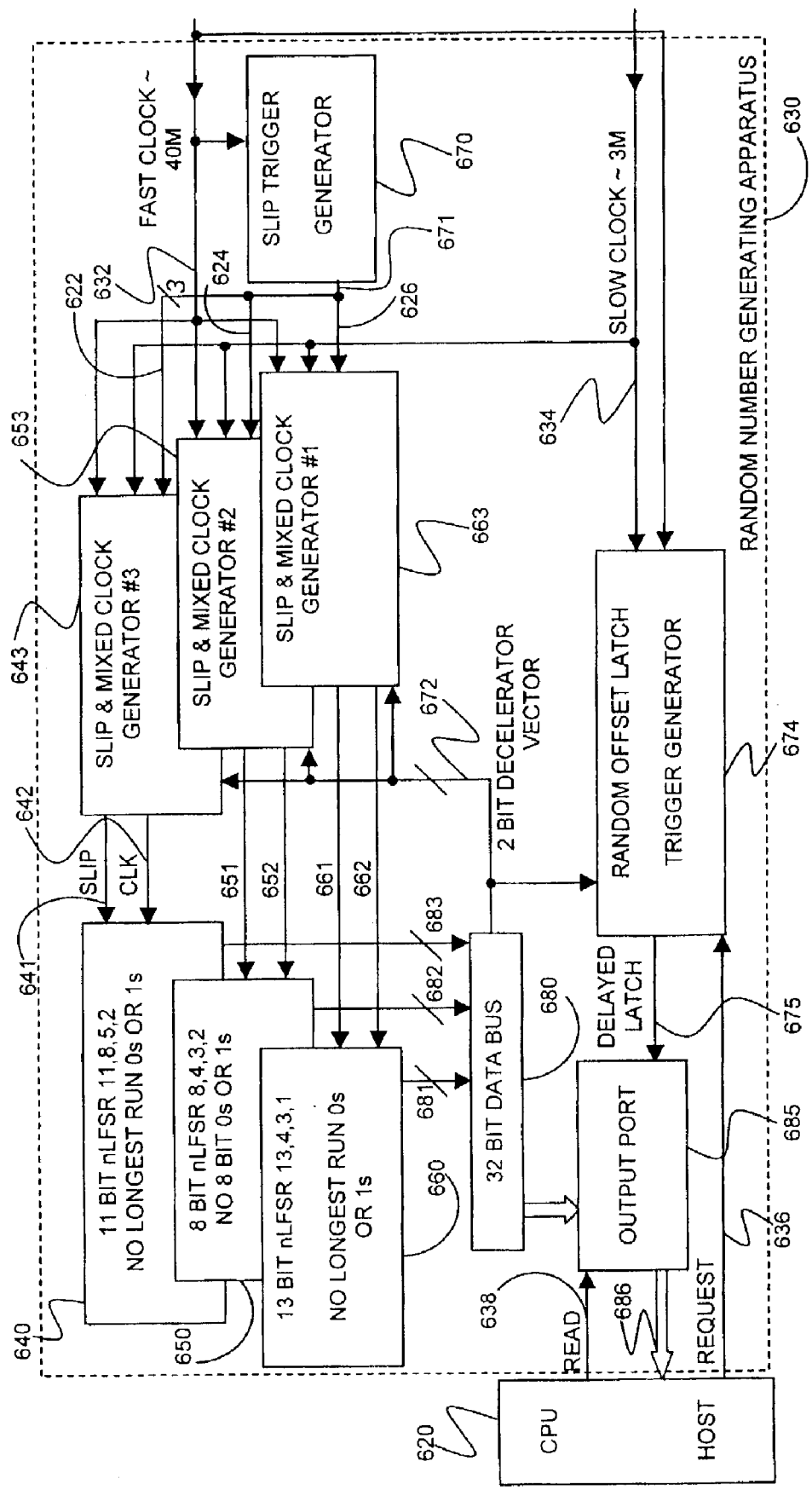
FIG. 6 is a simplified block diagram of a preferred embodiment of a FIPS 140-2 compatible device which includes three non-linear feedback shift registers operative as a random number generator and actuated by at least two uncorrelated oscillating devices.

Either of these clock modes may be operative in each of the random number generators shown and described herein such as the random number generators of FIGS. 6 and 10. In the illustrated embodiments, the dual clock mode is employed in the random number generator of FIG. 6 and both modes are employed in the random number generator of FIG. 10. Typically, a primary clock is enabled for all operations between autonomous devices. This prevents glitches and metastable oscillations between devices within the random number generator and between the random number generator and the host device. In the random number generator of FIG. 6, delays and decelerated operation of the device utilize the Slow Clock 1030.

Figure 11:
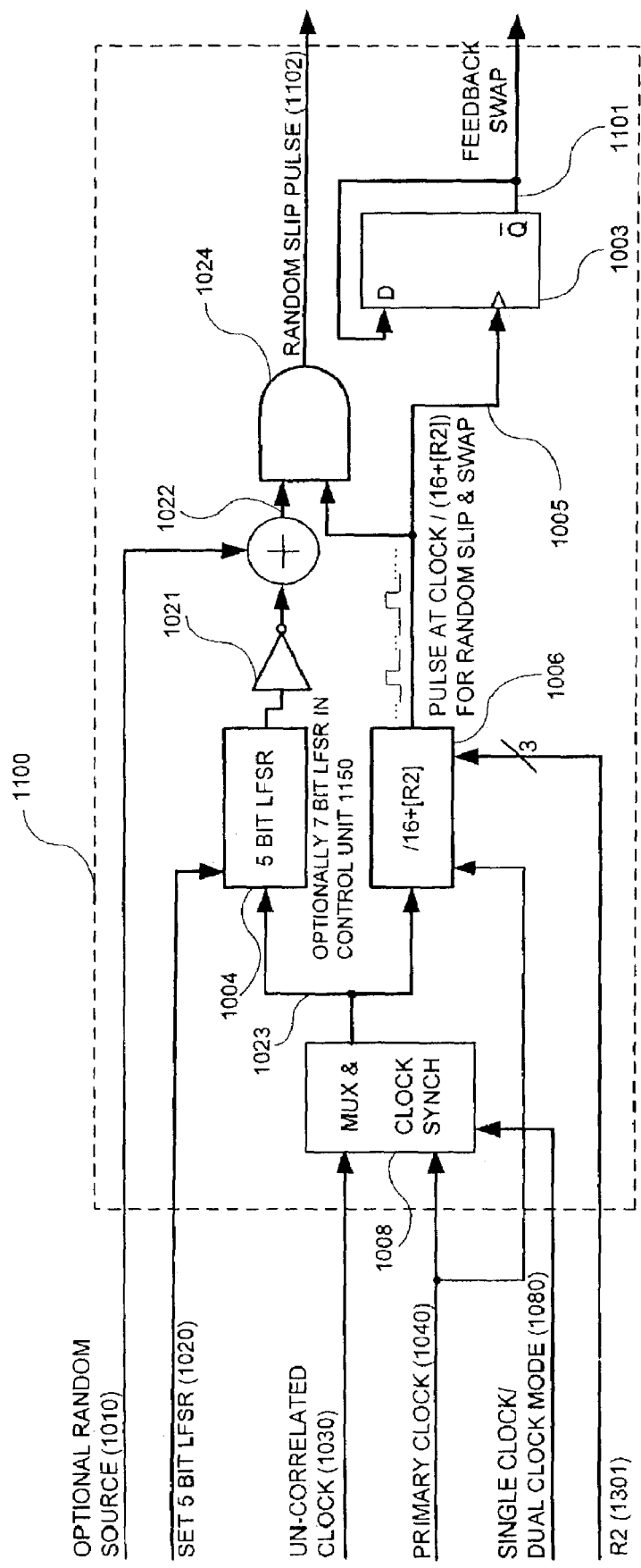
FIG. 11 is a simplified electronic block diagram of control unit 1100 of FIG. 10, constructed and operative in accordance with a preferred embodiment of the present invention and preferably operative similarly to unit 1150 of FIG. 10.

In the second preferred embodiment of FIGS. 10–20, both clocking modes are implemented. The dual clock mode utilizes both the primary clock, and the uncorrelated, typically lower frequency, clock. Typically, the dual clock configuration is enabled during power up of the device, to establish a random initial conditioning of the number generator. Typically, in those applications wherein an uncorrelated clock interferes with the operation of a device, e.g., introduces noise into a radio frequency communication after initialization a single clock, typically the primary clock is enabled. In such instances, other options for enabling temporal randomness are enabled. Typically, an external chaos device, see FIG. 21A, or random commands from the host to reset the 5 bit LFSR in the control unit of FIG. 11 are implemented. Typically, ring oscillators are used as sources for the uncorrelated clocks. A ring oscillator is typically implemented by a string of an odd number of inverters, typically NOT logic gates. The period of the oscillation is a function of the propagation delay of each of the inverters. The propagation delay is typically a function of the slightest varying aberrations of the voltage or the internal temperature of the microelectronic device.

CMOS: Complimentary Metal Oxide Semiconductor. Presently, the most popular technology integrated circuit semiconductor technology, used in most commercial, military and consumer products.

Colored Random: An analogy from optics, where the recurrence of patterns or characteristics, typically from a physical random generator, is detectable, e.g., a pattern . . . 0011100111 . . . , may reappear with distinguishable frequency.

Comparator (Analog): A microelectronic device with a voltage input, that determines a binary output, e.g., typically, if the input is larger than a threshold value of 0.8 volts, the output is a one; else, the output is a zero.

Complement: In the binary sense, one complements zero, and zero complements one.

Coprocessor: In the parallel application of formally hashing the output of a random string, the electronic device that performs the second randomizing process, e.g., a NIST Secured Hash Algorithm—SHA-1 processor.

Correlation: A measure of mutual relationship between two signals, e.g., when one clock is a derivative (e.g., divided by 4) of a second clock, the correlation of one clock to the other is the ratio of the frequencies, 4 to 1.

CPU, Central Processing Unit: A host device, which typically controls the random generating device of preferred embodiments, i.e., defines clock modes, activates generator clocks, commands, balances, and concatenates samplings of the random number generating device into a larger random output string.

Cycle, Cyclic: Recurrences of same patterns. A clock cycle is typically and interval characterized during the first half of the interval by a one, and during the second half of the interval by a zero. LFSRs of length n, when activated for x (2^n) clock cycles, outputs a string of at least x same binary sequences repeatedly, each of which is (2^n−1) binary bits long.

Figure 16:
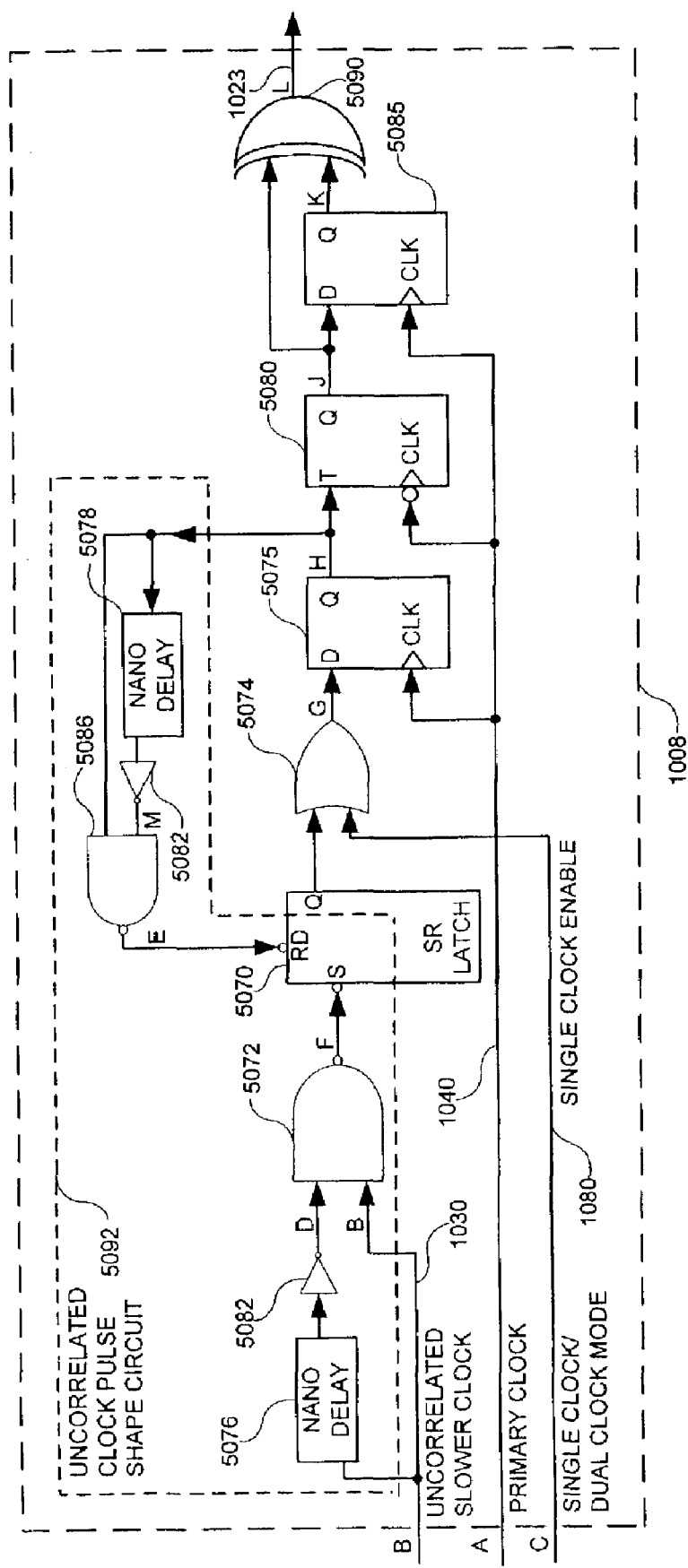
FIG. 16 is a simplified electronic block diagram of a preferred embodiment of the multiplexer and clock synchronizer 1008 of FIG. 11 operative in a dual clock mode to accept random pulses at a frequency typically lower than the frequency of the primary clock and to output signals synchronized to the primary clock signals, to appear in the following inversed primary clock second half of the primary clock period, and when in single mode to output the inversed primary clock.
Figure 17:
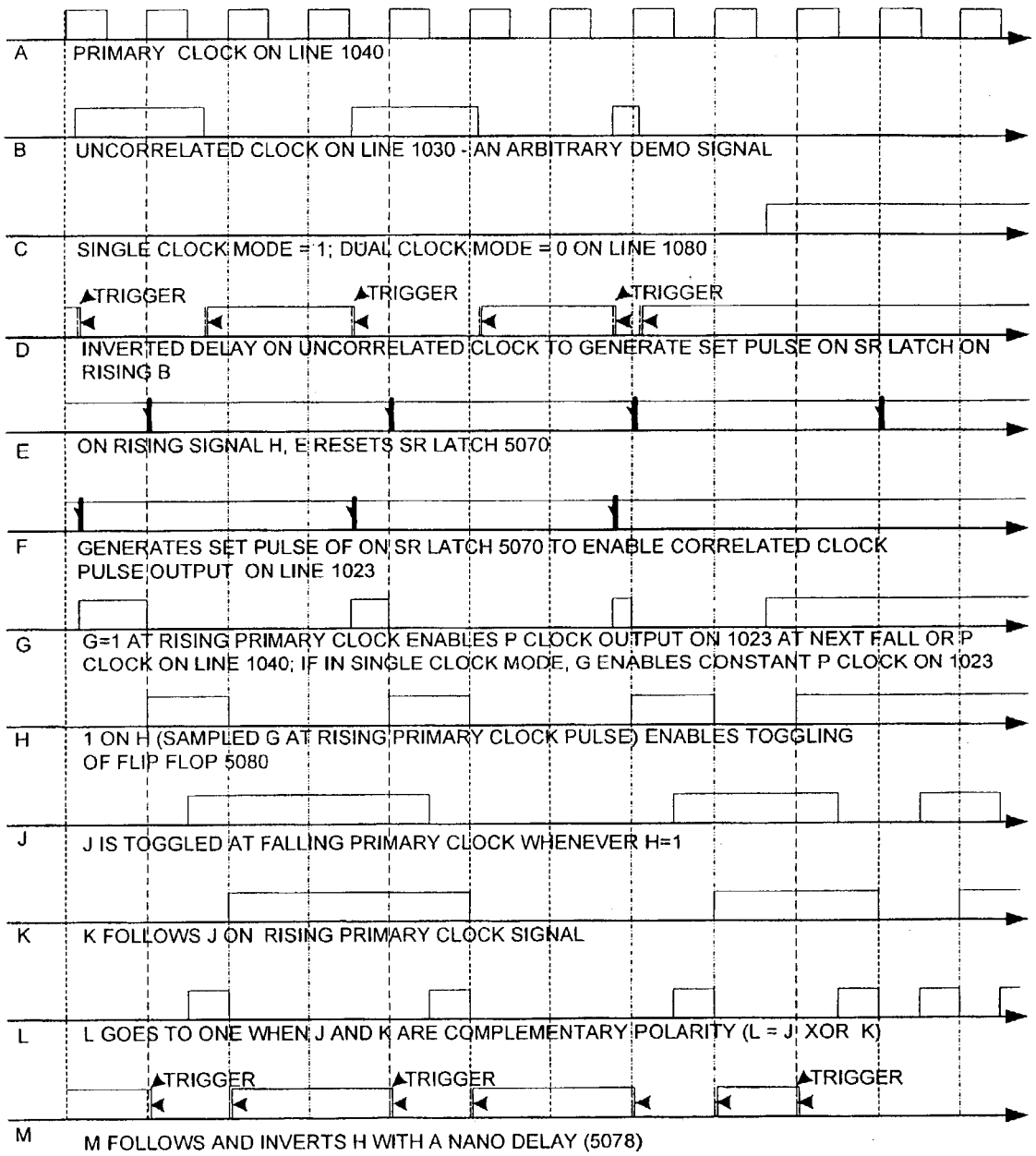
FIG. 17 is a preferred timing diagram of the device of FIG. 16 operative to synchronize outputs of random signals with the inversed primary clock pulses.

Delay element: Delay elements in electronic circuits are passive microelectronic devices operative to cause a short interval delay between the input and the output of the element. Propagation delays in microelectronic gates in submicron devices are typically 0.2 nano-seconds. In FIGS. 16 and 17, delay devices are used to generate short pulse triggers, operative to set and reset SR flip-flop latches. A simple logic delay signal can be implemented by concatenating an even number of inverting logic gates.

Displacement: In the context of "slips" in an LFSR sequence of words, the jump of the normal place in the word sequence caused by the complementing of the least significant (LS) bit of the next word to appear in the sequence. For example, in the sequence 304 of FIGS. 1A–1B, changing the LS bit 1 in index 10 word, 11011, to zero, causes a displacement to index 25 word, 01011.

Entropy: In the random binary string context, a comparative measure of confusion or divergence typically from a predictable sequence, or a part thereof.

ETSI CLK: A wireless communication specification, TS 102 221 V3.0.0F-06921, issued by the European Telecommunications Standards Institute 2000, Sophia Antipolis, France for Universal Integrated Circuit Card (UICC) interface. In relevant part (sections 5.1.4, 5.2.3 and 5.3.3, subsections relating to Clock CLK (contact C3)), this specification stipulates that no autonomous oscillating device be operative on a communicating RF wireless communication device.

Exclusive OR, XOR Function: The function symbolized either by an encircled cross, e.g. XOR 307 of FIGS. 1A–1B, or as a logic gate, 4030, as in FIG. 26. Typically, there are two binary inputs to an XOR function. If both inputs are alike, e.g. both are either ones or both are zeroes, a condition defined as a hit, the output is a zero. If both inputs are unalike, e.g. either one and zero, or zero and one, the output is a one, often defined as a miss.

The abbreviated name XOR and the accepted fullname of the XOR logic gate, may be used as transitive verbal participles e.g., exclusive ORing or XORing a one and a zero to output logic one.

FIPS 140-2 filter: The name given to the device of a preferred embodiment, which typically gives assurance that, the random number generator complies with the sections of the May 2001 FIPS 140-2 specification pertaining to random number generation. The filter prevents long runs, and generates a warning syndrome to the host, of the occurrence of same two consecutive identical 12 bit or 24 bit samplings.

Flip-Flop (FF)—Types D, T & SR: An electronic device, capable of maintaining two stable output states, one or zero on outputs Q and Q NOT. Synchronous (clock activated) flip-flops used in the preferred embodiments, are Data (D type) and Toggle (T type). In the D flip-flop, the input at the D connection appearing immediately before an activating clock cycle is sampled and transferred to the output, Q. In the T type flip-flop, the output is a polarity change from the previous output. When the T input is a one, and a clock signal activates the flip-flop, the previous polarities of Q and Q NOT are reversed.

Clock activation is typically activated by a rise in the voltage of the clock signal, denoted in FIGS. 1–34 by a direct connection of the input to the clock connection; or by the fall in voltage of the input clock signal, typically denoted by a small circle adjacent the connection of the flip flop, e.g. flip flop 5075 in FIG. 17. SR flip-flops are asynchronous devices, as they, typically, can be activated at random instants, unsynchronized to a system primary clocking device. An activation voltage on the S input causes a stable one (a set) on the output, Q. Activation of the R input (often marked CLR or Clear), causes a stable zero (a reset) on the output, Q. Flip-flops have an optional second output Q Not, symbolized by a Q under a horizontal dash. A D type flip-flop, with the inverted Q NOT output connected to its D input, will toggle, the output, at each activating clock signal. D, T and SR flip-flops are used in FIG. 15.

Glitch: A metastable, unpredictable temporary malfunction typically caused by poorly synchronized logic signals.

Hash: A process of converting a larger binary string, typically 10K bits long, divided into blocks 512 or 1024 bits long, processing the result into a much shorter string, typically 128 or 160 bits long. A hash process is typically programmed such that adversaries are unable to replace a valid hashed message with a fraudulent message such that the hashed result might be identical to the valid result. Examples of hash functions are $H=B^2 \bmod N$, wherein B is the input, N is a prime number and the hashed result is H. A state of the art secured hash standard is SHA-1.

Host: The device that controls, samples, and monitors the output of the random number generator. The host typically comprises a secured CPU, with secured a program for sampling the random number generating device, one system (primary) clock, one uncorrelated clock, operative to assure that the concatenated output of random words, complies with FIPS 140-2, May 2001 specifications.

Intractable: In the context of the two preferred embodiments, the assumption that accurate estimation or prediction is typically unfeasible using known methods.

Internal XOR masking: Masking of internal variables of a random number generating process by word-wise XOR, as shown generally in FIGS. 36A–36B. For example, use of at least one word-wise XOR function, e.g. as in FIG. 14, to mask the internal state of nLFSR variables in a random number generator. At least one word-wise XOR function and typically many, may be employed, e.g. if the random number generator includes more than one internal source of randomality or pseudorandomality (such as one or more nLFSRs and/or one or more oscillators and/or one or more chaos generators). Each word-wise XOR function is typically applied to at least one pair of random samples generated by at least one of internal sources of randomality or pseudorandomality in the random number generator. Internal XOR masking may comprise use of nLFSR masking XOR, use of oscillator masking XOR use of chaos generator masking XOR, or any combination thereof.

Inverter logic gate: A logic gate that outputs a signal that is complementary to the input symbol, e.g., a logic one is changed to a zero, and a logic zero is changed to a one. An inverter gate is symbolized by a triangle with the inputs on its base, and a circle on the apex, which denotes the output, e.g., gate 1021 in FIG. 11.

Keypad Switches: The plurality of manually activated switches operative to enter commands and data into computerized devices. A keystroke interval is the amount of time that the key switch is activated. Both the intervals that such switches are manually activated and the exact time that such keys are manually activated can be assumed to be uncorrelated to the temporal state of a typically operated random number generator. Activation, or deactivation of the primary clock of a Single Clock Mode RNG by the normal device operation can typically cause the RNG to map into an unpredictable random condition.

Latch: Typically, a word length string of parallel D type flip-flops, operative to snare and store binary data from a data bus when activated by a signal on the flop-flops' latch-in gates. Latches are implemented in the output port, 685, of FIG. 6, and in the latches of FIG. 10.

LFSR: See also Linear Feedback Shift Register and Maximum Length Linear Feedback Shift Register. The LFSR configurations in the two preferred embodiments are maximum length configurations. An LFSR is an autonomous logic device, typically having only one binary input, i.e. the clock. In the configuration of FIGS. 1A–1B, the nLFSR can be reconfigured as an LFSR by connecting feedback 302 directly to the input of flip-flop 311 (thereby disabling non-linear modifications.)

Line: A connotation for a single conductor, e.g., operative to output the warning signal, U17, online 1416 (FIG. 10).

Linear Feedback Shift Register—LFSR: A clocked shift register device typically assembled from D type flip-flops with feedbacks taps drawn from defined pairs of flip-flops in the register. Pairs of taps are XORed together, and the pairs, if there is more than one, are again paired, until a single serial feedback signal is input to the "left hand" or "most significant" D-Flip Flop of the right shift register.

The LFSR is classed as a linear device, as for each configuration of the LFSR, a given word on the outputs of each of the registers, leads to another defined output of the register, such that the n bit word sequences are cyclically repeated, when the clock is continuously clocked. An all zero word is typically an unacceptable sequence in an LFSR configuration, as 0 XOR 0 is equal to zero, and the LFSR will be mapped into a sequence of zero in and zero out. The only input to an LFSR is the clock.

Knowledge of the fixed configuration of an n bit LFSR, and a one n bit word, typically is sufficient to know another n bit word. Knowledge of a sequence of two consecutive n bit words enables an observer to know both the configuration and the index number of the sampled words. Different feedback configurations from same length maximum length registers produce all of the same elements of the sequence, but in a different sequential order.

Long Run: See Runs, Long runs

Maximum Length Linear Feedback Shift Register: "Maximum length LFSRs" denotes the class of feedback configurations, where all possible output words, with the exception of the all zero word, are elements of the word sequence of the LFSR. Such LFSRs have desired qualities of randomness, to the observer who has no knowledge of the LFSR logic configuration; hence they are also referred to as pseudo-random number generators.

MHz: Mega Hertz, a million Hertz; 1 Hertz is equal to one cycle per second.

Metastable: A condition marked by only a small degree of stability.

Monitor: The Status Monitor of the preferred embodiment of FIG. 10, alone or together with the sampling and analyzing procedures in the host, serve as monitors to maintain FIPS 140-2 compatibility.

Multiplexer: An electronic device with a plurality of binary inputs, each with a defined "address" and a binary "address" input. An addressed binary input is switched to the multiplexed output.

NAND logic gate: An abbreviation for NOT AND. A NAND gate has a plurality of binary inputs, and a single output. The NAND gate outputs a zero, if and only if, all inputs are one, else the NAND gate outputs a one. A NAND gate is depicted in 470 (FIG. 2) to avert "Long Runs of Ones". The abbreviated name for the function of the NAND gate may also be used as a transitive verbal participle to describe the logic function, e.g., 15 inputs of all ones NANDed to output zero, etc.

Nibble: Typically, a four bit binary string.

Nonlinear Feedback Shift Register (nLFSR): Classes of electronic devices wherein the XORed feedbacks from the shift register do not completely determine the sequence of output words. The non-linear methods used in the preferred embodiments, include; a NAND gate to insert a zero into an output sequence when all sensed inputs are one; a NOR gate to insert a one into the next output word, when all sensed inputs are zero; a "slip" pulse which occasionally complements a feedback binary symbol; a control "swap" which alternates the feedback structure thus changing a bit word output sequence.

NOR logic gate: A mnemonic for NOT OR. NOR gates have a plurality of inputs, such that an output of one can only occur if all outputs are at zero. For all other combinations, the output of a NOR gate is zero. A NOR gate is depicted in FIGS. 1A–1B operative to avert the "Stuck on Zero" syndrome. The mnemonic NOR may be used as a verbal participle, e.g., NORing inputs A and B to output a one.

NOT logic gate: See inverter.

Number, Binary: Any n bit string of binary bits may represent a binary number from zero to $(2^n+1)$.

One: See "1".

Operational Analog Amplifier: Electronic analog device typically configured to approximate linear voltage amplification in a predefined voltage input and voltage output range.

OR logic gate: A logic gate operative to output a one if any of the plurality of inputs thereto is a one. An OR gate 1419 is depicted in FIG. 10. The function name of logic gate OR may be used as a transitive verbal participle, e.g., ORing a one and a zero to output logic one.

Oscillation: In the binary context, the variation between one and zero with respect to time, typically with a quasi-stationary period between changes of polarity. The sources of oscillations to the Random Number Generator, the clocks, are typically transmitted through the host interface. Typically the primary clock is a system clock used by the CPU. Typically, the uncorrelated clock is generated by an odd number ring of inverters, defined as a ring oscillator, operative to oscillate at a slowly varying frequency, uncorrelated to the primary clock frequency. The period of a ring oscillator clock cycle is a function of the propagation delays of the inverters. The propagation delays are functions of device temperature and supply voltage.

Polarity: In a binary device, two poles are valid, zero and one. Changing polarity, means changing a one to zero or a zero to one. Changing polarity of a device is tantamount to toggling a device.

Power on Reset; POR: The typically undefined logic condition during an interval when a device is being initially energized, and the input voltage, typically defined as VDD has not risen to full value. If this interval is relatively long and known to be random, a device in Single Clock Mode may be initialized during this period. If the POR interval is deterministic and relatively long, initialization may be enacted in Dual Clock Mode.

Pseudo-Random: A condition of a binary string resembling randomness to an observer unacquainted with the temporal condition of the generating device, but predictable to an observer who is acquainted with the device, and knows the temporal input and temporal condition of the device. Typically, a sequence of values produced by an nLFSR, or any other completely deterministic computational mechanism or finite state machine produce a pseudorandom sequence, if the initial condition and number of steps is known to an observer is known.

Pulse: A short aberration of a quasi-stationary signal, hence, typically, a short interval of one, on a signal that is typically zero. Typically, in these devices, pulses used for activation are synchronized to the primary (system) clock.

Random: Typically, a varying state of high entropy and/or a state of difficult to anticipate or predict output values. In practice, a pseudo-random generating device is herein considered a random generating device if the logic values on the plurality of inputs to the device are intractably difficult to predict.

Read Command: A Read command from a Host which typically enables a previously stored, generated sampling from a generator to be output onto the Host data bus.

Resample: A function of the 8 bit Status Monitor of FIG. 10 is to activate a delayed resample command activated by warning signals received simultaneously from both nLFSRs of FIG. 10. The estimated occurrence of both warning signals being ones, at a random sampling, of the 24 bit word is about once in $4/(2^{22})$ samplings, which is approximately once in one million samplings, wherein typically, only one in sixteen warnings may indicate a repeated same sample.

Runs, Long Runs: The FIPS 140-2 specification of May 2001 defines a run of length x binary symbols as the occurrence of x consecutive same symbols in a binary string. The specification defines a statistically acceptable range of occurrences of runs of length one to six in a 20,000 sample stream. The same document also defines a long run to be a run of length 26 or more (either zeroes or ones). In a trial sample of 20,000 bits, the test is passed if there are no long runs. The configuration of the preferred embodiments prevents occurrences of long runs.

Sample: A Sample command from a Host activates an instantaneous or a random delayed transfer and processing of the binary contents of the plurality of nLFSRs. In the preferred embodiment of FIG. 10, the sampling reads only a part of the binary content of the flip-flops in the nLFSRs. A sampling procedure occurring at a random instant, uncorrelated to the temporary condition of a pseudorandom device is a random sample.

Sample & Hold, S&H: Analog microelectronic circuits that typically sample voltage values at a given time, and maintain the sampled value on the circuit output until receiving a command after a time interval to sample a next value.

Sequence: The relational following of one element after another. LFSR sequences typically comprise a fixed sequence wherein one unique word is always followed by another unique element of the same sequence. Each element is an n bit word to which an index number from 1 to n−1 may be affixed Typically the first word is a one followed by a string of n−1 zeroes. Each element is the previous element, shifted on cell to the right, wherein the "new" left hand bit is the feedback bit. In the preferred embodiments, these sequences are occasionally aberrated by slips, swaps and an XORing of a present sampling to a previous sampling.

Shift Register: Typically, a number of concatenated D type flip-flops, such that at each activating clock cycle, the binary symbol in one flip-flop is transferred to the adjacent flip-flop, typically situated on its right. The two inputs to such a register are the serial input into the left hand, most significant flip-flop and the activating clock. The output may be read as a word, or as a serial output, typically from the right hand flip-flop.

SHS, SHA-1, NIST's Secured Hash Standard: The ubiquitous standard established by the U.S. National Institute for Standard Technology for hashing. The SHA-1 function parses a very long string into blocks of 512 bits, followed by a plurality of non-linear transformations, reducing the long string to a 160-bit result. The SHS methods are a mode of pseudo-randomization.

Slip: Reversing the most significant bit of a number from 0 to 1 or from 1 to 0. In the present specification and claims, the terms "changing polarity" and "toggling" may be used to refer to reversing a number's most significant bit from 0 to 1 or from 1 to 0. The effect of this reversal is a random repositioning within a cyclic process composed of predefined transitions between a predefined set of states each identified with a binary number.

Slip Sequence Function: A function used in both preferred embodiments that causes a pseudo-random jump displacement in a conventional LFSR. The slip is from one the conventional LFSR sequence to another word in the conventional LFSR sequence. XORing a feedback signal with a random pulse of polarity one implements the process. A slip process preferably is enacted at random intervals occurring a plurality of primary clock cycles more than double the length of the generating nLFSR, to typically avert shortened cyclical sequences.

Spectrum: A term adopted from optics, where a color in the binary spectrum may typically be a small pattern that is either overly repeated in a long sequence, or inordinately omitted from said sequence.

Stream: See binary stream

String, Binary and Random: A varied length concatenation of ones and zero bits. A string can typically be a single binary word or a concatenation of a plurality of lengths of binary words. In the context of this invention, a string is random, when an observer has intractable difficulty predicting the next bit or word, when a previous plurality of words in the word sequence is known.

Stuck on Zero: The malfunction that occurs in an LFSR, wherein the output of all flip-flops in the shift register are at zero output polarity. With the shift register in such an initial state, the feedback is "stuck" at zero. The configurations of the nLFSRs in the preferred embodiments prevent the Stuck on Zero malfunction.

Swap: A method employed in a preferred embodiment for randomizing the output of a modified LFSR, utilizing a configuration wherein the output feedback logic can be programmed such that a control bit can alternate (swap) between two sets of feedback taps (configurations) hence, causing alternating generation of cyclic segments from two maximum length linear feedback register sequences. Simplified examples of a circuit and the sequences produced appear in FIG. 2 and in FIG. 3A.

Synchronous Clocking: A method for controlling the length and timing of random pulses enabling such pulse signals to occur coincidentally with activating pulses synchronized to the primary clock. The logic circuit of FIG. 17 and the timing diagram of FIG. 16 demonstrate a preferred method for synchronizing typically longer pulses from a slower clock to coincide with pulses from the primary clock.

Tent Function: A simple chaos function, wherein the output is typically double the input for up to half range of the output; and the output is twice the maximum output minus twice the input for the second half of the range. A previous output serves as the next input.

Threshold voltage: The voltage level of an analog voltage signal to a binary signal comparator device, that differentiates between the voltage range of a logic one and the voltage range of a logic zero.

Toggle: A complementary change of a binary signal, i.e., a change of a one to a zero or a change of a zero to one.

Trauma, traumatize: Enacting a sudden, unpredictable typically substantial change in a random or pseudorandom sequence. Examples of traumatic random operations which cause trauma to a random or pseudorandom sequence to which they are applied are Slips and Swaps as defined herein.

Trigger: An activating pulse. Triggers that occur at instants uncorrelated to the temporal condition of a device are random triggers. Random triggers are utilized in preferred embodiments to activate slips, to activate change of feedback configurations in swaps, to activate a change of clock mode, to activate a sampling, to activate a read, etc.

Uncorrelated clock frequencies: Typically a condition wherein the least common denominator of two clock frequencies is the integer, one.

Warning Signal: A signal generated by the FIPS 140-2 filter identifying a sampled output of an n bit length nLFSR as comprising at least n−1 bits which are all zero or all one. The warning signal may indicate malfunctioning clocking of an nLFSR. Two consecutive samplings XORed together, of a "standstill" register, will be identical and two identical samplings generate an XORed output of all zeroes. Examples of valid samplings, which cause rare occurrences of warning signals, are elaborated in the Summary of the Invention section.

Word: A defined length of a binary string. Typically, the length of a word is longer than one byte.

XOR: Abbreviation for Exclusive OR. Typically a 2 input logic gate used in modulo 2 arithmetic. For the typical two input XOR gate, an input of same polarity inputs is operative to output a zero; and for either combination [(0,1) and (1,0)] of one and zero, the XOR function outputs a one. For a single bit output XOR function with a plurality of inputs, the output is a one, if the number of "one" inputs is odd; else the output is zero. XOR gates are depicted typically as encircled crosses, see FIGS. 1A–1B or as conventional twos complement gates, see FIGS. 25–26. The capitalized abbreviation XOR is used as a transitive verbal participle, e.g., A is XORed to B; and as a primitive logic function, e.g., 1 XOR 0=1. Word-wise XOR refers to a XOR operation applied to each corresponding pair of bits in two same-length words, thereby to generate a third word of the same length.

Zero: See 0.

FIG. 1A is a simplified block diagram of a modified electronic maximum length linear feedback shift register (LFSR) 300, operative to generate random binary words. The shift register is a concatenated configuration of flip flops, 311, 312, 313, 314 and 315, wherein at each activating pulse from a clock pulse on line 360, the binary symbol in each flip flop is shifted one cell to the right. In the illustrated embodiment, the contents of flip-flop FF1 is transferred to flip-flop FF2, simultaneously the previous contents of flip-flop FF2 is transferred to flip-flop FF3, etc. The feedback configuration of the apparatus of FIG. 1A is implemented by connecting the outputs of the FF2 and FF5 flip-flops to XOR device 325.

In an unmodified conventional LFSR, feedback 302 is input directly into flip-flop FF1. The configuration is linear, because a specific word contained at a given instant leads to another defined binary word at the next activating clock pulse on line 360, if this feedback is directed unmodified to flip-flop FF1. The 5 flip flop linear feedback register (whose register length is 5, or n, in the general case) is maximum length, if the sequence of words resulting from at least 31 ($2^n-1$) activating clocks contains all possible words from 1 to 31 (or one to $2^n-1$). Such a sequence has ($2^n-1$) words, as the all zero sequence is not included. "$2^n$" denotes "2 to the power of n".

The device of FIG. 1A is operative to perform either or both of two non-linear modifications, performed by NOR gate 303 and XOR gate 307 respectively, of a linear feedback sequence generated by an nLFSR-like structure 322. The NOR gate 303 assures that the nLFSR-like structure 322 typically cannot remain in a condition of zeroes in all flip flops, (i.e. in all of flip-flops FF1–FF5), a condition that might otherwise occur at power up. The process of assuring that the next clocked input cannot be all zeroes, is implemented by NOR gate 303 inserting a one into OR gate 305 via line 310, whenever all inputs into NOR gate 303 are zeroes.

Via the XOR gate 307, a random pulse is added on line 320 and is XORed to the feedback signal 302. The output word sequence of the apparatus of FIG. 1A, without the random slip pulses of line 320 is recorded in the sequence of column 304 in FIG. 1B. As shown in the table of FIG. 1B, the all zero condition, 00000, if it occurs at POR despite operation of the NOR gate 303, advances to the 10000 condition at the first clock activation. The LFSR sequence progresses cyclically, from sequence number 1 in column 380, incrementing at each cycle to 31, and then back from 31 to one again, for as long as the clock pulses, and the random slip pulse do not alter the sequence.

The occurrence of a random slip pulse 320 simultaneous to the instant of a clock activation, causes a reverse of polarity of the feedback from line 302, causing a displacement (also termed herein a "slip") from one sequence word to another. Connecting lines 370, and the record of the displacement (slipped sequence number) of column 390, in FIG. 3B, demonstrate the random modification. For example sequence number 9, 10111, becomes 00111 (sequence number 20), when the left hand, most significant bit undergoes a change of polarity. Column 330 records the absolute distance between each complementary pair.

An all zero sequence typically is not part of the accepted set of combinations of an LFSR. This is because the XORed feedback which generates the next "left hand" input on line 302, is zero for zero inputs, since zero XOR zero equals zero.

Figure 2:
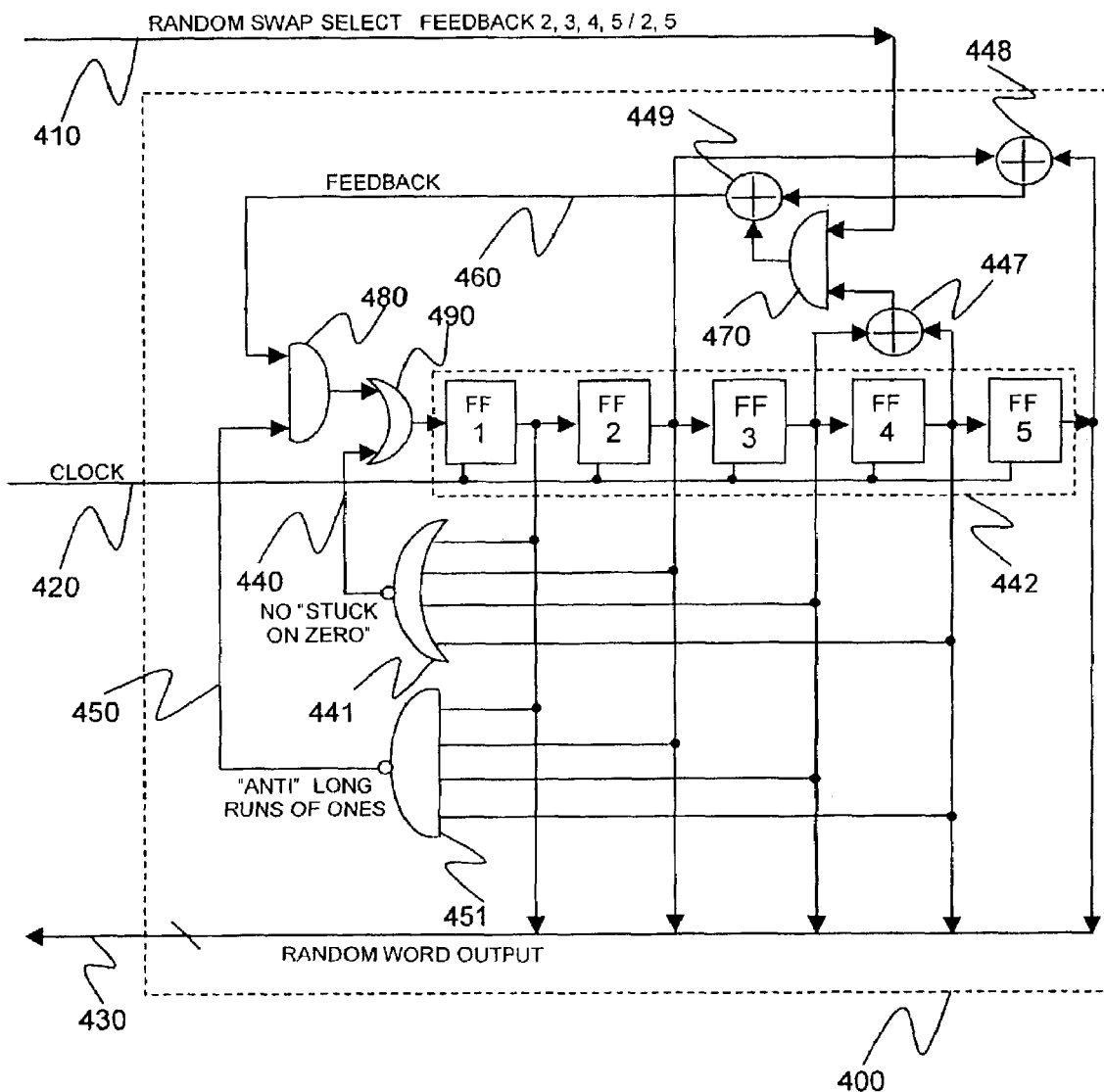
FIG. 2 is a simplified functional block diagram of microelectronic apparatus for generating binary words preferably comprising at least one clocked pseudorandom binary number sequence generator normally operative to generate segments from two cyclic pseudo-random sequences operative to output sequences of binary numbers, wherein random swaps between the two cyclic pseudo-random sequences occasionally occur thereby altering the output sequence.

FIG. 2 is a schematic representation of another length 5 random enhancing modification of a conventional LFSR. The same 5 celled LFSR of FIG. 1A is converted into a non-linear feedback shift register device, using a second enhancement used in the preferred embodiment of FIG. 10. The device of FIG. 2 demonstrates the swap sequence configuration enacted by randomly alternating the device between one feedback configuration to a second feedback configuration.

The two feedback configurations include: (a) a first configuration with shift register 442 output taps only from flip-flops FF2 and FF5, these output taps also termed herein "feedbacks 2 and 5"; and (b) a second configuration, wherein feedbacks from flip-flops FF3 and FF4 are complemented (added to) feedbacks 2 and 5 by a binary one-enabling input on line 410.

When Random Swap Select on line 410 is a one, AND gate 470 switches in the feedback output from flip-flops FF3 and FF4, XORed in exclusive or gate 447, into the results of the output of AND gate, 447. In this four tap feedback configuration, the output from XOR gate 447 is XOR'd by XOR gate 449, to the feedbacks from flip-flops FF2 and FF5. The random swap select on line 410, therefore, transforms the device to a configuration with a single pair feed back to a double pair feedback. The device alternates between one configuration and the other, as the signal on line 410 oscillates.

The output of the NOR gate 440 prevents the "Stuck on Zero" syndrome, as demonstrated in FIGS. 1A–1B. The NAND gate 451 senses the sequence word in which the n−1 left hand flip flops (4 in this embodiment) all have an output of binary one. In the linear feedback case for all LFSR feedback configurations, this causes the next input bit to flip-flop FF1 to be another one. The FIPS 140-2 May 2001 specification limits the number of consecutive ones in a random string, defined as "Long Runs" in the specification. To avert this syndrome, for such long runs of binary one, the output of a zero in such instant from NAND gate 451 blocks the feedback of binary one on line 460 in AND gate 480. NOR gate 441 outputs a zero, as its inputs are all ones, causing the output of OR gate 490 to be a zero, forcing the next word to be a most significant zero followed by all ones (01111).

In addition, one of the FIPS 140-2 tests for pseudo-randomness and randomness calls for a statistically acceptable balance of ones and zeroes in long binary strings. To contribute toward evening the balance of ones and zeroes in a long sequence, this "filter" which eliminates n bit ones, is preferably balanced by the "stuck on zero" filtration of the all n bit zero output of an nLFSR demonstrated in FIGS. 1A and 2.

Figure 3A:
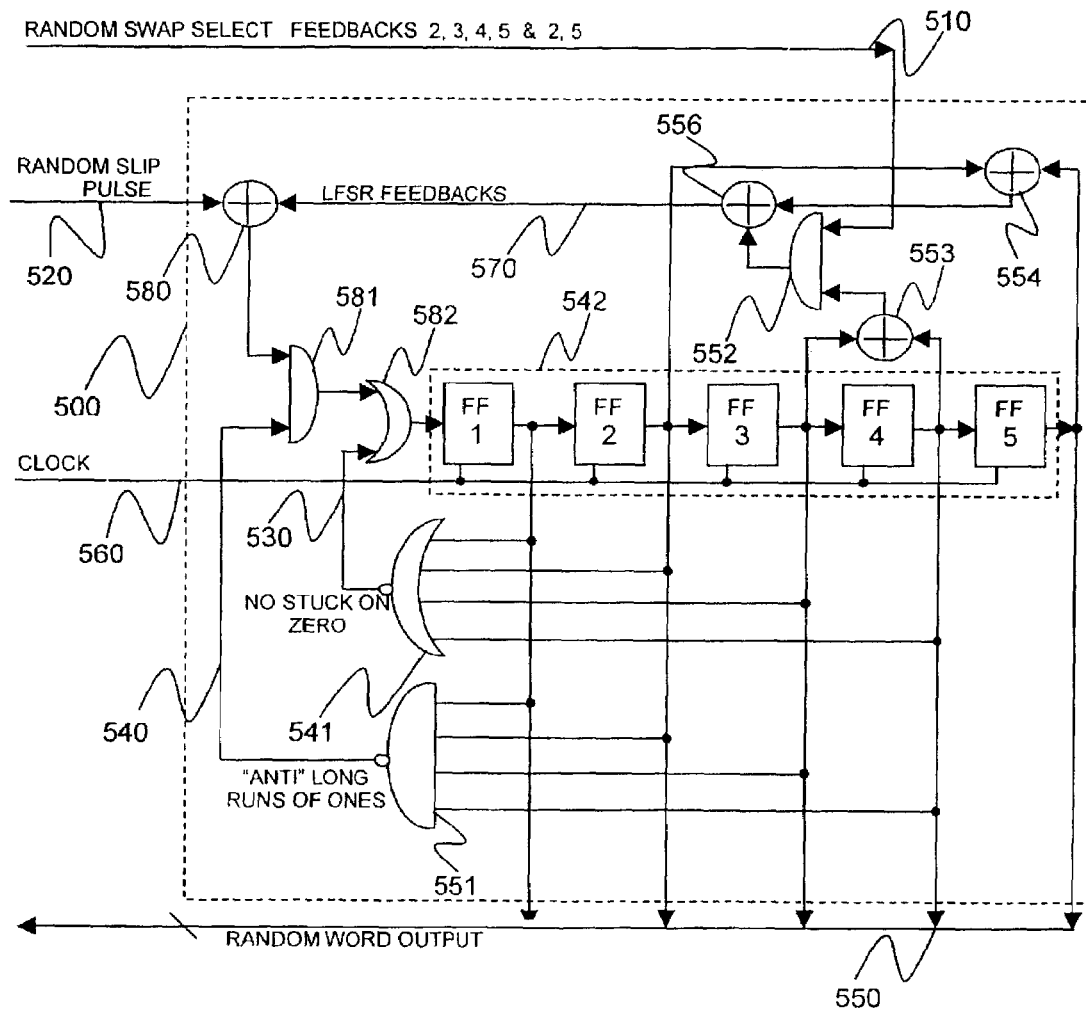
FIG. 3A is a simplified functional block diagram of microelectronic apparatus for generating binary words preferably comprising at least one clocked pseudorandom binary number sequence generator normally operative to generate a cyclic output sequence of binary numbers, wherein both random slips and random swaps occasionally occur thereby altering the output sequence.

FIG. 3A is a simplified functional block diagram of microelectronic apparatus 500 for generating binary words. The apparatus of FIG. 3A preferably comprises at least one clocked pseudorandom binary number sequence generator normally operative to generate a cyclic output sequence of binary numbers. Both random slips and random swaps occasionally occur in the cyclic output sequence thereby altering the output sequence. The apparatus of FIG. 3A preferably implements a combined randomization procedure of the LFSR enhancements of FIGS. 1A and 2. Inputs 520 and 510 are operative to enact the random slip and the random swap, respectively. Input 560 clocks flip-flops FF1 to FF5 in shift register 542. Subject to random occurrences of slip pulses, on line 520 and random swapping of the feedback configuration caused by toggled inputs on line 510, the output on line 550 is a 5 bit pseudorandom binary word. The apparatus generates an LFSR output 570, for either of the two random swap configurations, a feedback 580 XORed to the random slip pulse, an output 530 to prevent a "stuck on zero" syndrome and an output 540 to prevent a "long run of one" syndrome.

Figure 3B:
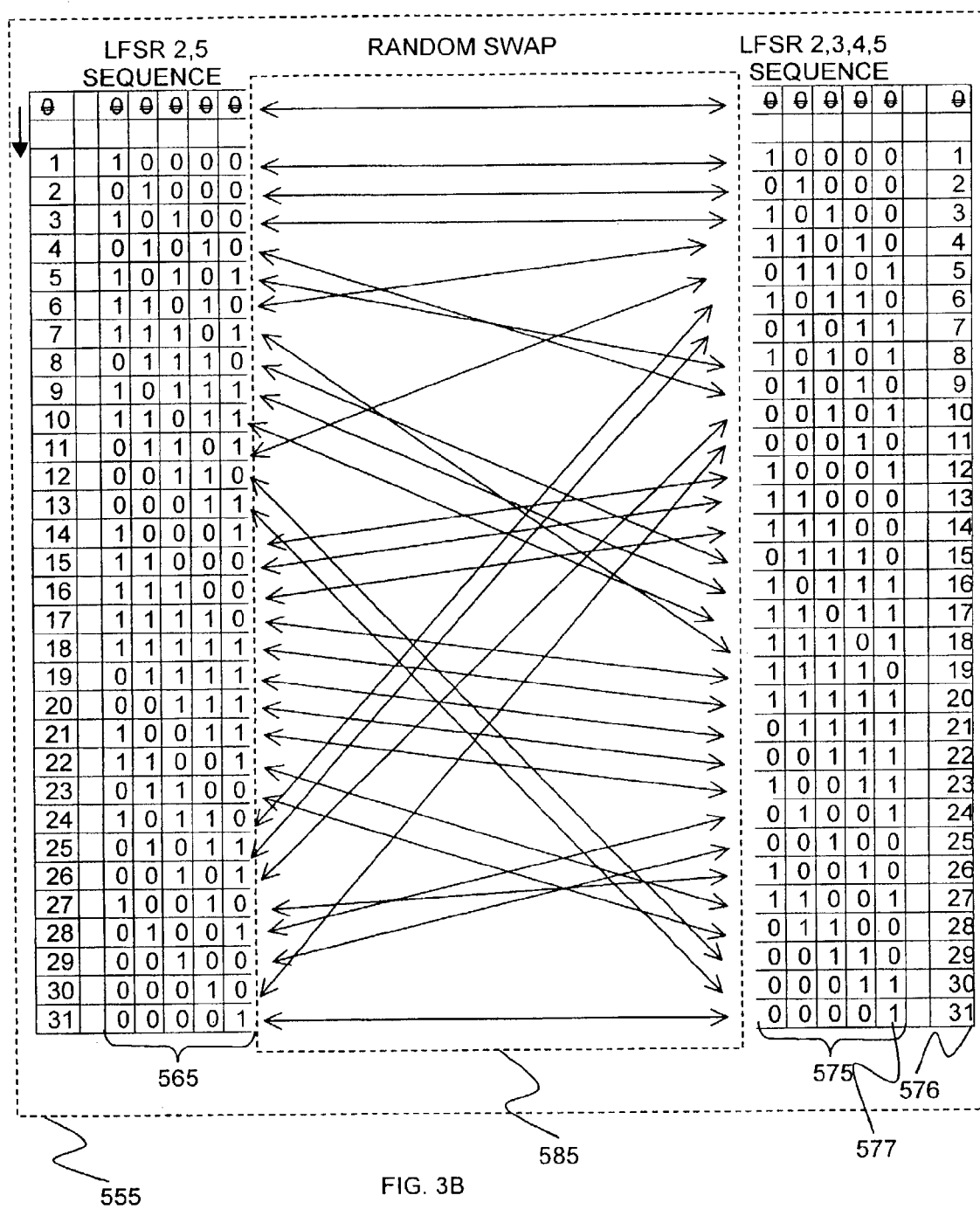
FIG. 3B is a graphic illustration of examples of interaction between two nLFSR generated binary sequences, showing relative placing of same words in the two sequences.

The table of FIG. 3B demonstrates the interaction between two typical length five maximum length linear feedback shift register generated binary sequences. The table of FIG. 3B also illustrates the relation between the positions of corresponding words in these two sequences. The sequences with feedback from flip-flops FF2 and FF5 (column 565) and the sequences with feedback from flip-flops FF2, FF3, FF4 and FF5 (column 575) are generated by the LFSR configurations by the generators of FIG. 2 and FIG. 3A. Arrows 585 show the random effect of a random swap from one sequence to another. Word No. 10, 11011, in column 565, is identical to Word No. 17, 11011, in column 575. One-element column 577 typifies the random 31 bit cyclic stream output of the 5 bit LFSR 1004 of FIG. 11.

Reference is now made to FIG. 4A, a simplified pictorial illustration of a basic sequence (I) of 8 binary words represented in the drawing, for simplicity, by 8 respective fruit pictures. Each fruit picture symbolizes one of the eight octal random digits. Arrow bridges II indicate four complements of binary symbols, where pairs are differentiated by the twos complement of the most significant binary digit. For example, changing the most significant binary digit of the octal symbol for a lemon, 101, from a one to a zero, generates the octal symbol 001, signified by a bunch of grapes. This change of the most significant binary bit is termed a "random slip" from 101 to 001. More generally, in a normal unmodified progression, the basic sequence I is repeated in a cyclic mode, without a defined end.

The displacement caused by changing polarity of the most significant bit of a word in the cycled sequence causes a "slip" which is a forced pseudo-random displacement of a word output of a sequence to another word in the basic sequence to a new place in the same cyclic sequence. The generating circuit of FIG. 25 demonstrates how the bit word sequence may be generated.

Timeline vector VIII in FIG. 4B illustrates a time interval, wherein random slips which modify the basic cycles of sequence I occur at instants IX, X and XI. At each slip instant the most significant binary digit's polarity is two's complemented, i.e., either a zero is changed to a one or a one is changed to a zero. The result of the activation of the random slips on the basic sequence I is sequence III. Specifically, 111 (strawberry) in the sequence is slipped to 011 (banana), the most significant bit 1 is changed in polarity to a 0. Later, 101 (lemon) is slipped to 001 (grapes) and 110 (watermelon) slips to 010 (avocado), as is shown in the slip complements of FIG. 4A.

Concurrently, at times V, VI and VII, a sampler reveals the binary word/picture which appears at such instant. At instant V, the binary symbol 101 (lemon) is read into the output sequence IV. At instant VI, binary word 110 (watermelon) is read into the output sequence IV. At instant VII, 001 (grapes) is read into the stream. Two random processes preferably occur in FIG. 4B, the first process being a series of events, occurring at random intervals, whereby a basic sequence is modified. The second process comprises a second series of events which "picks out" (samples) the modified sequence at uncorrelated instants.

Figure 5:
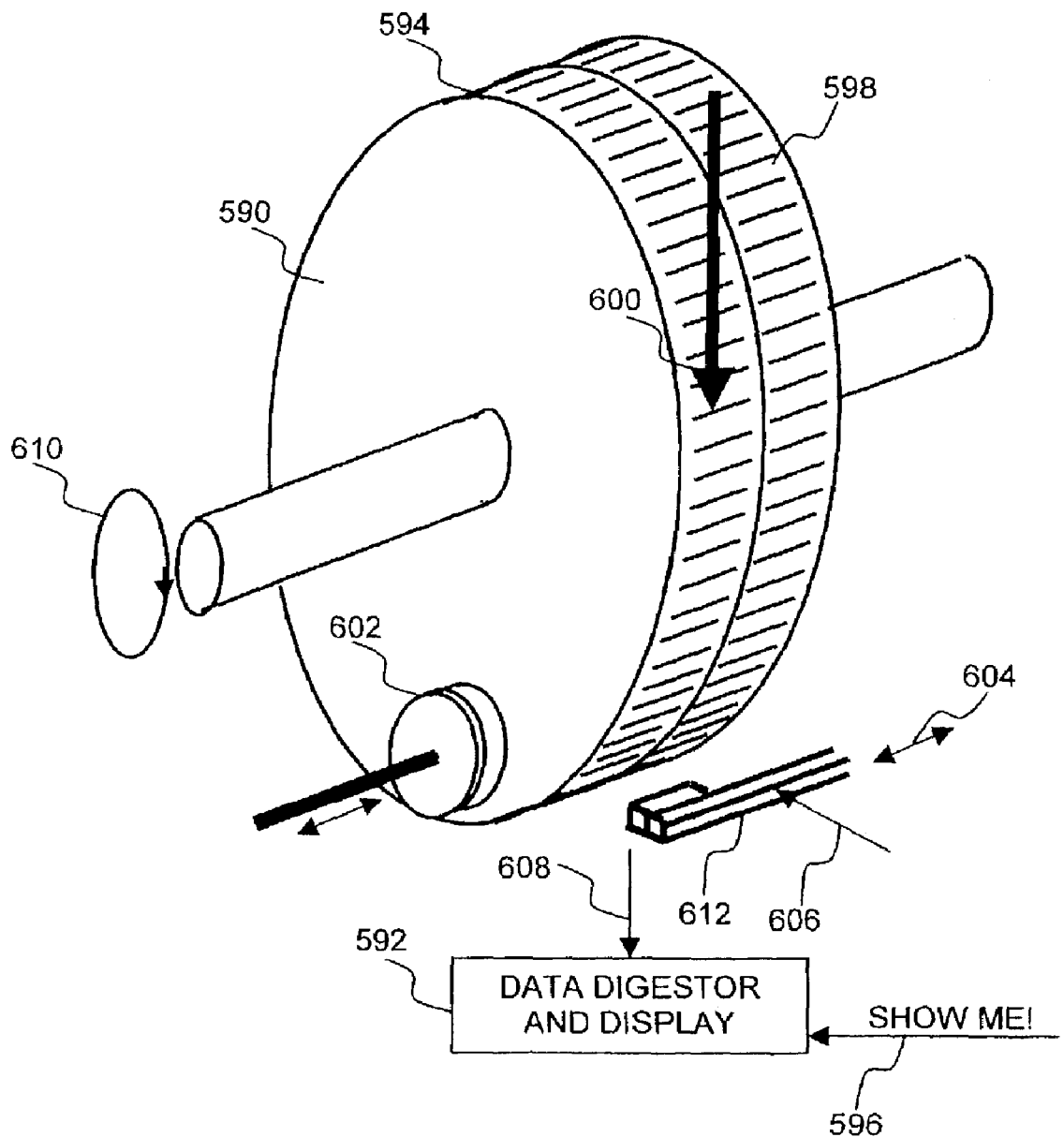
FIG. 5 is a simplified pictorial illustration of a mechanically embodied random number generator, with random slips of a tape on a fruit wheel, a random swap between two sequences of the same fruit pictures, and a further random deceleration of the spinning fruit wheels.

FIG. 5 depicts a "gambling" analog of digital processes utilized in preferred embodiments of the present invention. A rotating drum mechanism 590 is provided, rotating as indicated by arrow 610, typically at a constant angular velocity. The drum mechanism decelerates at random instants for random intervals to a slower velocity due to the random activations of a damper 602. On the circumference of drum 590 are two plastic endless tapes 594 and 598 closely fit to the drum, typically rotating with the drum. Tapes 594 and 598 each bear a long sequence of binary words each in a different pseudo-random sequence. Each of the two sequences contain the same binary elements, but in a different sequence (arrangement) on each of the tapes. The binary elements on each tape may be taken from a given closed set of elements such as the set of 8 fruit pictures shown in FIG. 4A.

A pointed arrowed slip "actuator" 600 is operative, at random instants, to force one of the tapes 594 or 598, to advance a random increment, so that the word seen by a reading element 612 is an unpredictable randomly appearing word. The word sampler 612 is an optical element that can read the word opposite it, on the tape. Sampler 612 is randomly actuated left and right, as indicated by double arrow 604, such that at alternate intervals 612 can sample tape 594 until at another interval it can sample tape 598, only to be reversed at the next random interval back to tape 594. The gambling observer cannot see the internal workings of the device, and because of the rumbling of small pieces in the drum, cannot estimate either the angular velocity of the drum 610, or the place of the reader 612.

Reading of each result occurs at an uncorrelated instant, assuming that the gambler-user has no knowledge of the drum's position, or of the relation of the two tapes to the drum. Reading is actuated by the gambler's actuating a "Show Me!" Arrow 596. The reader arm 612 is pushed by actuator 606 into close proximity with either tape, 594 or 598, and "reads" at least one picture. Reader 612 rotates to direction 608 to be read by Data Digestor and Display Unit 592.

The data digestor and display unit 592 preferably provides at least two options for displaying a result. The simplest option comprises outputting the binary word or corresponding picture, directly. The second option is for the Data Digestor 596 to XOR the two last samples, and then to show the result of the XOR, either as a picture or as a binary word.

The displayed third word is also a valid word which appears on both tapes 594 and 598. A particular advantage of a preferred embodiment of the Data Digestor 592 is that the gambler has less capability of guessing the present condition of the revolving drum and of the attached tapes, reducing the gambler's ability to estimate the next sampled word.

FIG. 6 is a simplified block diagram of a preferred embodiment of a FIPS 140-2 compatible device which includes three non-linear feedback shift registers 640, 650 and 660, operative as a random number generator. Registers 640, 650 and 660 are actuated by at least two uncorrelated oscillating clock devices 632 and 634. The faster system clock 632 typically operates at a frequency of 40 MHz. A slower non-correlated clock on line 634 is operative to output cyclic signals at an unstable frequency, which is typically in the 3 MHz. range. The range preferably varies with small changes of voltage and device temperature.

The inputs to the random number generating apparatus 630 from the CPU Host 620 preferably comprise the two uncorrelated clocks 632 and 634 and two data outputting commands: a Request command 636 and a Read command 638. The Request 636 for an output string is transmitted on line 636 to the random offset latch trigger generator 674. Random offset latch trigger generator 674 is operative to generate a delayed latch signal, regulated by the 2 bit decelerator vector 672, by the fast and slow clocks 632 and 634. Responsive to the Read command 638, a last sample is read out from output port 685 to the data bus 686.

Preferably, the only output from the random number generating apparatus 630 is the data on bus 686. Typically, the output on bus 686 comprises data latched into the output port 685, via the data bus 680, from data strings from the nLFSRs on data bus lines 681, 682 and 683. The read command 638 transfers the stored data in the output port 685 to bus 686, and resets the output port latch flip-flops in 685 to zero. Hence, in the event that the read command 638 is premature, the output data is all zero. Three random strings are generated simultaneously in nLFSRs 640, 650 and 660, respectively. These nLFSRs are typically based on maximum length shift registers of lengths 11, 8, and 13 respectively.

The binary contents of each of the nLFSRs 640, 650 and 660 is randomized by two uncorrelated sources. The slip triggers, on lines 622, 624 and 636, emanating from slip trigger generator 670 at staggered instants from slip trigger bus 671, emanate at regular intervals switched in turn in regular intervals, regulated by the fast clock. The average random sequence slip displacement at such triggers is $2^n/4$, where n is the number of flip-flops in the nLFSR register. The second source of unpredictability, inherent to each nLFSR, is the change of frequencies of the driving clocks on lines 642, 652 and 662.

Figure 8A:
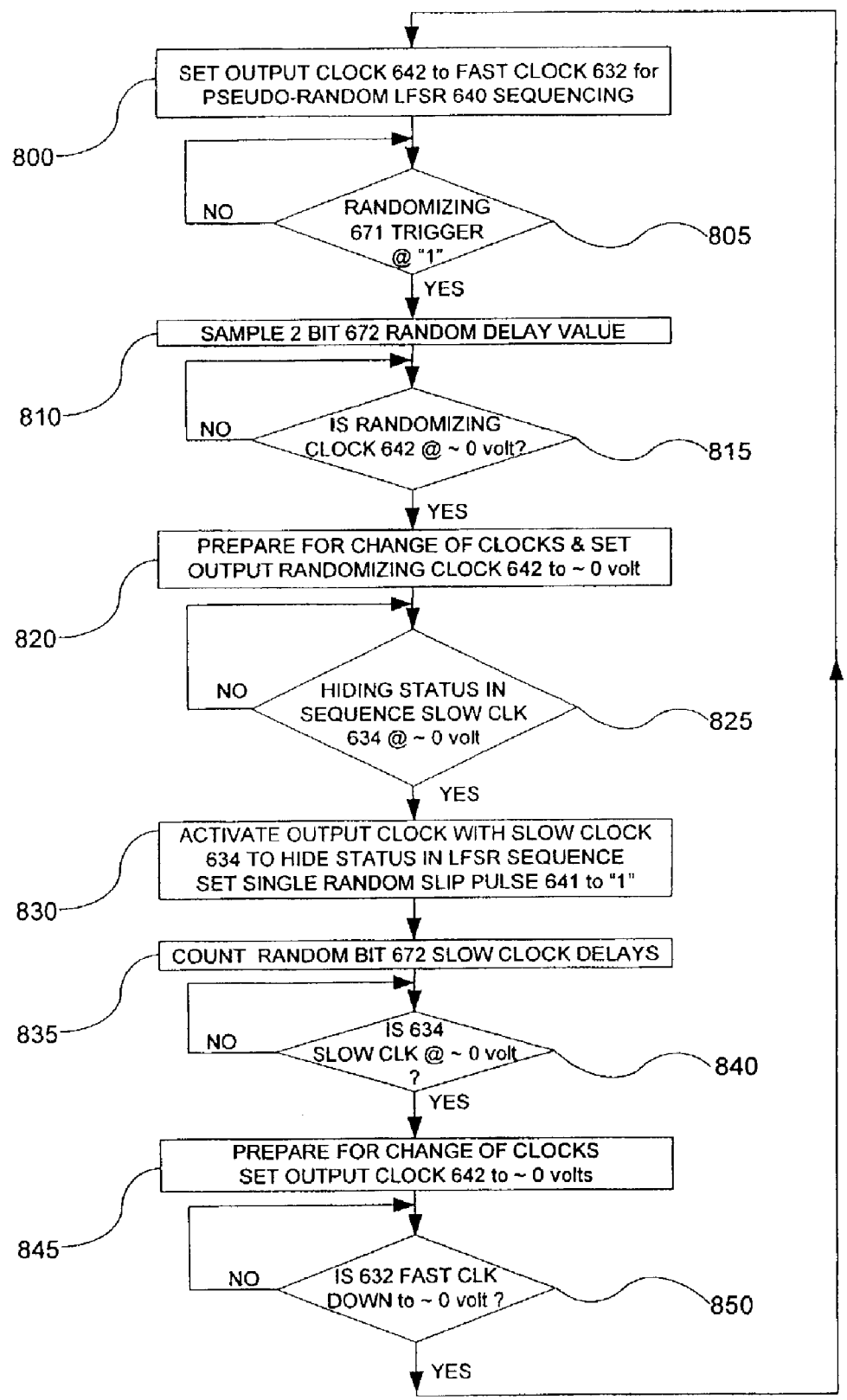
FIG. 8A is a simplified self-explanatory flowchart illustration of a preferred method to enable a device clock source changeover from one primary clock source to a second uncorrelated primary clock source wherein the alternated clock source is only enabled when the device clock output is held at logic zero thereby precluding meta-stability on the device clock source output.

Responsive to each slip trigger command, a corresponding Slip & Mixed Clock Generator 643, 653 or 663 switches the frequency on its corresponding clock line 642, 652 or 662, from the fast clock to the slow clock, for a random interval (a random number of slow clock cycles), as prescribed in the flowchart of FIG. 8A for nLFSR 640. The process described in the flowchart of FIG. 8A for nLFSR 640 may be identical to the random deceleration in nLFSRs 650 and 660. Preferred synchronized timing of the random decelerated clocks generated by clock generators 643, 653 and 663, to avoid glitches, is illustrated in the timing diagram of FIG. 9.

Slip Trigger Generator 670 generates slip pulses to the Slip & Mixed Clock Generators 643, 653 and 663. The slip pulses are generated at regular intervals which are uncorrelated to the temporal values in the nLFSRs. The slip pulses are generated, in turn, on lines 622, 624 and 626, The temporal random value in the 2 bit decelerator vector on bus 672 is not correlated to the decelerated value in the corresponding nLFSR 640, 650 or 660.

Figure 7:
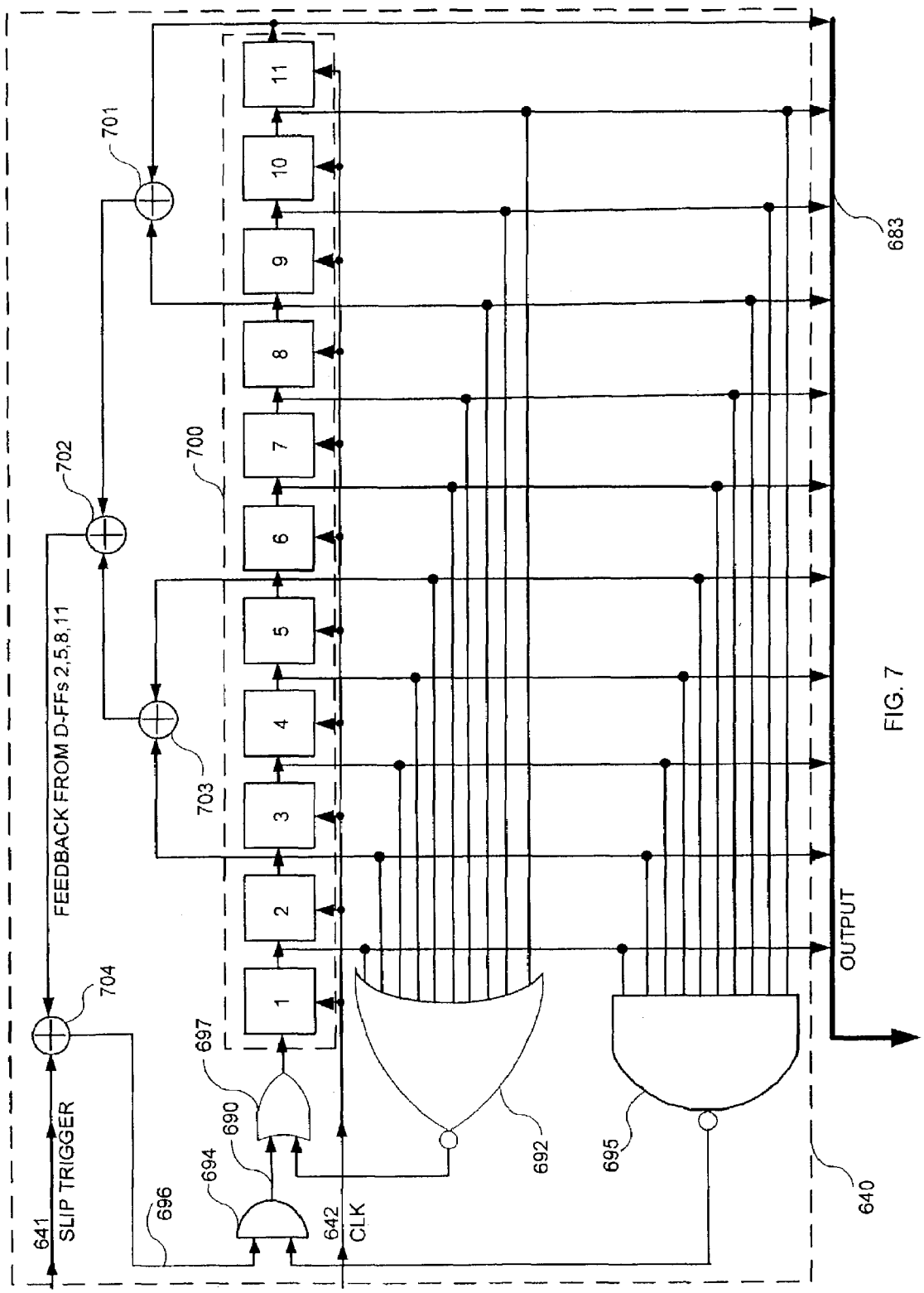
FIG. 7 is a simplified functional block diagram of a preferred implementation of an individual one of the non-linear feedback shift registers of FIG. 6.

FIG. 7 is a simplified functional block diagram of a preferred implementation of an individual shift register 640 from among the three non-linear feedback shift registers of FIG. 6. The diagrams of nLFSRs 650 and 660 may be identical in structure to shift register 640, in all respects except for the number of cells in the shift register, and the specific feedback configuration.

NLFSR 640 has two inputs: the slip trigger 641, and the activating clock, 642. The linear feedback taps from shift register 700 (four, in the illustrated embodiment, connected to the outputs of flip-flops FF2, FF5, FF8, and FF11 respectively) are exclusive-ORed by XOR gates 701, 702 and 703. Subsequently the taps are further XORed to Slip Trigger signal on line 641 by XOR gate 704. A method and apparatus for preventing all zero output words (stuck on zero) using NOR gate 692 ORed to the feedback in OR gate 697 may be provided which may be identical to the same mechanism illustrated in FIGS. 1A, 2 and 3A. A method and apparatus operative to prevent an all one content of shift register 700, via NAND gate 695 which controls the output of AND gate 694, may be provided and may be identical to the method and apparatus of FIGS. 2 and 3A.

The output 683 of nLFSR 640 is preferably connected to all outputs of the flip-flops of shift register 700, as depicted in FIG. 6.

FIG. 8A is a simplified self-explanatory flowchart illustration of a preferred method of operation of any one of the nLFSRs of FIG. 6 e.g. NLFSR 640. The method of FIG. 8A enables a device clock source changeover from a first system (primary) clock source to a second, typically uncorrelated, system clock source. The clock source is preferably alternated only when the output of the device clock 642 is held at logic zero thereby precluding meta-stability on the device clock source output. Two clock switching devices (not shown) may be provided within each of the slip and mixed clock generators 643, 653 and 663 of FIG. 6, in order to prevent competition between output signals of clock 624 and output signals of clock 634, leaving to undefined output on input line 642.

Figure 8B:
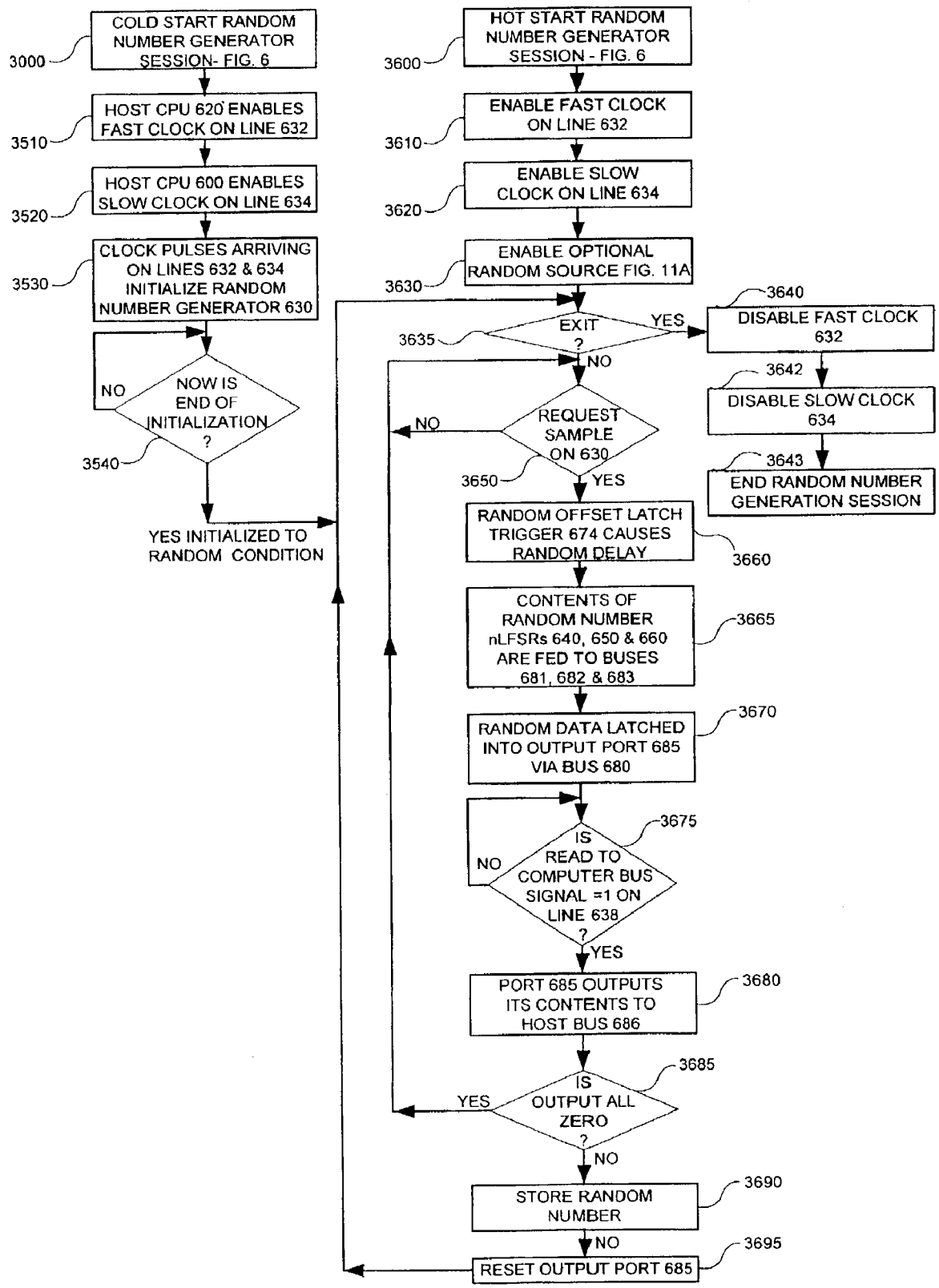
FIG. 8B is a simplified self-explanatory flowchart illustration of a preferred method of operation for the apparatus of FIG. 6.

FIG. 8B is a simplified self-explanatory flowchart illustration of a preferred method of operation for the apparatus of FIG. 6.

Figure 9:
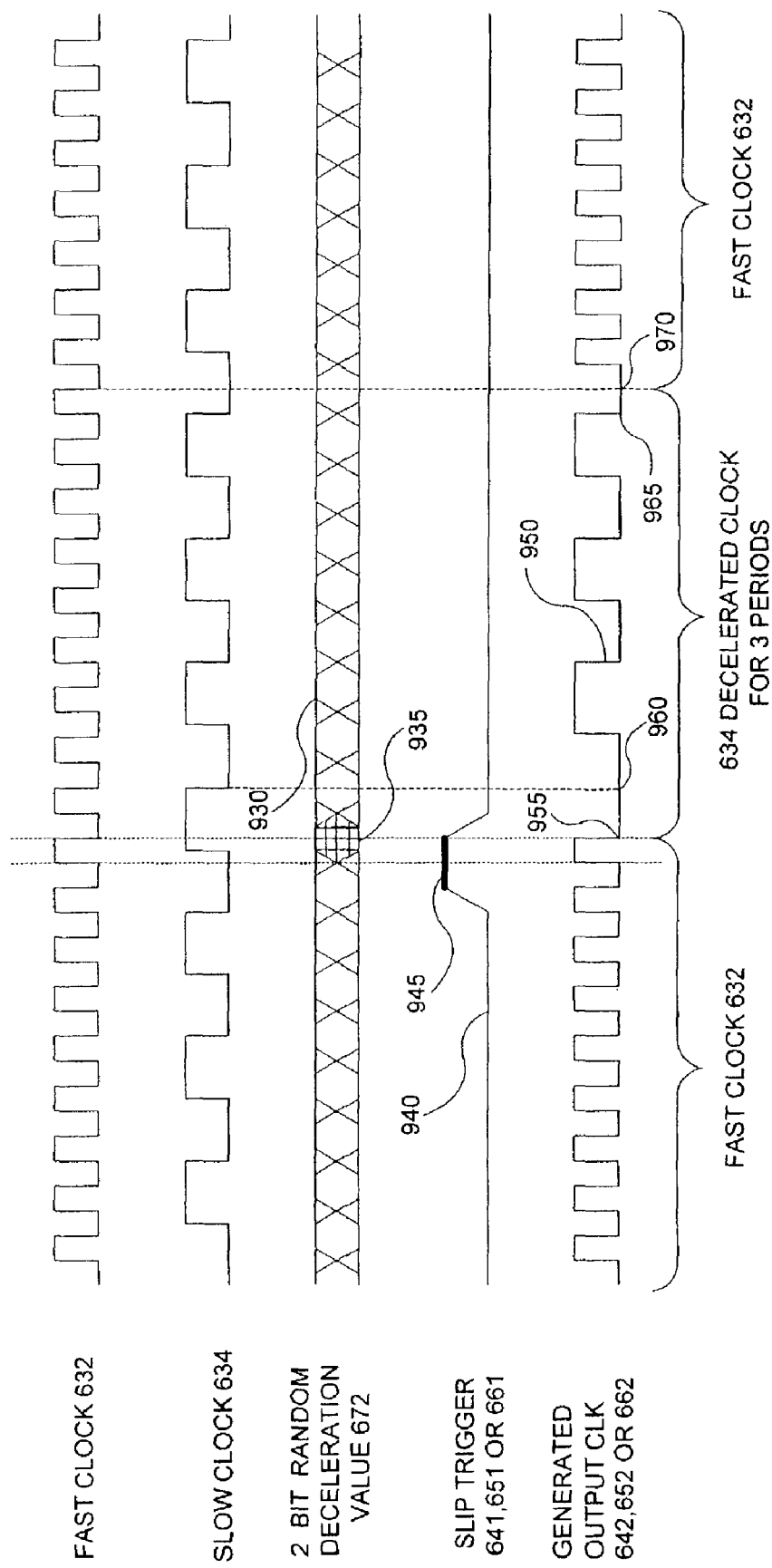
FIG. 9 is a preferred timing diagram of the output of the slip & mixed clock generator when operating in accordance with the method of FIG. 8A.

FIG. 9 is a preferred timing diagram of the output of an individual one of the slip & mixed clock generators 643, 653 and 663 when operating in accordance with the method of FIG. 8A. The periods of the fast clock 910, and the slow clock 920, are typically not correlated. The 2 bit vector 672 in FIG. 6 regulates the random number of slow clocks which activate the nLFSR corresponding to the slip & mixed clock generator, during the decelerated interval. The decelerating number of Slow Clocks is commensurate to the value sampled during sampling period 935. The slip and mixed clock generators 643, 653 or 663 or FIG. 6 sample a 2 bit value (such as 3, in the illustrated example) when the slip trigger signal on time vector 940 rises to a one as shown at reference numeral 945.

As shown in the glitch preventing flowchart of FIG. 8A, the slip & mixed clock generator 643, 653 or 663, switches off the fast clock 632 at instant 955, and keeps voltage at logic zero, until the instant 960 at which the slow clock 634 is at logic 0. At this point the slow clock 634 is switched in. The generated output voltage is held to logic zero, until instant 960, when slow clock 634 falls to zero. At this point, the slow clock 634 is switched into the circuit for three slow clock cycles, ending at instant 965, when the slow clock cycle reverts to logic zero. At this point, the slip & mixed clock generator 643, 653 or 663 holds the output at zero, until instant 970. At this point, the fast clock 632 falls to zero, and the slip and mixed clock generator switches in the fast clock. In summary, in the method of FIG. 8A, changes of the clock input into each nLFSR are typically implemented by switching off one clock, from among fast and slow clocks 632 and 634, when that clock's output is zero, and switching in the other clock when that other clock's output is zero.

FIG. 10 is a simplified functional block diagram of a 24 bit random number generator 1000. The random number generator of FIG. 10 preferably comprises an 8 bit status monitor 1505 operative upon request to generate a 24 bit sample word, derived from a plurality of previously generated 24 bit sample words. Concurrently, the 8-bit monitor 1505 records status conditions of the outputs of previously (e.g. the last 6) sampled and processed 24 bit words. The random number generator 1000 of FIG. 10 is typically activated by two uncorrelated clock oscillators 1030 and 1040. A primary clock, on line 1040, is typically the Host system clock, synchronized to Host operations. A second autonomous clock, typically operating at a lower, unstable frequency, input on line 1030, may be operative to assure randomizing aberrations in the normal operation of the random number generator 1000.

The clocks 1030 and 1040 are operative to activate the generator 1000 in two alternate modes of operation. Change of mode, from single to dual mode, is controlled by a host control command, Single Clock/Dual Clock Mode, which is input to the generator 1000 on line 1080. Typically, during the initialization process, both clocks 1030, 1040 are enabled to work concurrently to set the generator 1000 to one of the typically more than 2^50 equiprobable unknown and unpredictable states. Continued operation in dual clock mode, with both the primary clock, 1040 and the uncorrelated clock, 1030, in operation, in the dual clock mode, or alternatively, activation of single clock mode, with only the primary clock 1040 in operation, is dependent on available resources and on the specific application.

The generator 1000 typically comprises two non-linear feedback shift registers, nLFSRs 1200 and 1300. The nLFSR lengths (number of flip-flops) in the illustrated embodiment are 15 and 17 respectively. Two control units, 1100 and 1150, regulate the swap and typically less frequent slip pulsed traumatic randomizing operations of the nLFSRs 1200 and 1300. Each of the control units may be configured as shown in FIG. 11 and is preferably operative (a) to switch feedback tap configurations (feedback swaps) with signals 1101 and 1151 and (b) to initiate, at staggered instants, random slips on lines 1102 and 1152. The feedback shift registers, 1200 and 1300, operate continuously as driven by the primary clock 1040.

Figure 30:
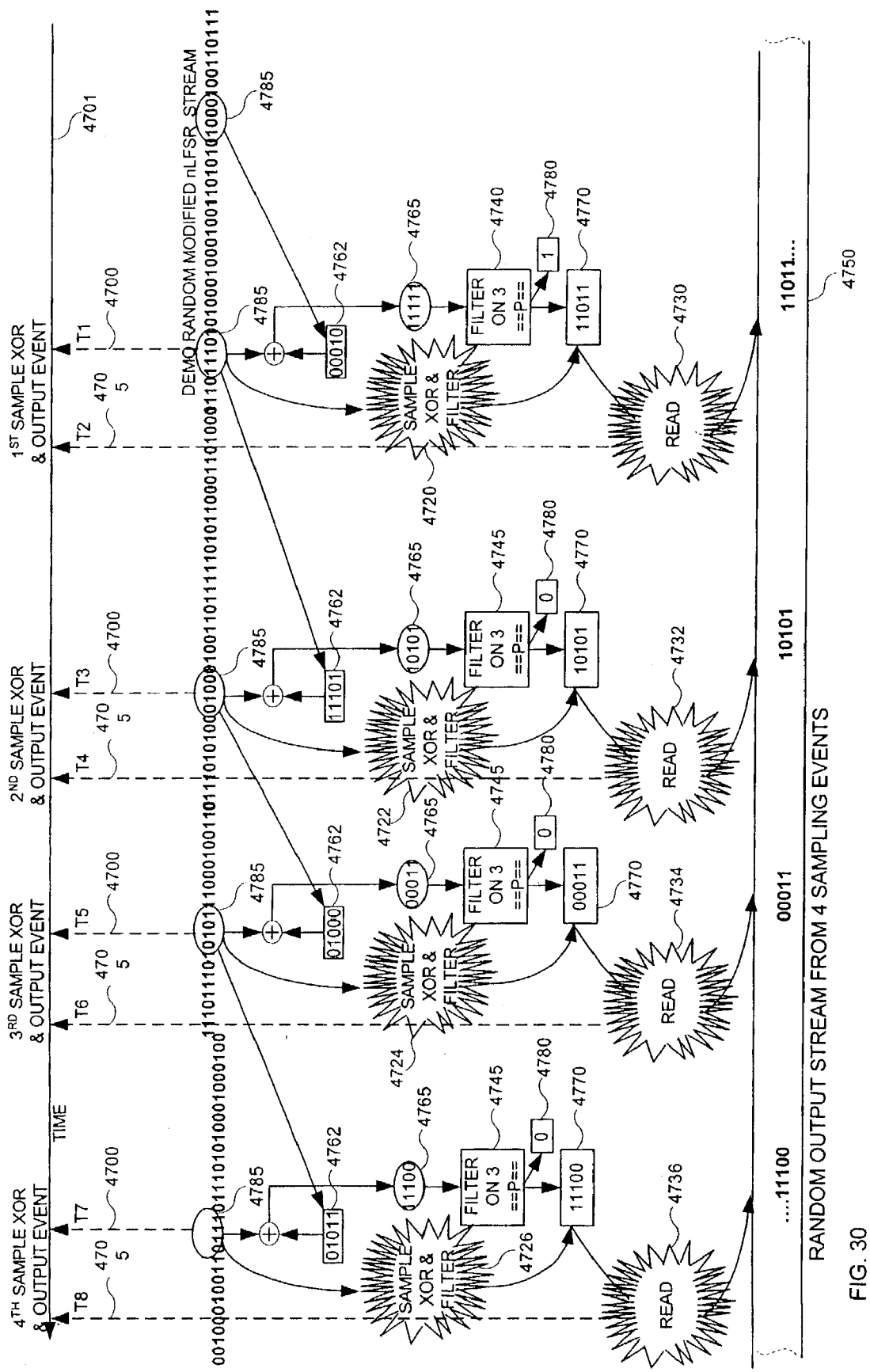
FIG. 30 is a pictorial representation of a preferred method for sampling an nLFSR generated random string operative to mask the true value of the sampled binary number stream of the instant of sampling by enacting the exclusive or, XOR, function where the two input strings are a presently sampled binary value with a previously sampled binary value, while simultaneously operating a filter to prevent outputting runs of all zeroes or all ones, while monitoring each output to ascertain malfunction of a segment operative signified by a warning signal transmitted to the status byte.

In the random number generator of FIG. 10, some or all of the following 7 input signals shown emanating from the Host control bus 1726, are typically provided:

Input signal 1010: An optional random source, typically for enhancing single clock mode operation, typically emanating from the optional chaos generator of FIG. 21A into the control units 1100 and 1150 of FIG. 10;

Input signal 1020: A set command to 5 bit LFSRs 1004 within control units 1100 and 1150, to externally increase unpredictability of the temporal occurrence of traumatizing triggers;

Input signal 1030: An autonomous (typically slower) uncorrelated clock;

Input signal 1040: The primary clock, typically operative as the system clock of the Host 1002, operative to drive the nLFSRs and to synchronize all internal signals of the random number generator 1000, to the signals of the host interface; preferably as depicted in FIGS. 10 to 20;

Input signal 1080: a clock mode control signal, "single/dual mode" operative to enable all generating functions of random number generator 1000 to operate in single clock mode (primary clock) or in dual clock mode with additional unpredictable scrambling caused by uncorrelated signals generated by two uncorrelated clocks;

Input signal 1050: a Sample command, operative to initiate a sample and temporary storage of present instantaneous outputs of 24 bits emanating from nLFSRs 1200 and 1300, and to word-wise XOR process said sampling typically word-wise XORed with a previously stored sample depicted in FIG. 30; and Input signal 1060: a READ command, to output the audit of the last six samplings from the random number generator 1000 and the processed 24 output strings stored in the output port 1500.

Only the 12 most significant bits of random string from nLFSR 1200 and nLFSR 1300 are sampled to the final output. These 24 bits of random data are input into intermediate latch and XOR devices 1400 and 1410. Each latch and XOR device 1400 and 1410, is operative when receiving a sampling signal on line 1418 to (a) store the outputs of nLFSR busses 210 and 1310, respectively, and (b) to XOR those outputs with the previously sampled outputs. The XORed result is filtered through FIPS 140-2 compliant logic filters 1405 and 1415 respectively to output latches 1510 and 1520, respectively, as detailed in the flowchart of FIG. 19. Filters 1405 and 1415 modify the XORed outputs when appropriate to eliminate longest runs of ones and zeroes, and transmit "long run alert"/"all well" signals (1 or 0, respectively) on U15 line 1406, and on U17 line 1416. Zeroes on the U15 and U17 lines may signify "all well".

Figure 15:
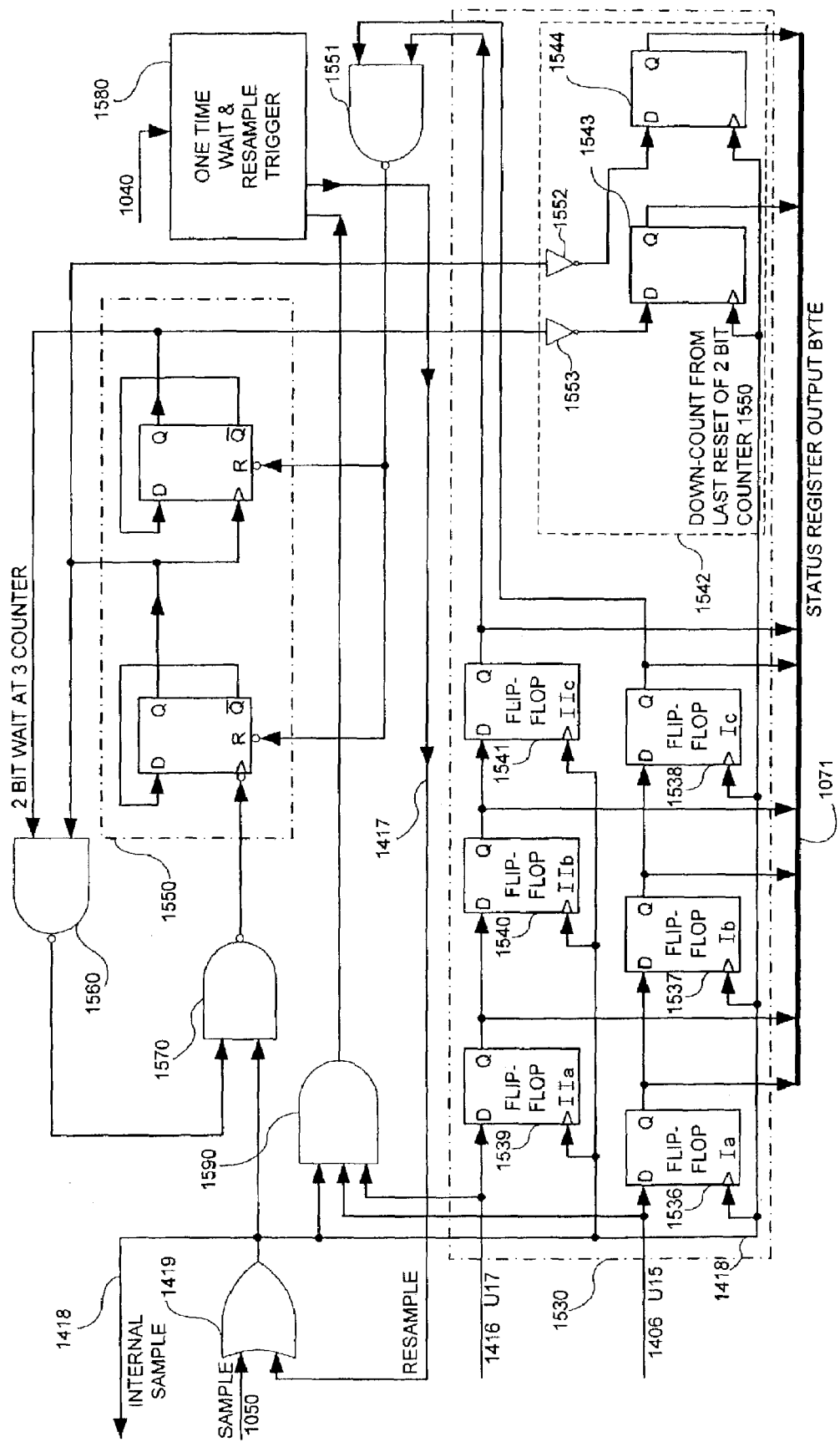
FIG. 15 is a simplified functional block diagram illustration of a preferred implementation of the status generator and latch 1505 of FIG. 10, typically operative to receive long run warning signals from the two intermediate XOR transformers, to output said long run signals from the last three samplings, and to activate a new sampling, in the event that both registers activate a warning.

Signals U15 and U17 are operative to alert the Host controller 1002 of events such as suspect long runs and/or faulty operation of shift registers 1200 or 1300. An audit of the last 6 samplings is recorded in the 8 bit status monitor 1505, a preferred embodiment of which is illustrated in FIG. 15. A preferred method of operation for the apparatus of FIG. 15 is illustrated and the processes are detailed in FIG. 20. In the event that both alert signals, U15 signal 1406 and U17 signal 1416, are ones, an internal resample trigger activates a delayed resample pulse on line 1417. Repeated ones on either U15 or U17 may typically warn a controller of suspect faulty operation.

Figure 21A:
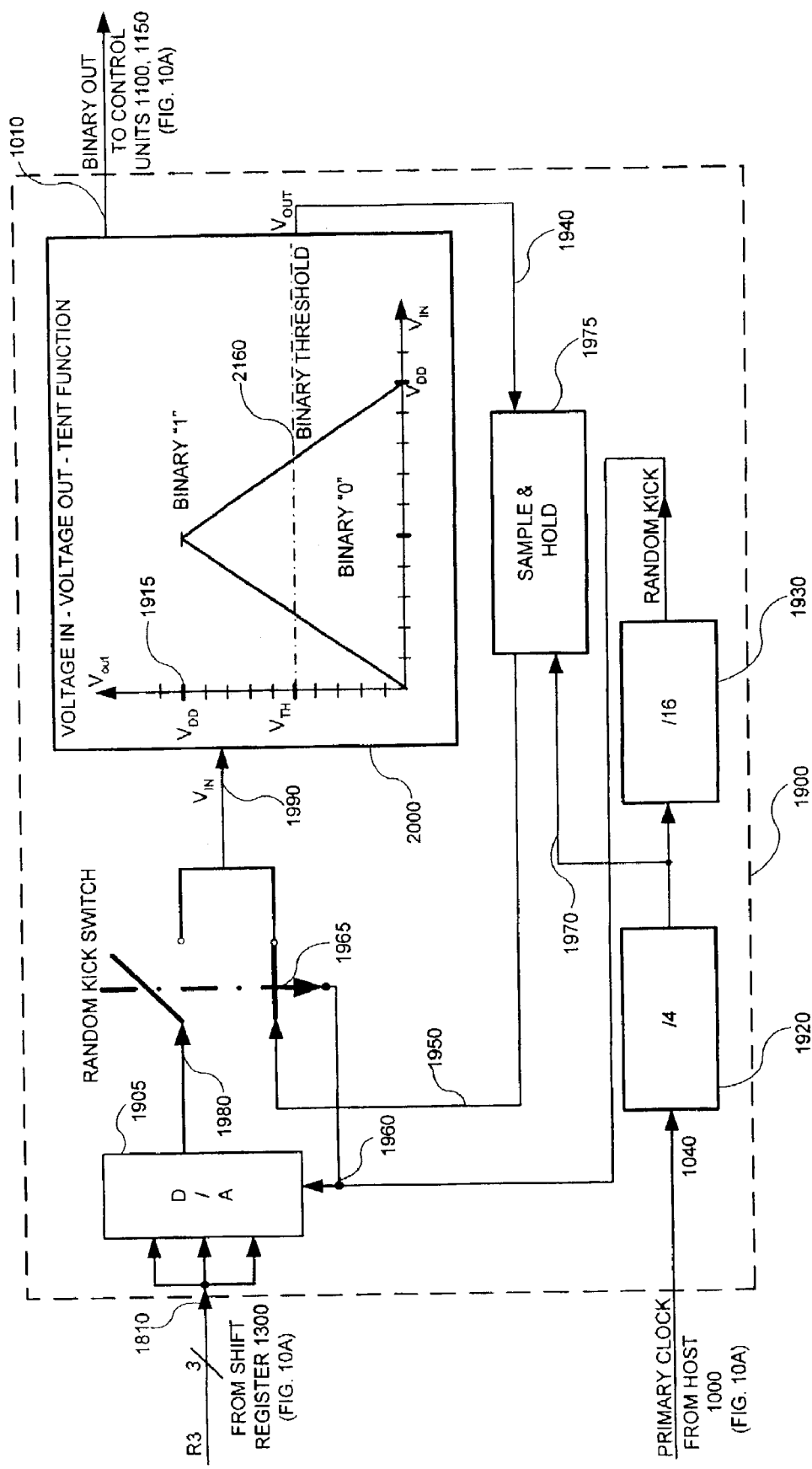
FIG. 21A is a simplified functional block diagram of an electronic circuit constructed and operative in accordance with a preferred embodiment of the present invention, which is operative to generate a "metastable chaotic tent function", operative to output a chaotic binary symbol once every four primary clock cycles, thereby to generate a sequence of chaotic binary symbols, of which one symbol out of sixteen is a function of a "random kick" generated by a three symbol sampling of an operative nLFSR.
Figure 21B:
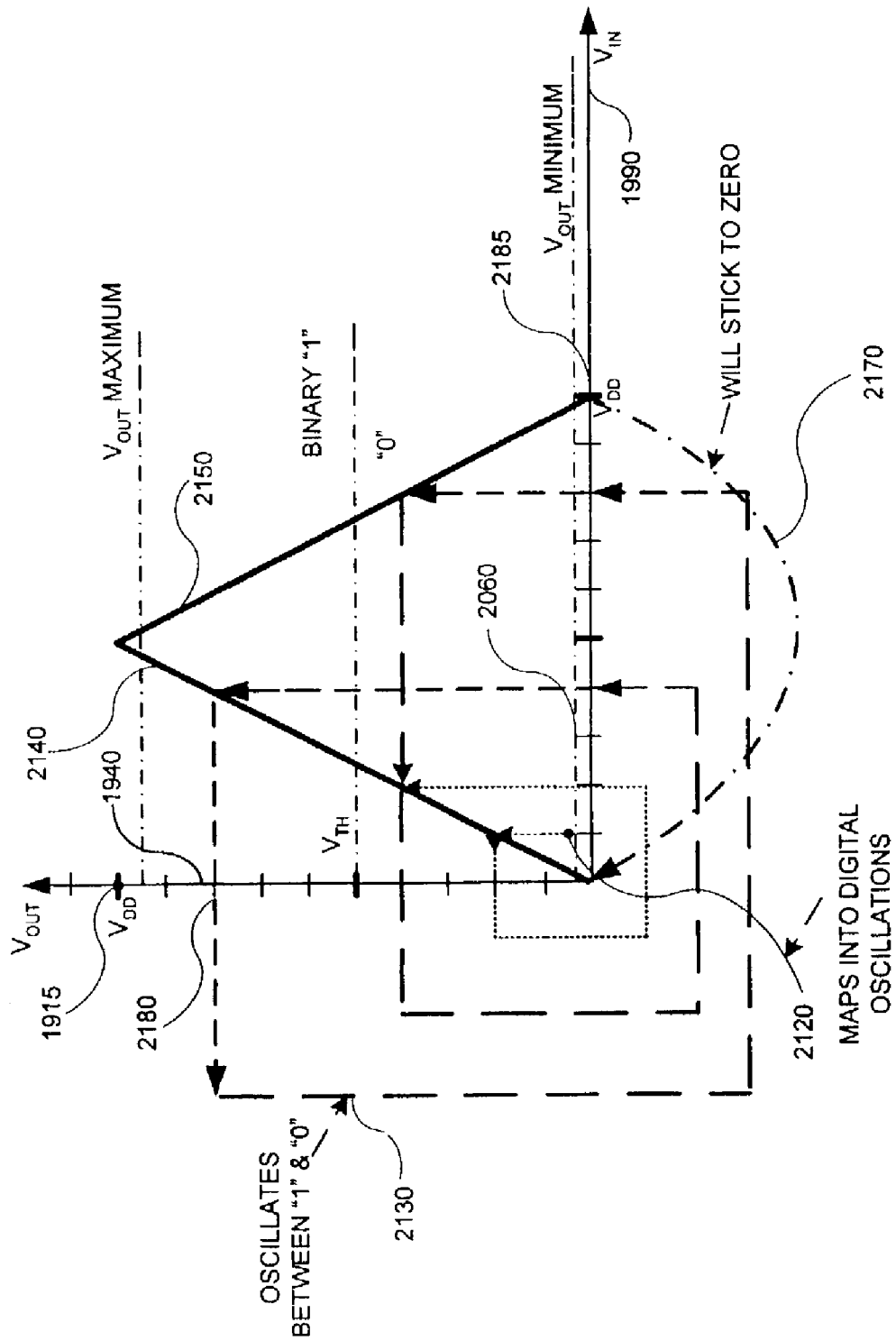
FIG. 21B is a pictorial illustration of two aberrant processes which may occur as a result of use of a digital voltage-in-voltage-out function 2000, in FIG. 21A, a first process being mapping into a "stuck on zero syndrome" and a second being mapping into a zero one zero binary oscillation having a graph as shown.
Figure 21C:
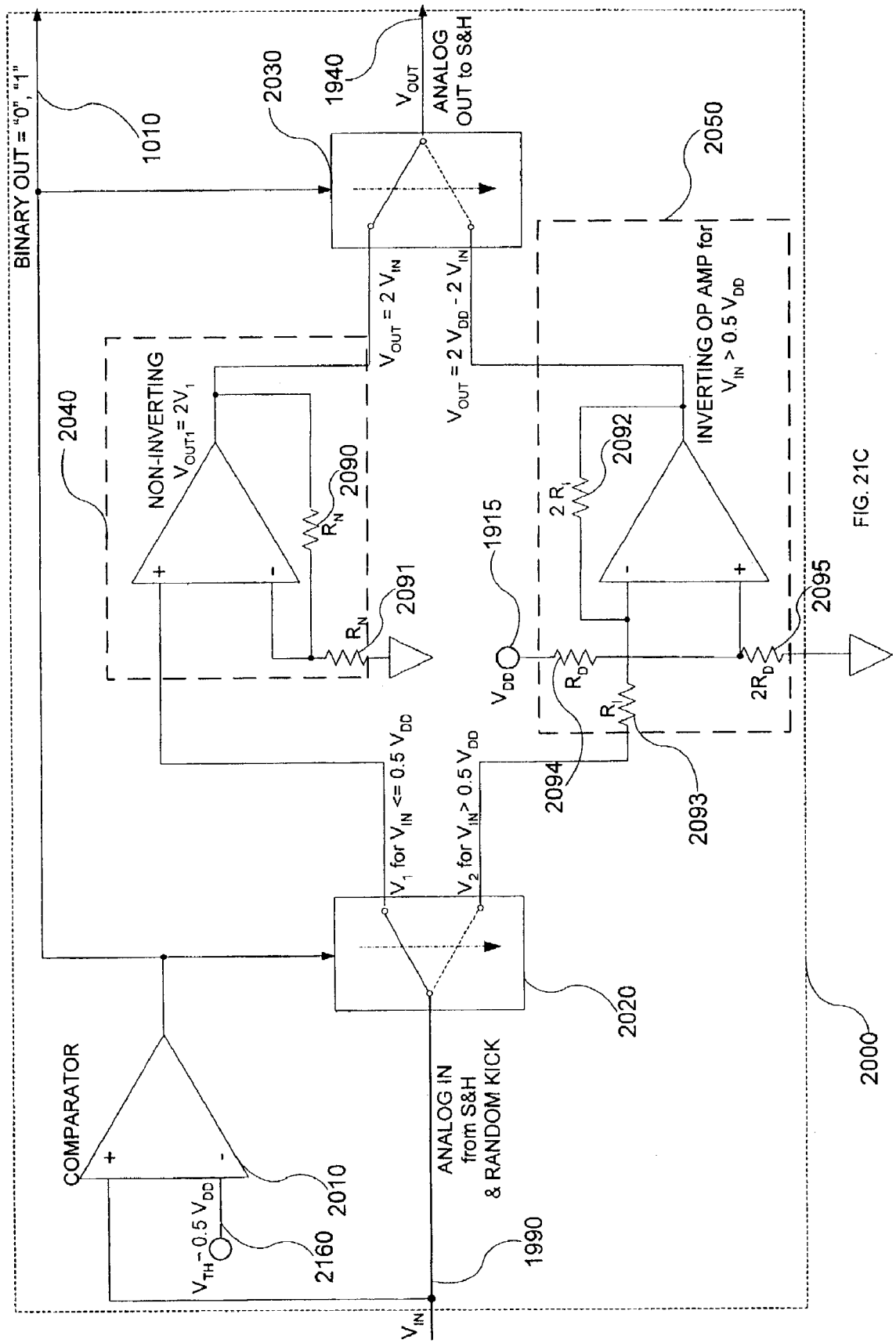
FIG. 21C is a simplified electronic block diagram of a preferred implementation of the voltage-in-voltage-out function block 2000 of FIG. 21A.

An optional input random binary stream 1010 is typically generated by the binary output of a chaos generator a preferred embodiment of which is illustrated in FIGS. 21A–21C as the binary output 1010. The chaos generator is operative to add unpredictability to the internal variables of random number generator 1000 at any random instant.

An external input of a one on line 1020 sets the 5 bit LFSRs 1004 (FIG. 11) in control units 1100 and 1150, to all ones. Setting the LFSRs 1004 (FIG. 11) in random instants allows the Host controller 1002 an option that typically may add entropy to the concatenated 12 bit output strings 1510 and 1520. Repeated external resetting of LFSRs 1004 at random times typically alters the internal variables of the system, such that the operation in single clock mode using the primary clock 1040 may produce unpredictable sequences with entropy commensurate to results using dual mode clocking.

An input 1030, in FIG. 10 from an un-correlated oscillating device, typically a ring oscillator, is fed into both control units of FIG. 10. Both control units operate at a frequency dissimilar to that of input 1040. Typically, the least common denominator of the frequencies of primary clock 1040 and of un-correlated clock 1030 is one.

Control unit 1100 receives, on R2 bus 1301, three bit random values from shift register 1300. The 3-bit random values are operative to add random delay to the feedback swap command 1101, and to add random delay to the emission of the slip pulse 1102.

Control unit 1150 receives, on R1 bus 1201, three bit random values from shift register 1200. These 3-bit random values are operative to add random delay to the feedback swap command 1151, and to add random delay to the emission of the slip pulse 1152.

Input 1080 is the single/dual clock mode switch in control units 1100 and 1150. A decision to implement such dissimilar clocking devices is typically contingent on application resources and system constraints.

Figure 14:
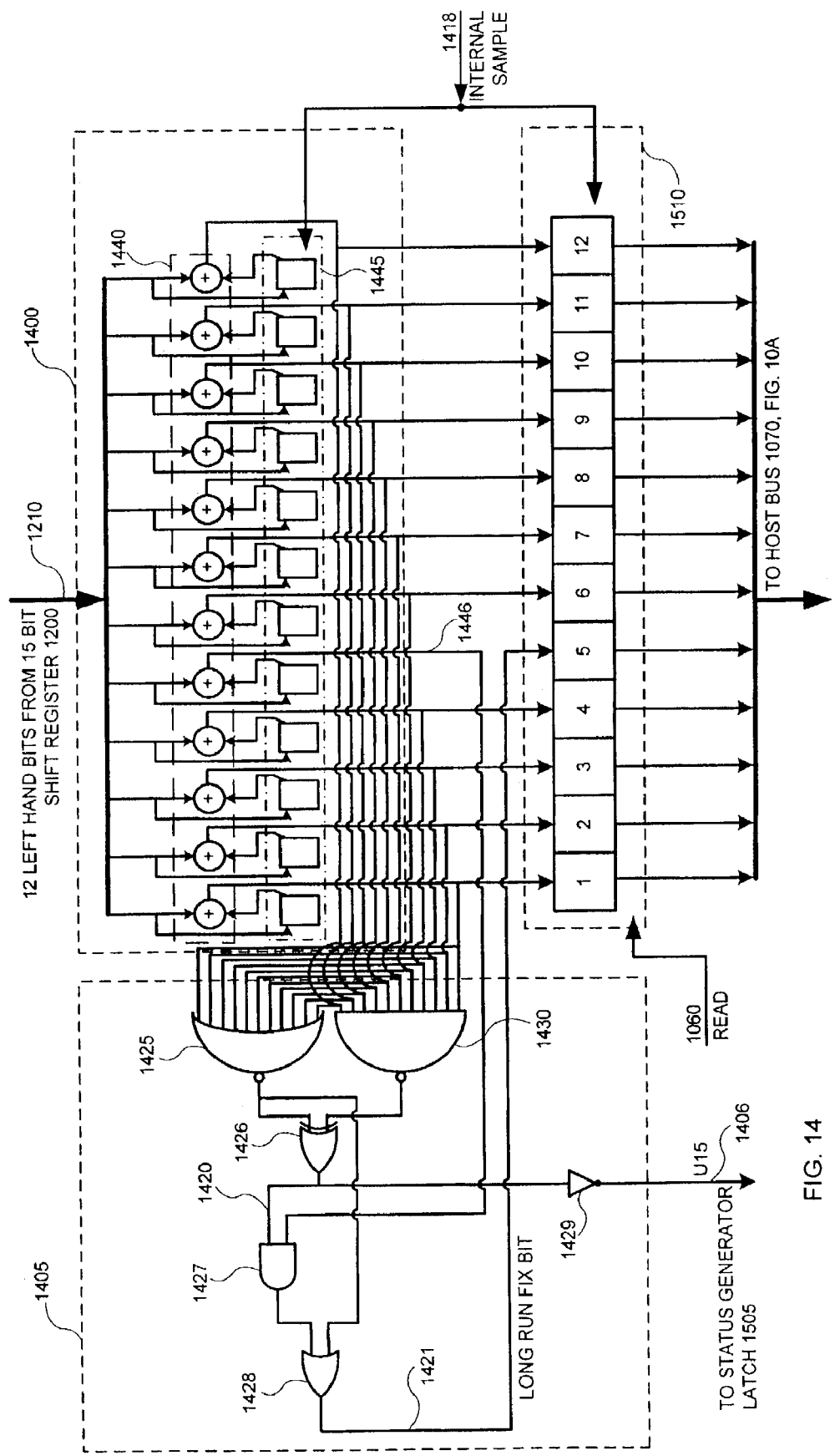
FIG. 14 is a simplified electronic block diagram illustration of the intermediate latch, the filter and the output latch of FIG. 10, constructed and operative in accordance with a preferred embodiment of the present invention, characterized in that the intermediate latch performs an nLFSR masking XOR operation in accordance with a preferred embodiment of the present invention.

As shown in FIGS. 10 and 14, sample signal 1050 actuates the 12-bit sampling of registers 1200 and 1300 thereby effecting the following operations:

(a) storing of the sampled strings on buses 1210 and 1310;

(b) XORing strings 1210 and 1310 with the previously sampled strings stored in the flip-flops of intermediate buffer 1445; and (c) after minimal filtering in FTPS 140-2 filters 1405 and 1415, storing the XORed output in segments 1510 and 1520 of output port 1500, while recording the values of the last U15 signal 1406 and of the last U17 signal 1416 in the six bit memory shift register 1505.

In addition, the sample command 1050 activates a two bit down count 1542 (FIG. 15) which is indicative of the suspected occurrence of recent long runs.

An all zero output from status monitor 1505 signifies that no relevant alert was recorded during at least the six last samplings.

R3 output 1810 from shift register 1300 typically comprises a 3 bit random value, operative, typically, to activate an external optional random source, typically the digital to analog converter 1905 of FIG. 21A, thereby to force the chaos generator of FIG. 21A into a new metastable state.

The preferred embodiment of FIG. 10 enables compliance with FIPS 140-2 and ETSI CLK specifications.

The ETSI CLK specification states that no uncorrelated clock is to be operative on a compliant communicating radio frequency communicating device. Typically, compliance can be achieved by initially operating the random number generator 1000 in dual clock mode, typically for 1.5 seconds, thereby forcing the generator 1000 into a random unpredictable random state prior to switching to the single clock mode preparatory to entering broadcast mode.

Statistical balance of ones and zeroes, and acceptable lengths of runs of lengths of same symbols, and acceptable distribution of the 16 4 bit symbols (nibble) is assured, by the laws of large numbers, emanating from pseudo-random sequences, as prescribed by the FIPS 140-2 specification of May 2001. Long runs do not occur due to operation of FIPS 140-2 filters 1405 and 1415, using NOR and NAND gate type run detection detailed in FIGS. 1A–3B. The status monitor 1505 facilitates detection of most cases of consecutive same value samples. For high level assurance of no "same consecutive sampled value", the host 1002 typically checks (compares) each "last pair" of 24 bit consecutive random string samples which the Host 1002 has read. Host input port from random number generator 1070 of FIG. 10, to ascertain that the outputs are not identical, prior to concatenating the 24 bit last sampled strings into a larger string. If the two consecutive 24 bit sampled strings are identical, the Host will not use the last string. In such cases the Host 1002 will typically check for clock malfunctions.

FIG. 11 is a simplified block diagram of the control unit 1100 of FIG. 10. The control unit 1100 is preferably operative similarly to the control unit 1150, which regulates shift register 1300, except for different random input (1201 and 1301) in shift register 1200, and a different set of feedbacks in 1004 of control unit 1100 and the 5 bit LFSR 1004 (FIG. 11) in control unit 1150. In another preferred embodiment, not shown, the 5 bit LFSR 1004 in control unit 1150, is replaced by a 7 bit LFSR.

Inputs to both control units 1100 and 1150 are typically identical, with the exception of the 3 bit random delay values: R2 value 301 from nLFSR 1150 goes into control unit 1100, and R1 value 1201, from control unit 1100, goes into control unit 1150. Also, the random delay values from nLFSR 1200 are fed into control unit 1100.

Preferred circuitry for the multiplexer and clock synchronizer 1008 of FIG. 11, is detailed in FIG. 16. FIG. 17 is a timing diagram of the relevant logic symbols in FIG. 17. The Multiplexer 1008 selects which of the two clocks is the presently implemented clock for determining the intervals between swap toggling and between slip pulses.

Referring now to FIG. 14, swap toggling signals, regulating which of the two feedback sequences are chosen, are transmitted on lines 1101, input to the 15 bit nLFSRs 1200 and 1300 respectively.

The output of the Multiplexer and Clock Synchronizer 1008, is a stream of pulses, synchronized to the primary clock 1040. When the apparatus of FIG. 10 is operating in single clock mode these signals replicate the primary clock 1040. When the apparatus of FIG. 10 is operating in dual clock mode, uncorrelated clock pulses appear, randomly, but always go from zero to one, and return to zero, synchronized to a lone pulse from the primary clock's pulsing oscillator output on line 1040, illustrated in timing signal L of FIG. 17.

The 5 bit LFSR 1004 of FIG. 11 preferably emits a binary pseudo-random cyclic sequence as per the 5th column of sequence table 575 of FIG. 3B. Resetting the LFSR 1004 to binary 11111 starts the sequence table at index 20 of sequence 577. When set to all ones, the output bits are complemented by output inverter 1021, such that the first 5 bits emanating from output inverter 1021 after a reset are all zeroes.

Random Binary counter 1006 divides the clock pulses switched via MUX 1008 by (16+[R2]) where [R2]=the instantaneous value transmitted on 3-bit R2 bus 1301). The R2 bus 1301 preferably comprises a three output bus of flip-flops 13, 14, and 15 of nLFSR 1300 (FIG. 10). After every (16+[R2]) pulses, 3-bit counter 1006 emits a pulse synchronized to the primary clock 1040, which toggles flip-flop 1003 to swap feedbacks. Simultaneously, signal 1002 enables AND gate 1024 to emit a random slip pulse on line 1102. If the output of inverter 1021 XORed to the logic signal 1010 from the optional random source, is a one, a single "one pulse" is transmitted on line 1022.

The Random Slip Pulse events typically occur in an average of one half of the occurrences of the random swap changes, but without an observable inherent pattern. Counter 1006 emits a half-cycle period one, synchronized to a complementary primary clock pulse, on the average of once every 20 pulses emitting from the multiplexer 1008. The random slips typically occur on line 1102 randomly, on an average of approximately once every 40 uncorrelated clock pulses.

Figure 12:
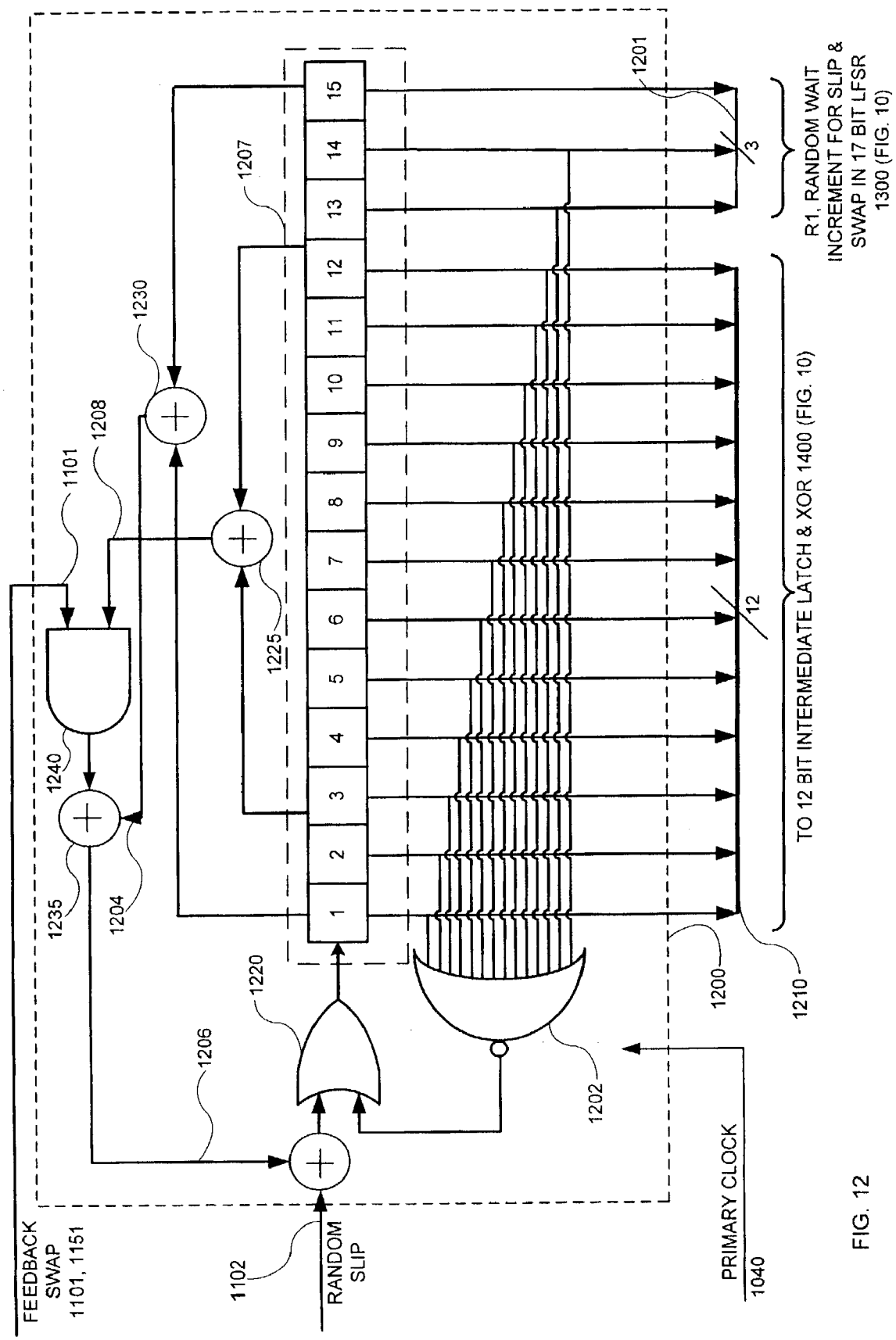
FIG. 12 is a simplified electronic block diagram of the 15 bit non-linear feedback pseudo random number shift register 1200 of FIG. 10, constructed and operative in accordance with a preferred embodiment of the present invention.

FIG. 12 is a simplified electronic block diagram of the 15 bit non-linear feedback pseudo random number shift register 1200 of FIG. 10, constructed and operative in accordance with a preferred embodiment of the present invention, with two alternative feedback configurations: a random slip input and a "no-stuck-on-zero" NOR circuit. At every primary clock cycle transmitted on line 1040 to all D-type flip-flops of the shift register 1207, the register is activated to output a new random 12 bit binary word. Also transmitted, on R1 bus 1201, is a 3 bit internally used random wait signal for the control unit 1150 of the 17-bit shift register 1300 of FIGS. 10 and 13.

Figure 31:
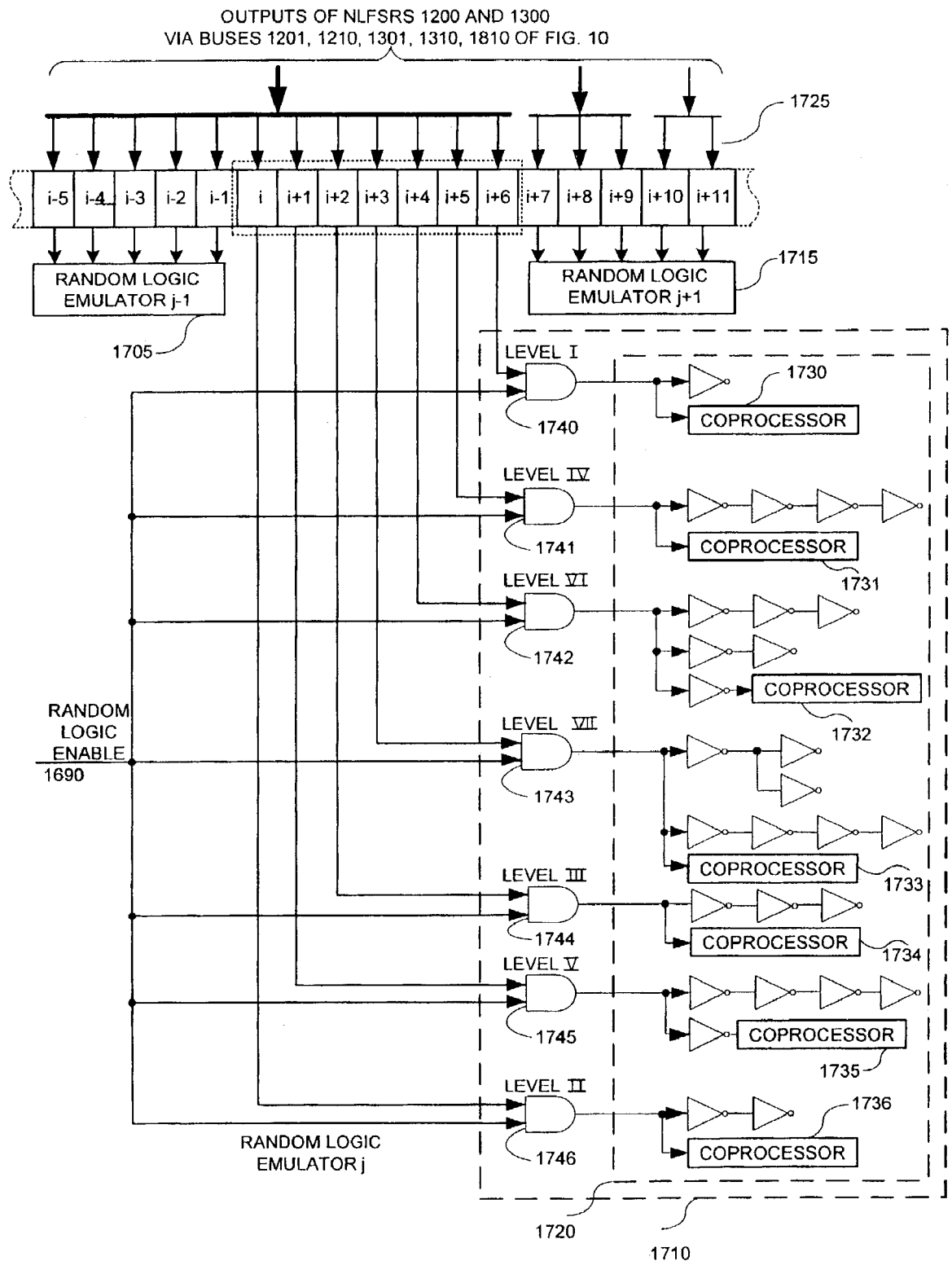
FIG. 31 is a simplified electronic block diagram illustration of an optional random number coprocessor interface and of a random logic current consumption emulation device which may interface with output busses 1725 of FIG. 10, the device being operative to receive binary signals from a constantly changing binary sequence, to output random binary strings to coprocessor hash function and to emulate logic function current consumption.
Figure 32:
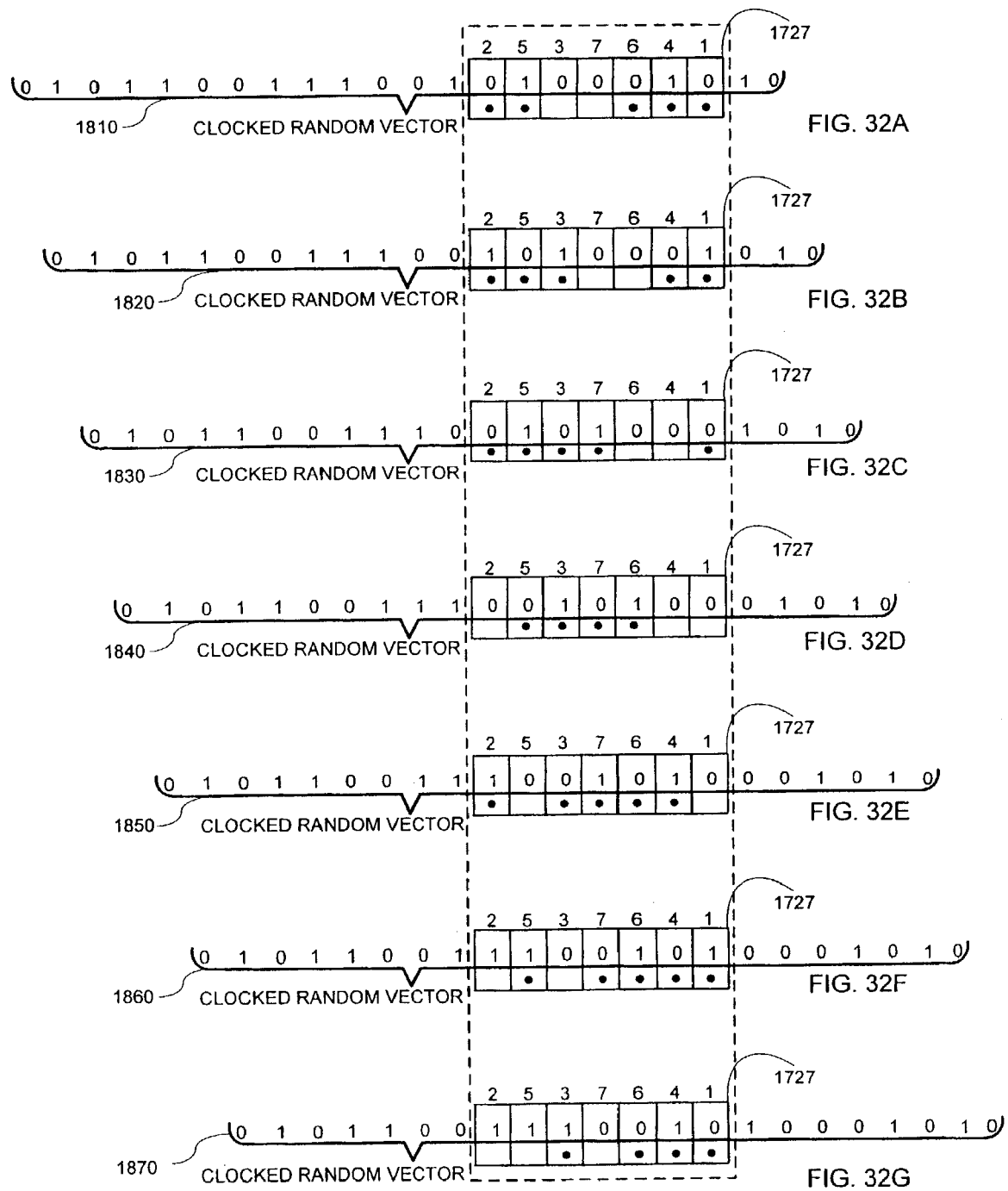
FIG. 32A is a simplified diagram of example contents of random logic current emulator 1720 after a clock cycle i.
FIG. 32B is a simplified diagram of example contents of random logic current emulator 1720 after a clock cycle ii.
FIG. 32C is a simplified diagram of example contents of random logic current emulator 1720 after a clock cycle iii.
FIG. 32D is a simplified diagram of example contents of random logic current emulator 1720 after a clock cycle iv.
FIG. 32E is a simplified diagram of example contents of random logic current emulator 1720 after a clock cycle v.
FIG. 32F is a simplified diagram of example contents of random logic current emulator 1720 after a clock cycle vi.
FIG. 32G is a simplified diagram of example contents of random logic current emulator 1720 after a clock cycle vii.

The 15 bit shift register 1207 outputs the 12 bit random strings on bus 1210. These strings are output to 12 bit Intermediate Latch & XOR 1400 (FIG. 10). 3 bits are output on R1 bus 1201, to randomize the output of control unit 1150 (FIG. 10). All 15 bits are also output to the optional interface 1725 of FIG. 10 and to the random number coprocessor interface 7000 of FIG. 33, and to an optional current consumption emulator (FIG. 31).

Feedback swap inputs on line 1101 are operative to activate two different feedback configurations. Logic one on line 1101 enables AND gate 1240 to receive outputs of XOR gate 1225, to be XORed with the output of XOR gate 1230. Gate 1235 XORs the outputs of the AND gate 1240 and of gate 1225, on line 1206. The LFSR feedback output 1206 may be complemented by a logic 1 random slip pulse on line 1102, subsequently fed back through OR gate 1220 into the input of the most significant flip-flop, FF1, of shift register 1207. A Swap signal 1 on line 1101 enables exclusive ORing of the output of flip-flops 1, 3, 12 and 15. When a feedback swap signal of logic zero is active on line 1101, only flip-flops 1 and 15 are exclusive ORed on the 1206 feedback loop.

NOR gate 1202 is operative to prevent the "stuck on zero" syndrome on power-up. NOR gate 1202 is also subsequently operative to assure that a random slip pulse on line 1102, at an instant when the most significant 14 flip-flops are set to zero output, does not force the nLFSR of FIG. 12 into a "stuck on zero syndrome".

The FIPS 140-2 filter 1405 of FIG. 14 is operative to prevent long runs on the processed outputs of 1210.

Figure 13:
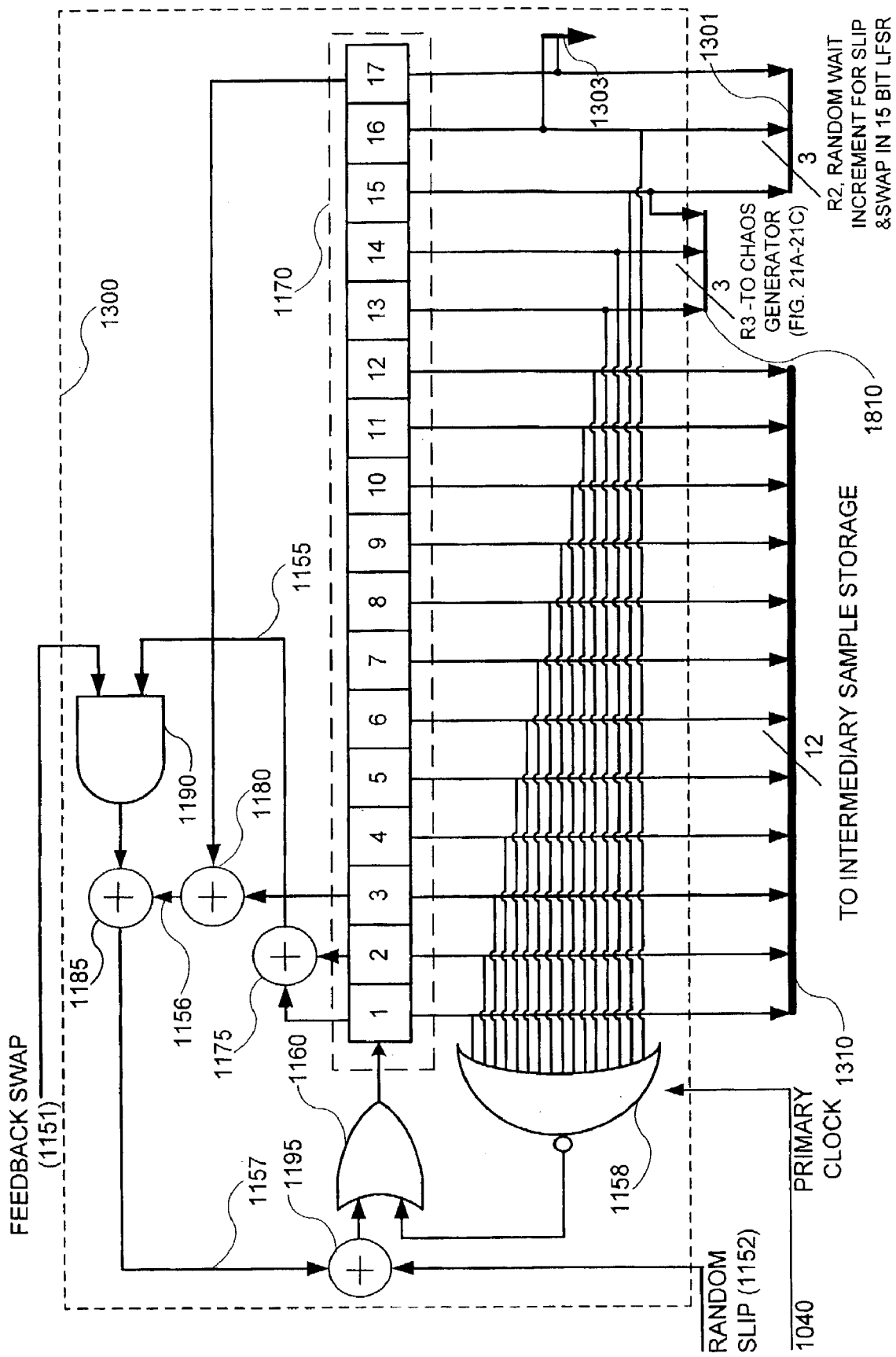
FIG. 13 is a simplified electronic block diagram of the 17 bit non-linear feedback pseudo random number shift register 1300 of FIG. 10, constructed and operative in accordance with a preferred embodiment of the present invention, with two alternative feedback configurations, a random slip input and a no-stuck-on-zero NOR circuit, the 17 bit shift register 1300 being operative to output a 12 bit binary word, and a 3 bit internally used random wait signal for the control unit 1100 of the 15-bit shift register 1200 of FIG. 10.

FIG. 13 is a simplified electronic block diagram of the 17 bit non-linear feedback pseudo random number shift register 1300 of FIG. 10, constructed and operative in accordance with a preferred embodiment of the present invention, with two alternative feedback configurations, controlled by swap input on line 1151, i.e., taps from FFs 3 and 17 or alternatively from FFs 1, 2, 3 and 17, and a random slip input on line 1152 and a "no-stuck-on-zero" NOR circuit, gate 1158. At every primary clock cycle transmitted on line 1040 to all flip-flops of the shift register 1170, the register 1170 is activated to output: (a) a new random 12 bit binary word, (b) on R2 bus 1301, a 3 bit internally used random wait signal for the control unit 1100 of FIG. 10; and (c) a 3-bit output on R3 bus 1810, to the optional chaos generator of FIGS. 21A, 21B and 21C.

The 17 bit shift register 1170 outputs (a) the 12 bit random strings, via bus 1310, to the 12 bit Intermediate Latch & XOR 1400 (FIG. 10); (b) 3 bits via R2 bus 1301, to randomize the output of control unit 1150 (FIG. 10), and (c) 3-bit R3 output bus 1810, output to the optional chaos generator of FIGS. 21A–21C. All 17 bits are also output to the optional interface 1725 (FIG. 31), to the random number coprocessor interface, to the multiplexer 7020 (FIG. 33), and to an optional current consumption emulator, FIG. 31.

Feedback swap inputs on line 1151 are preferably operative to activate two different feedback configurations of the apparatus of FIG. 13. Logic one on line 1151 preferably enables AND gate 1190 to receive output of XOR gate 1175 for XORing with the output of XOR gate 180. Gate 185 XORs the outputs of gates 1175 and 1190 onto line 1157. The LFSR feedback output 1157 may be complemented by a random slip pulse on line 1152, subsequently fed back through OR gate 1160 into the input of the most significant flip-flop, FF1, of shift register 1170. A Swap signal 1 on line 1151 enables exclusive ORing of the output of flip-flops 1, 2, 3 and 17. When a feedback swap signal of logic zero is active on line 1151, only flip-flops 3 and 17 are exclusive ORed on the feedback loop generated by LFSR feedback output 1157.

NOR gate 1158 is operative both to prevent the "stuck on zero" syndrome on power-up and also, subsequently, to assure that a random slip pulse on line 1152, at an instant when the most significant 16 flip-flops are set to zero output, does not force the nLFSR 1300 into a "stuck on zero" syndrome.

The FIPS 140-2 filter of FIG. 14 is operative to prevent long runs in the processed outputs of 1310.

FIG. 14 is a simplified block diagram illustration of the following elements of FIG. 10: (a) 12 bit intermediate latch and XOR mechanism 1400, (b) FIPS 140-2 long string single symbol fix filter and long run alert section 1405, and (c) output latch 1510. As described above, output latch 1510 is a section of the output interface 1500 to the host 1002. Output latch 1510 is operative to process and store the 12-bit output bits arriving via bus 1210 from the 15 bit nLFSR 1200 of FIGS. 10 and 12.

The 12 bit Intermediate Latch & XOR 1410 (FIG. 10) is preferably identical in function and design to the Intermediate device 1400 in FIG. 10. Latch/XOR 1410 is operative to receive binary strings from the data output of the 17 bit nLFSR 1300 on bus 1310, and to output processed binary strings to latch 1520 in the output port 1500. The FIPS 140-2 filter 1415 is preferably identical to filter 1405, and is operative to output the warning signal U17 on line 1416.

The internal sample command 1418 of FIG. 10 is operative (a) to activate latches of the present instantaneous output of the nLFSR 1210, into the bank of data flip flops 1445 (FIG. 14); (b) to simultaneously XOR the same data with the output of the data from flip-flops 1445 (which comprises was the previously sampled data from nLFSR 1210); (c) to filter the same 12 bit XORed data through FIPS 140-2 filter 1405; and (d) to latch the filtered data into the data section 1510 of the output port 1500. The Read command 1060 (FIG. 10) enables the 32 bit data output concatenation 1070; the concatenation comprising the contents of the 8 bit status monitor 1505 and of Latches 1510 and 1520 (FIG. 10).

Logic filters 1405 and 1415 are operative to alert the Host 1002 of a possible occurrence of long runs, and to compensate with a complementary one or zero on line 1421 (FIG. 14) to avert a long run.

The longest run of ones or zeroes in Latch 1510 or Latch 1520, is of length eleven, as in each string there is always at least a single one or a single zero. Therefore, a concatenation of any two such filtered and word-wise XORed nLFSR outputs from latches 1510 and 1520 can produce a long run of no more than 22 consecutive ones or zeroes.

Alert events where U15 equals one typically occur with a frequency of, on the average, about 4 out of 4096 samplings. In the event that the output of NOR gate 1425 comprises a "suspect all zero warning" logic, one, and the output of NAND gate 1430 is a "non-suspect" output, one, then XOR gate 1426 outputs a zero on line 1420, and the output after inversion on NOT gate 1429 into U15, line 1406 is a warning alert, one. Such an all zero on NOR gate 1425 forces a one via OR gate 1428 to line 1421, into cell 5 in the output segment 1510. When all ones are input to NAND gate 1430, a "suspect long run" output of logic zero emanates from NAND gate 1430, and a second logic zero from NOR gate 1425 is input into XOR gate 1426, to output a zero on line 1420. This forces a zero output from OR gate 1428 on line 1421 which compensates, in cell 5 of Latch 1510, for a suspect long run of ones, regardless of the signal on line 1446.

An all zero output from flip-flops 1445 after the XOR sampling process typically occurs if the two last samplings are identical. U15 signal 1406 from the 15 bit filter 1415 and U17 signal 1416, from the 17-bit nLFSR filter 1415 both alert the Host 1002's sampling procedure via the 8 bit Status Monitor output 1505 of such and other long run events. Typically, this may be the result of a non-operating clock, or other fault, or the natural, occasional occurrence of two same value samples happening in consecutive samplings.

In each of the following cases the filters 1405 and 1415 are activated on the binary outputs 1210 and 1310 of the intermediate buffers 1200 and 1300:

a) binary output 0000 0000 0000 is changed to 0000 1000 0000, by filter 1405;

b) binary output 1111 1111 1111 is changed to 1111 0111 1111, by filter 1405;

c) binary output 0000 1000 0000 is not changed by filter 1405; and d) binary output 1111 0111 1111 is not changed by filter 1405.

Any of the four outputs activate a warning alert on U15 or U17, on lines 1406 or 1407, respectively. The long runs in cases a) and b) are purged. The number of possible output strings to section 1510 of bus 1500 is thereby reduced from 4096 to 4094. Cases a) and c), and cases b) and d) each produce identical outputs, thereby slightly reducing entropy.

A sampling regime can typically compensate for this reduction of entropy by discarding alternate suspect long run output strings.

All other binary outputs from 1210 and 1310 do not activate the FIPS 140-2 filter 1405 or 1415 and are not changed, as the output of XOR gate 1426 (FIG. 14) is a one, enabling AND gate 1427 to transmit the symbol from line 1446 to cell 5 of Latch 1510. The results of cases (a)–(d) above, and other data from outputs 1210 and 1310, are input into the 12 bit buffers 1510 and 1520.

It is appreciated that the apparatus of FIGS. 10 and 14 are a specific example of a random number generator with internal XOR masking functionality. Provision of the status monitor 1505, resampling unit 1580, and filters 1405 and 1415 is optional and all indications of bit lengths are merely by way of example. The apparatus of FIGS. 10 and 14 is shown to include, by way of example, nLFSRs 1200 and 1300. It is appreciated that random number generators with internal XOR masking functionality need not have the specific internal structure shown in FIGS. 10 and 14 and in particular need not have the specific number of, and arrangement of nLFSRs shown. Random number generators with internal XOR masking functionality may be provided with any other suitable number of, or arrangement of, nLFSRs, and/or any suitable number of and arrangement of oscillators and/or any suitable number of and arrangement of chaos generators.

FIG. 15 is a simplified functional block diagram illustration of a preferred implementation of the status generator and latch 1505 of FIG. 10. Status generator and latch 1505 is operative to (a) receive long run warning signals from the two intermediate XORing latches 1400 and 1410 generated by FIPS 140-2 filters 1405 and 1415; (b) to output these long run signals from the last three samplings, and (c) to activate a new sampling, in the event that both intermediate latches 1400 and 1410 activate a warning. This simplifies compliance to the FIPS 140-2 standard while averting unnecessary reduction of entropy.

The inputs into the status register 1505, FIG. 15, typically include: the Host sample command on line 1050 to (a) cause the input of the last long run alert signals, on line 1406, (U15) and on line 1416, (U17) into flip-flops 1536 and 1539, respectively, (b) to shift the previous contents of flip-flop 1536 to flip-flop 1537, of flip-flop 1539 to flip-flop 1540, of flip-flop 1537 to flip-flop 1538 and flip-flop 1540 to flip-flop 1541; (c) to simultaneously record the down count output of 1550 via inverters 1552 into the 2 bit register 1542; and (d) to simultaneously either reset the 2 bit "wait at 3 counter" 1550, in the event that the outputs of both flip-flop 1538 and flip-flop 1541 are ones, or (d) to activate the up counter, 5092, incrementally up to binary 11 (=$3_{10}$), in the event that the "Q" outputs, of flip-flops 1538 and 1541 are not both ones.

After each sampling, the Host controller, 1002, (FIG. 10) can read the output of the 8 bit status register 1505 on the most significant segment of bus 1071. An all zero output byte, typically the normal default reading, signifies that none of the last six samplings of either 12 bit XOR outputs from filters 1405 or 1415 was suspect. An all zero output also signifies that the random generator 1000 is operating properly, and that two adjacent random string samples commanded by the Host on line 1050 were not identical. A reading of zeroes from both flip-flops 1543 an 1544 of down-counter output 1542 (FIG. 15), signifies that there has been no double alert wherein both FIPS 140-2 filters 1405 and 1415, output ones, for at least the last six samplings. A reading of more than zero from down-counter 1542 (FIG. 15) can be correlated to the output of the 3 left hand pairs of the 8-bit status monitor 1505, to ascertain which last recent sampling or samplings generated a double alert, i.e., U15=U17=1. A reading of three consecutive ones from either U15 or U17, typically may signify a "stuck on" value of nLFSRs 1200 or 1300.

In the event that U15 and U17 are both ones (double warn alerts) a one-time wait and resample trigger 1580 typically automatically triggers a resample signal on line 1417, typically after five clock delays on primary clock input 1040. An internal sample command is output on line 1418, typically relayed by OR gate 1419 following a Host command on line 1050 or an internally generated command on line 1417.

The following example illustrates how up to five consecutive (one clock after another) samplings of a specific equiprobable all one output from nLFSR 1300, may force five consecutive single alerts on U17, (U17=1), and output the same word, 0000 1000 0000, at each clock, after filtering by FIPS 140-2 filter 1415.

In the following examples, brackets surround the contents of the 17 flip-flops of nLFSR 1300 (FIG. 10) as a stream of 17 one bits progresses through the virtual 17 bit nLFSR. Only the 12 right hand bits are output, so that the bits which are not read are irrelevant to the explanation. x's signify the "don't care" irrelevant bits. The underlined bits within the brackets are those that are XORed to a previous sampling (at each clock in examples 1 to 6, twelve ones) and are stored in the intermediate flip-flops in array 1445 (FIG. 14). As shown previously, any XORed combination of two strings included in the set of acceptable strings, from zero to (2^12–1), i.e., any combination of ones and zeroes, results in another acceptable string, as the twelve bit outputs 1210 and 1310 include strings of all zeroes and all ones.

The first line of each of the following seven cases (1)–(7) shows how a long run of ones is sampled into the 12 bit intermediate latch. The second line of each case shows the final output into the random number latch, 1520 of the output port 1500 (FIG. 10) after XORing to the previous sampled output, and after modification by the FIPS 140-2 filter processor, 1415:

1) xxx01 1111[111111111111 0xxx x]xxxx 0000 0000 0001 and U17=0,
2) xxxx0 1111[111111111111 1 0xxx]xxxxx 0000 1000 0000 and U17=1,
3) xxxxx0 111[111111111111 11 0xx]x xxxxx 0000 1000 0000 and U17=1,
4) xxxxxx0 11[111111111111 111 0x]xx xxxxx 0000 1000 0000 and U17=1,
5) xxxxxxx0 1 [111111111111 1111 0]xxx xxxxx 0000 1000 0000 and U17=1,
6) xxxxxxxx0[111111111111 1 1111]0xxx xxxxx 0000 1000 0000 and U17=1,
7) xxxxxxxxx [011111111111 1 1111]10oxxx xxxxx 1000 0000 0000 and U17=0.

For six consecutive clocked nLFSR shifts there are six consecutive twelve bit sequence of all ones. Five of these (cases 2–6 above), which, when XORed with a previous sampling, produce, before filtering, an all zero output from 12 bit bus 1310. The same five cases produce, after filtering, an output of zeroes with a single one; and a warning signal, U17=1. At stage 6, if on line 1152 a random slip pulse is XORed to the feedback of zero on line 1157 of FIG. 13, this generates a worst case long run of 18 all one bits. This means that an additional wait for proper resample is necessary, to ascertain that the long run has subsided.

Examples of other acceptable "un-stuck" repetitive nibble sequences which typically output consecutive XORed values of zeroes are: 1010 . . . ; 1100; and 1100.

Under typical operating conditions, where the Host 1002 typically is not capable of sampling the random number generator 1000 at every clock cycle such a sequences is statistically very rare. Other combinations typically may occur on an average of less than once every ((2^12)^2)× 2^4=2^28 samplings. These rare sequences typically can be averted, if the host controller ascertains that the right hand bits of output port latches 1520 and 1510 are occasionally toggled.

When sampling very long sequences, to maintain an optimal balance of ones and zeroes, and an optimal histogram of 4 bit nibbles, it is typically statistically advisable to disregard one half of the sampled values, wherein either U15 or U17 is equal to 1. In each of these cases, two equiprobable inputs, one modified and one unmodified, may contribute to the same output.

Figure 33:
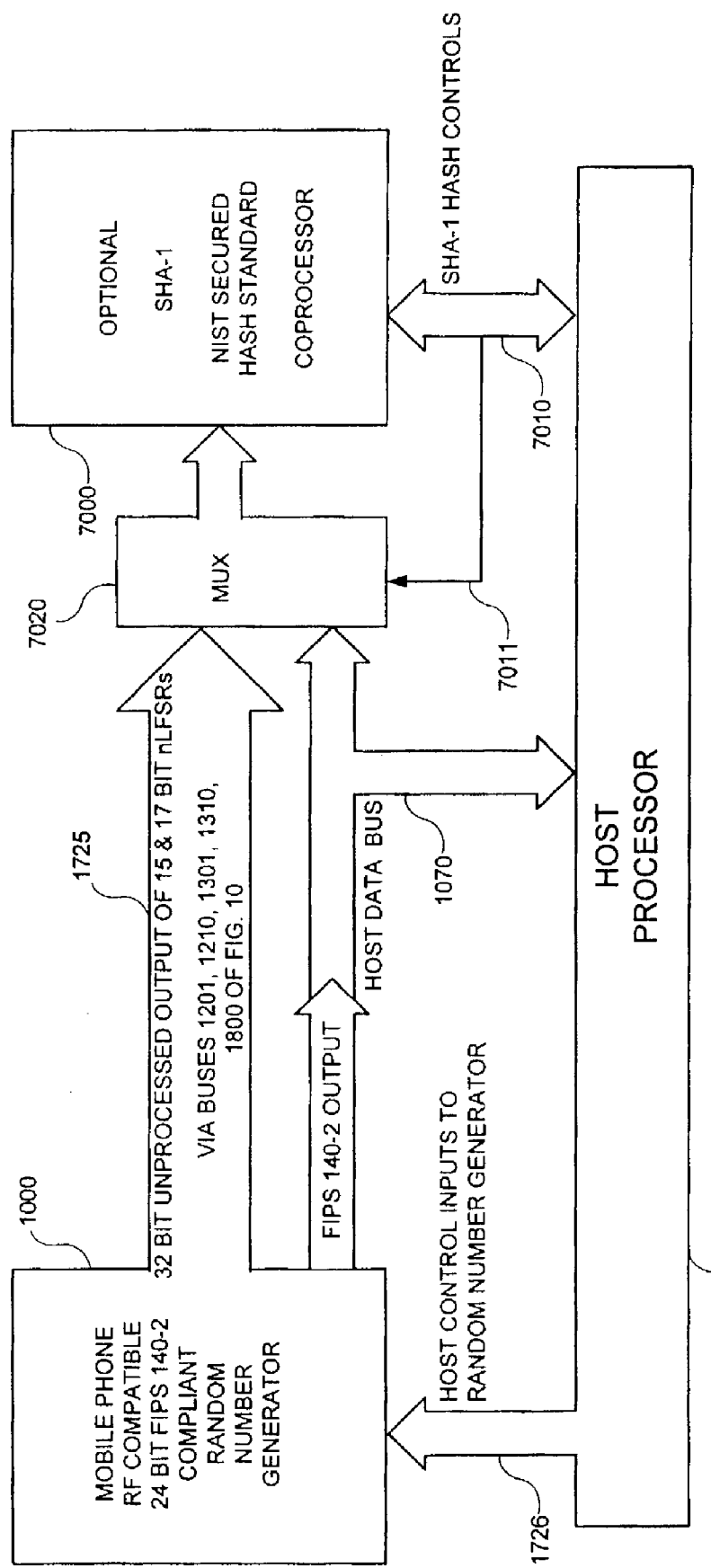
FIG. 33 is a simplified block diagram of a preferred embodiment of a random number generating device, which includes RNG 1000 and host 1002 of FIG. 10 and a Secured Hash Standard Coprocessor, operative to receive the output of unprocessed sequences from the two nLFSRs of FIG. 10 operative to compress said data into a 160 bit random strings.

An adversary may gather valuable information by probing the fluctuations of power consumption of a microelectronic device performing a confidential process, e.g., the workings of a gaming machine or the electronic signing of a document or a credit card transaction, with a secret key. Typically such adversarial probing may be masked with either random noise or by operating two such confidential processes, concurrently within range of one another. Masking such a confidential process with a noise emulator generating additive current or voltage fluctuations, resembling the normal confidential process noise, deters such adversarial probing. Outputting the 32 bit output of the 2 nLFSRs, as in bus 1725 of FIG. 10 and FIG. 33 directly into a hash module, as in FIG. 33, is a method to add entropy to the output of the random generator. This method concurrently autonomously radiates signal without utilizing computational resources.

FIG. 16 is a simplified electronic block diagram of a preferred embodiment of the multiplexer and clock synchronizer 1008 of FIG. 11. The synchronizer 1008 is operative in a dual clock mode to accept random pulses at a frequency typically lower than the frequency of the primary clock, and to output signals synchronized to the inverted primary clock signals, where a logic one appears in the second half of the clock period. All random pulses are typically synchronized to rise from logic zero to logic one at the precise half-cycle instant that the inverted primary clock rises from logic zero to logic one. In a preferred embodiment, not shown, the synchronizing circuit 1008 of FIG. 16 is connected directly to the source of slow uncorrelated random clock bits on line 1030, thereby outputting typically shorter random pulses, wherein each pulse is synchronized to the inverted primary clock. In this preferred embodiment, the same synchronizing circuit, set in dual clock mode, is implemented on the output of the clock divider 1006 of FIG. 11. This enables the AND gate 1024 to emit single pulse random slips.

In the preferred timing diagram of FIG. 17, arbitrary input signals A–M are shown to illustrate the function of the clock synchronizing device of FIG. 16 in the two modes of operation (single clock and dual clock). In the single clock mode the output may be the inverse of the primary clock. In the dual clock mode, the output may be random pulses synchronized to the inverted primary clock signals.

The three inputs into the synchronizing device of FIG. 16 are:
1) the clock mode control, Single Clock/Dual Clock Mode on line 1080, (signal C in FIG. 17);
2) the primary clock, on line 1040, as received from the Host controller bus 1726 (signal A in FIG. 17)
3) an uncorrelated slower clock, on line 1030, typically output by an autonomous oscillator, with varying frequency (signal B in FIG. 17).

The output of the clock synchronizer of FIG. 16 on line 1023 is a pulse synchronized to the inverted primary clock pulse, which follows the trigger signal preceding the first rising primary clock pulse, on line 1023, in FIG. 11 (signal L in FIG. 17).

The pulse shaper of this circuit 5092 preferably comprises two triggers. Trigger F in FIG. 17 is output by NAND gate 5072, when inputs B and D are one and is operative to set SR Latch 5070 (forcing a 1 output on Q to OR gate 5074). Trigger E in FIG. 17 is output by NAND gate 5086, for the very brief interval when inputs H and M are one, and is operative to reset SR Latch 5070.

The two trigger outputs E and F in FIG. 16 are identical. Each circuit generates a short, typically no more than 2 nanosecond negative pulse when an incoming signal rises from logic zero to logic one, i.e., when either the uncorrelated slower clock signal B on line 1030 rises from zero to one, or the output of flip-flop 5075's Q output rises from zero to one logic the outputs F or E, respectively fall to zero logic for typically 1 nanosecond. The "nano" delay signals from elements 5076 and 5078 are inverted by NOT gates designated 5082, such that signals D and M are the delayed complements of B and H.

The only instant in which both the delayed outputs on D and M and the un-delayed inputs on B and H are logic one, occurs when signals B and H both rise from zero to one. At such instants, and typically only at such instants, signals E and F are forced to logic zero. At such instants F causes SR Latch, 5070 to output one, i.e., sets SR Latch 5070 to set Q output equal to logic one. Similarly, at such an instant, H and M drive NAND gate 5086 to emit a negative pulse, thereby causing SR Latch 5070 to reset, forcing a zero logic output on Q of SR latch 5070. The trigger delays which cause negative activating pulses on E and F are marked by the word "TRIGGER" and by arrowheads. The negative pulses signals E and F in FIG. 17 are marked with a half arrow on a black vertical mark.

Dual Clock Mode activation of the uncorrelated clock pulse synchronization to the primary clock 1040 is operative when the clock mode symbol on line 1080, C in FIG. 17, is zero logic. In dual clock mode, the output of OR gate 5074 (G on FIG. 17) is sampled by the rising clock of flip-flop 5075, which in dual clock mode is only activated by the SR Latch 5070. After the SR Latch 1070 is set to one, G rises from zero to logic one, until H rises from zero to one. This can only occur when the primary clock 1040 rises to one, thereby resetting SR latch reverting signal G to zero. Meanwhile, signal H remains at logic one, to activate T-flip-flop, 5080, only on the "half-cycle clock", as seen on J in FIG. 17.

The previous sequence shows that a random signal on B causes a set of SR Latch 5070. This causes a toggle of T-flip-flop 5080 on the half-cycle clock of the primary clock 1040. SR latch 5070 is reset on the previous "half-cycle clock", and is ready to accept a new pulse on B. J has been toggled, with the result that J and K are complementary, for the second half of the primary clock cycle, enabling a one on the second half of the primary clock cycle. It is irrelevant if the output J is toggled to a one or to a zero.

The entire sequence in dual clock mode is preferably repeated, whenever the signal on B rises from logic zero to logic one.

The Single Clock Mode is enabled with a logic one on C, making any input from SR latch 5070 irrelevant. Typically, the host controller, 1002 disables the uncorrelated slower clock 1030 when the random number generator of FIG. 10 is in Single clock mode.

When G rises from zero to a stable logic one; e.g., when the clock mode signal on line 1080 rises to one, this sets the device 1008 into single clock mode. The output H from flip flop 5075 rises to one at the first rising primary clock signal, forcing H to a stable logic one. A stable one on H enables flip-flop 5080 to toggle at every half-cycle primary clock signal. At every toggle on J at the half cycle, a one appears on L for a half cycle, thereby emulating the inverse primary clock.

Figure 18:
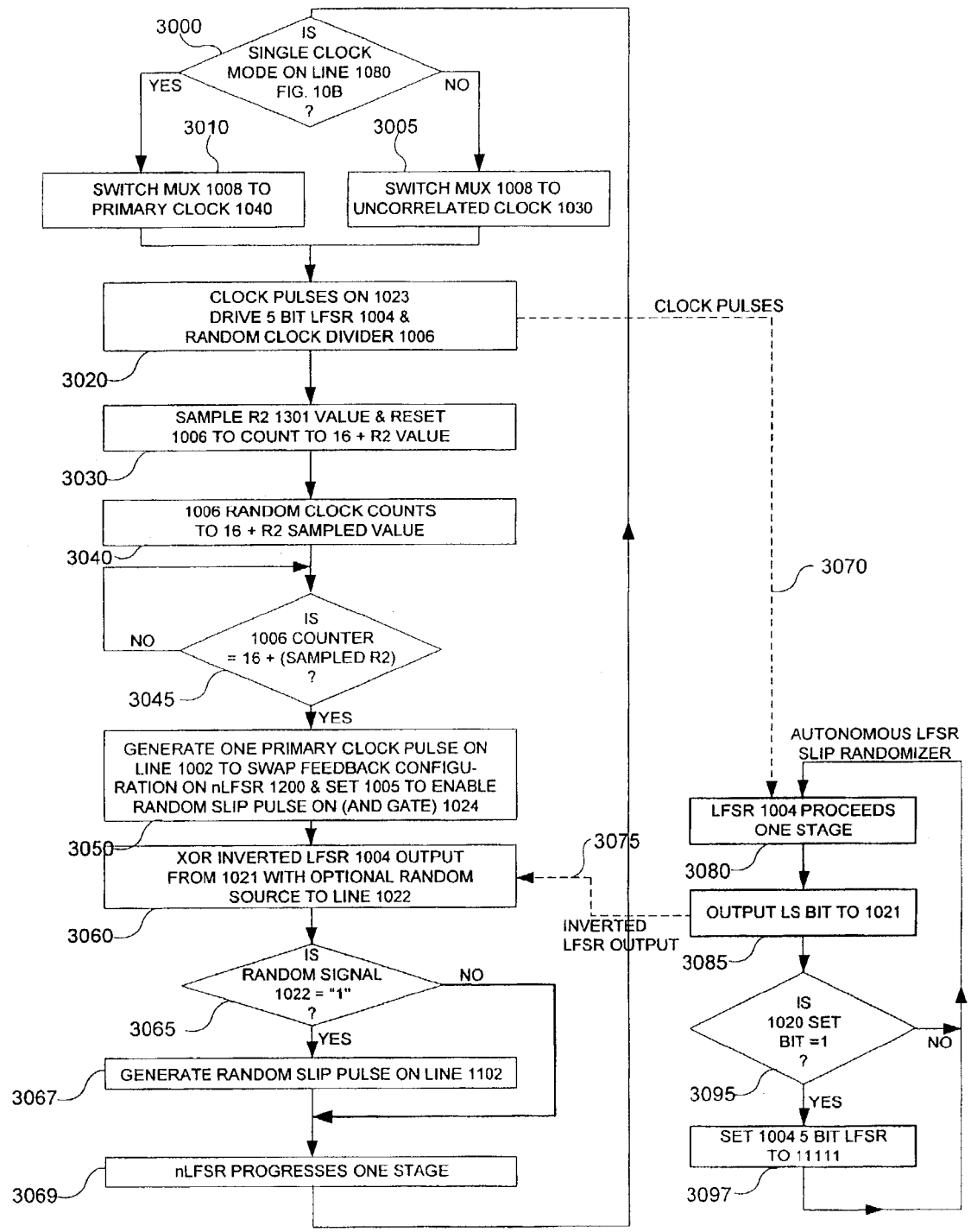
FIG. 18 is a simplified self-explanatory flowchart illustration of a preferred method of operation for the control apparatus of FIG. 11.

FIG. 18 is a simplified self-explanatory flowchart illustration of a preferred method of operation for the control apparatus of FIG. 11.

Figure 19:
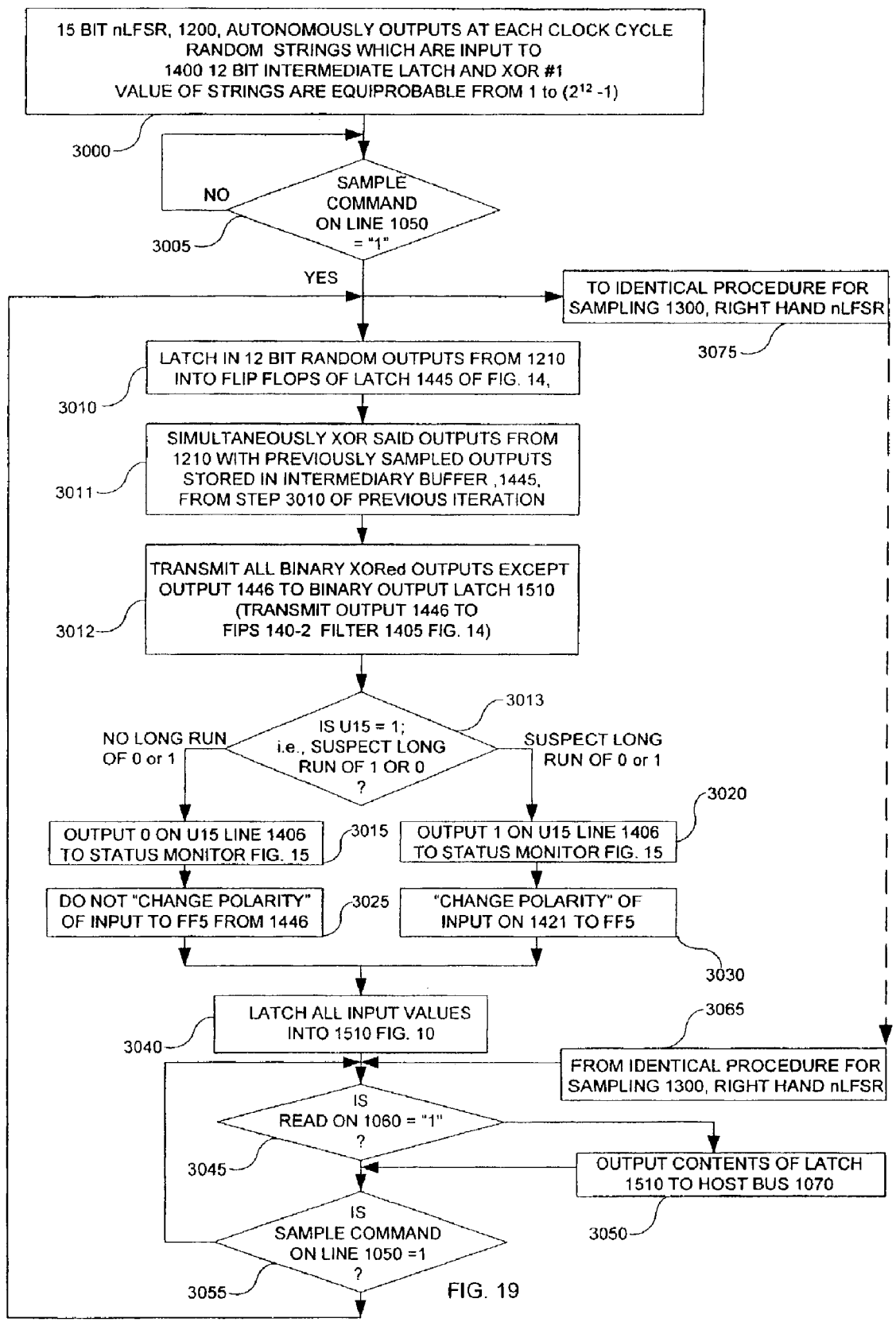
FIG. 19 is a simplified self-explanatory flowchart illustration of a preferred method of operation for the apparatus of FIG. 14.

FIG. 19 is a simplified self-explanatory flowchart illustration of a preferred method of operation for the apparatus of FIG. 14.

Figure 20:
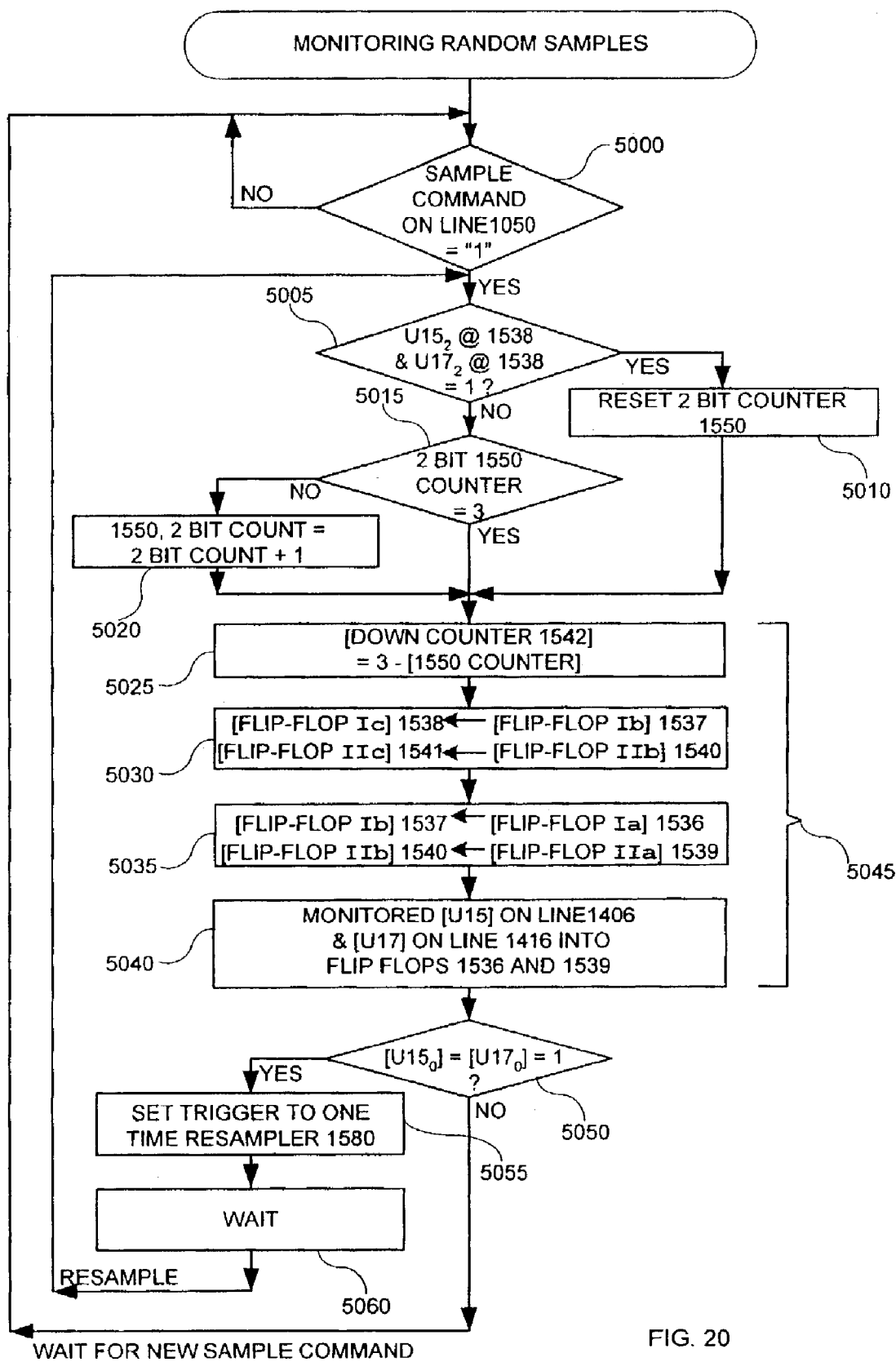
FIG. 20 is a simplified self-explanatory flowchart illustration of a preferred method of operation for the apparatus of FIG. 15.

FIG. 20 is a simplified self-explanatory flowchart illustration of a preferred method of operation for the apparatus of FIG. 15. The method of FIG. 20 is operative to monitor and audit the 24 bit random binary string output of FIG. 10 from Latches 1510 and 1520.

FIG. 21A is a simplified functional block diagram of an electronic circuit constructed and operative in accordance with a preferred embodiment of the present invention which is operative to generate a "metastable chaotic tent function". This function is operative to output a chaotic binary symbol once every four primary clock cycles, thereby to generate a sequence of chaotic binary symbols. In this sequence, one symbol out of sixteen is a function of a "random kick" generated by a three symbol sampling of the 17-bit nLFSR 1300 (FIG. 10).

The chaotic function generator 1900 of FIG. 21A has two inputs:

1) The primary clock from the Host 1002 of FIG. 10 on line 1040; and, 2) 3 bits of random temporal output, R3, on bus 1810, from the 17-Bit nLFSR 1300 of FIGS. 10 and 13, from three right hand binary bits from flip-flops FF13, FF14 and FF15.

The single binary output 1010 is an optional operative random input to the control units 1100 and 1150 of nLFSRs 1200 and 1300, respectively. The output of the metastable chaotic tent function generating circuit of FIG. 21A typically comprises a binary stream, on line 1010. Binary stream 1010 typically serves as an additional optional source of randomness for the random slip and random swap functions of both nLFSRs 1200 and 1300.

As random slips and swaps typically occur less often than once every sixteen cycles of primary clock 1040, a frequency divider 1920 is preferably operative to lower the binary output frequency to typically, one fourth of the primary clock frequency. The chaos tent function generating circuit's input 1990 and output 1940 are typically non-discrete voltages in the range of slightly more than ground voltage to slightly less than the maximum circuit voltage, VDD 1915. These voltages are typically in the working range of operational amplifiers 2010, 2040, and 2050 in the apparatus of FIG. 21C.

Typically, at any clock cycle on line 1970, the tent circuit input 1990 is the output voltage (from the previous clock cycle) from line 1940 of the circuit. The sample and hold circuit, 1975, is operative to store the previous voltage output from line 1940 to be output on line 1950 on the following clock cycle.

The function graph 2000 depicts the idealized next sampled output voltage 1940 as a function of the previously sampled output which is the next sampled input voltage, Vin, 1950 of a "tent" chaos device. The input-output relationship is typically approximated, e.g.:

$V_{out} = 2 V_{in}$ for $0 < V_{in} < 0.5\ VDD$, and, $V_{out} = 2 VDD - 2 V_{in}$ for $0.5\ VDD \langle V_{in} < VDD$.

In a typical analog configuration, approximately one half of the values exceed 0.5 VTH (the ideal threshold comparison voltage as shown in FIG. 21B) and the other half of the expected values are less than 0.5 VDD. If 0.5 VDD is the threshold value of a comparator, then the output of the comparator is typically a string of statistically balanced "1" and "0" logic values. As analog voltages typically are never perfectly stable, VTH, the idealized graphed "triangular"

tent values, and the maximum and minimum output values are typically not ideal values.

Typically, digital chaos functions map into "predictable" patterns. As is seen in FIG. 21B, the digital tent function, alone, is a poor source of randomness. This can be easily verified with a synthesized numerically generated string, with a tendency to map into stable conditions, typically with a short cyclical sequence.

To alleviate the danger of the apparatus of FIG. 21A progressing to a stable state, the apparatus is preferably traumatized, with a random "kick" in a preferred embodiment once every 64 cycles of the primary clock activated by a pulse on line 1960. The random kick pulse on line 1960 typically switches in the digital to analog converter 1905. D/A converter 1905 is operative to transform the 3 bit random input R3 on bus 1810, into one of 8 typically unstable voltage values output on line 1980, switched into "tent" function input 1990 by random kick switch 1965.

FIG. 21B is a pictorial illustration of two aberrant syndromes which may occur as a result of use of a digital voltage-in-voltage-out function in tent function unit 2000 of FIG. 21A.

If the input 1990 to tent function 2000 is VDD, then the output reverts to zero, and remains "stuck on zero", as shown by arrow 2170. In an "ideal" circuit, a zero input generates a zero output.

In such a digital tent function implementation, for any positive j integer, a multiple of Vin times 2j, e.g., 0.05 VDD, 0.1 VDD, 0.2 VDD, 0.4 VDD, maps into 0.8 VDD (shown on dotted mapping, 2120). VDD maps into 0.4 VDD, and 0.4 VDD maps back into 0.8 VDD on the output on 1940. This aberration maps into a theoretical oscillatory stable condition, i.e., ". . . 0.4 VDD to 0.8 VDD to 0.4 VDD to 0.8 VDD . . ." which may be expressed as follows:

if $V$out/in=0.4 $VDD$<–then–>$V$in/out=0.8 $VDD$.

In a stable analog implementation of chaotic function 2000, one can typically expect a colored random stream, with an in-balance of ones and zeroes, because of changing physical properties of electrical components, sensitive to temperature and voltage fluctuations. Typically, such a sequence does not map into a "get stuck on zero" syndrome. This is because the normal maximum voltage output of a microelectronic amplifier is typically slightly less than VDD, and therefore cannot force the output to zero voltage, and also because the minimum output of a microelectronic operational amplifier is typically a small positive offset value.

An imperfect tent with an inexact threshold value VTH can cause a maximum output for a range of input values, thereby mapping the circuit into repetitive known, and/or predictable, short cycles.

Even an analog circuit can "map into" an oscillating state for, typically, many clock cycles. Typically, an in-balance of ones and zeroes remains. Therefore, an occasional random value switched into line 1990 from line 1980 (by the once-in-16 circuit clocks on line 1960) typically switches in a voltage signal (a kick) from Digital to Analog convertor 1905 thereby maps the "tent" circuit 2000 into a "new" metastable condition.

Arrow 2170 signifies a digital condition that could force the circuit into a "stuck on zero" voltage condition.

A dotted line 2120 in FIG. 21B shows a mapping from 0.1 VDD input to output 0.2 VDD, the next input. This causes an output of 0.4 VDD which causes a doubled output to 0.8 VDD which causes an output of 0.4 VDD which now maps into a stable oscillation between 0.4 VDD and 0.8 VDD. The analog values oscillate between 0.4 VDD and 0.8 VDD, causing a . . . 0, 1, 0, 1, 0, 1 . . . stable binary output condition on line 1010.

FIG. 21C is a simplified electronic block diagram of a preferred implementation of the voltage-in-voltage-out function block 2000 of FIG. 21A. The preferred embodiment of the chaos tent circuit 2000 approximates the following tent function, where:

$V$out=2$V$in for 0<$V$in<0.5 $VDD$, and, $V$out=2$VDD$–2 $V$in for 0.5 $VDD$ ($V$in<$VDD$).

A threshold voltage VTH on line 2160 (typically at a level of 0.5 VDD) causes the comparator 2010 to operate switches 2020 and 2030 to selectably activate:

(a) circuit 2040 for Vin voltages of less than VTH; or (b) circuit 2050, for Vin voltages exceeding VTH.

The voltages of comparator 2010 are typically compliant to normal CMOS binary voltage, with typically, two output values: a maximum voltage of slightly less than VDD which signifies binary one, and voltages slightly exceeding ground voltage, signifying binary zero.

In the non-inverting amplifier 2040, the voltage divider from output to ground, where resistors 2090 and 2091 are equal values (RN=RN), typically maintains the inverting input at one half the output voltage. The inverting operational amplifier 2050 typically approximates the following function:

$V$in=(2$VDD$–2 $V$in) for the range (0.5 $VDD$ ($V$in<$VDD$)).

As in the inverting circuit 2050, the amplification of Vin is –2 (a steep 2 to 1 negative slope). Therefore, the ratio of the inverting amplification resistors 2092 to 2093 is 2 to 1. The ratio, x, of the voltage divider 2095 over resistor 2094, on the non-inverting terminal, to maintain the offset on the inverting terminal in the above equation is typically computed as follows, in view of the fact that the same current I1=I2 flows through both amplification resistors 2092 and 2093:

x VDD is the voltage on the non-inverting and inverting terminals, and;

I1=(Vin–x VDD)/RI=the current flowing through RI;

I2=(xVDD–(2 VDD–2 Vin))/2RI=the current flowing through 2RI, as virtually no current flows into the non-inverting terminal;

(Vin–x VDD)/RI=(x VDD–(2VDD–2 Vin))/2RI.

After solving for x, x=2/3, the voltage at the terminals is 2/3 VDD, and the resistance of resistor 2095 is double the resistance of resistor 2094.

FIG. 22B is a table derived from the prior art table of FIG. 22A showing acceptable ranges, according to the FIPS-140-2 standard of May 2001, for various parameters characterizing the runs present in a 10K binary string composing sequential samples from a random number generator.

The FIPS 140-2 specification of May 2001 defines a run of length x binary symbols as the occurrence of x consecutive same symbols in a binary string. The specification defines a statistically acceptable range of occurrences of runs of length one to six in a stream of 20,000 samples. The FIPS specification also defines a "long run" as a run of 26 identical bits (zeroes or ones) or more in length. In a trial sample of 20,000 bits, the test is passed if there are no long runs. The configurations of the preferred embodiments preclude occurrences of long runs of ones and zeroes.

Values for run lengths of 1 to 5 are as defined in the FIPS PUB 140-2 specification. Values as listed in FIG. 22B, for runs of length 6–14 bits, are extrapolated, following the maximum deviation gradient of run length values 1–5. For run values 15 to 22, which may appear in outputs of the preferred embodiments, the estimated statistical number of such runs in a 10K bit string are listed, e.g., after running 500 10K random number tests, one 22 bit run of zeroes or ones typically appears. The average number of expected runs for 23, 24 and 25 bit strings are not relevant for these embodiments, which are designed for byte-wise computers.

Figure 23:
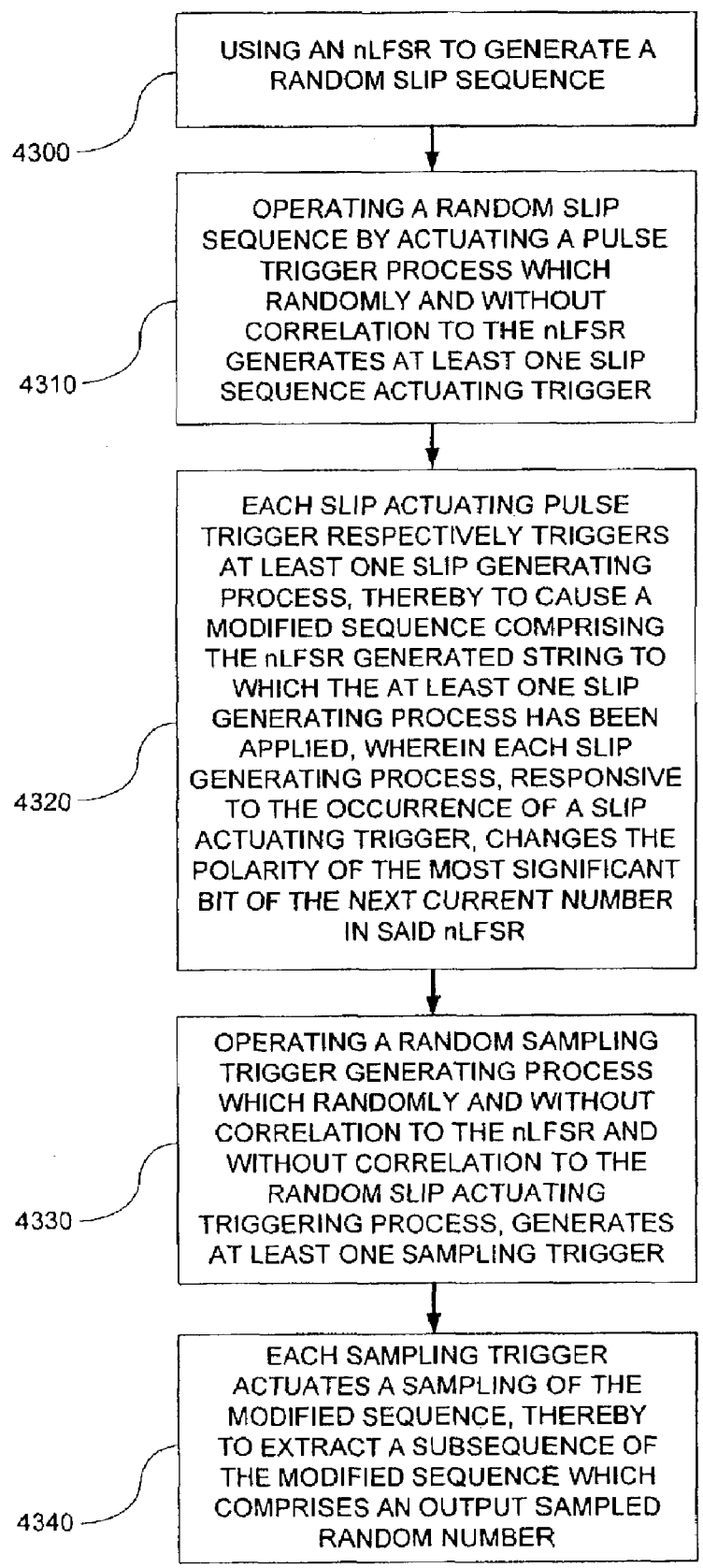
FIG. 23 is a simplified self-explanatory flowchart illustration of a preferred method for actuating a random jump (random slip) in a binary string generated in a non-linear feedback shift register, nLFSR, responsive to a random slip actuating pulse delivered to the nLFSR.
Figure 24:
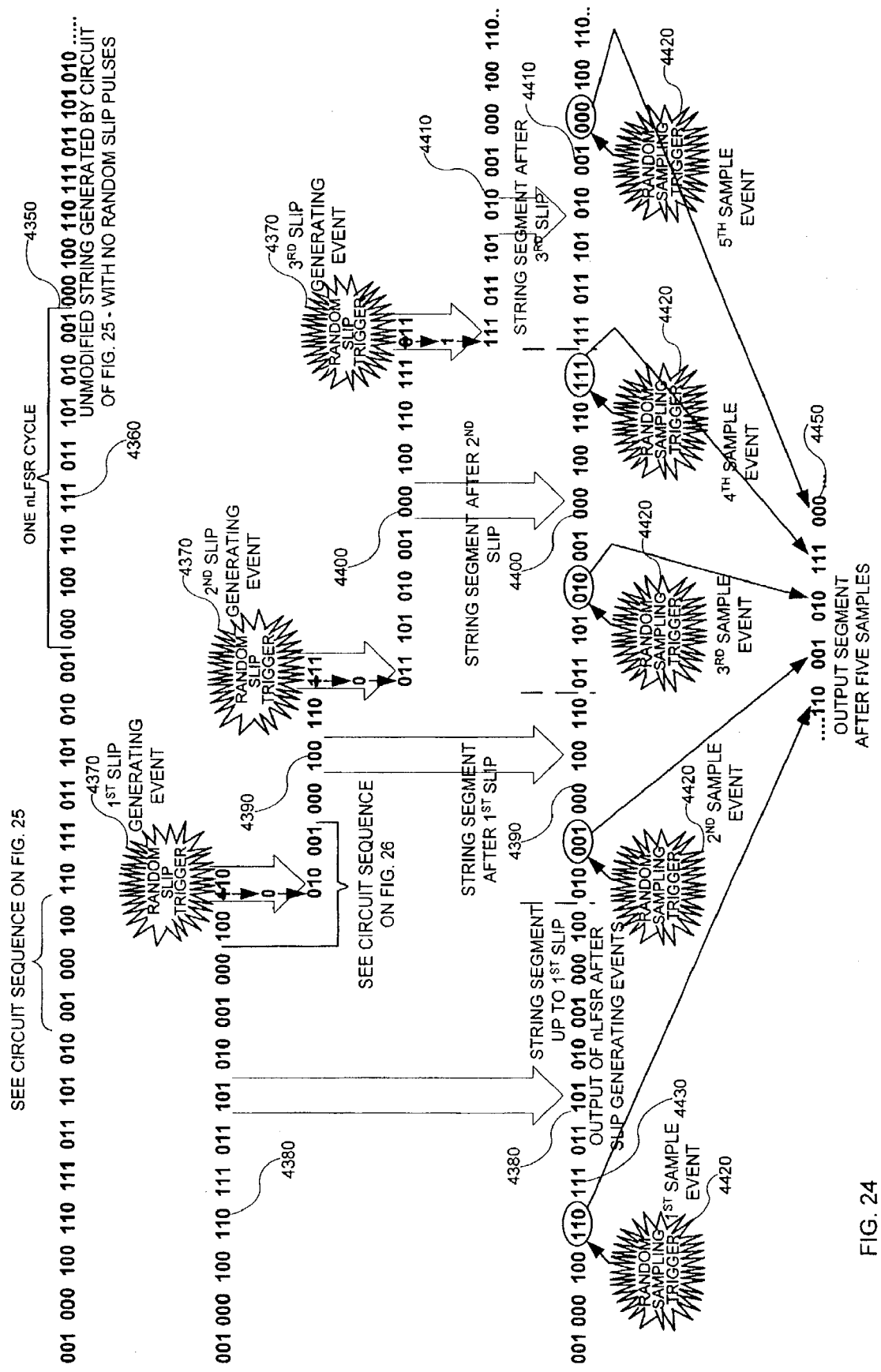
FIG. 24 is a pictorial representation of a sequence which may be generated by the nLFSR of FIGS. 23 and 24, and of the method and triggered events which may occur when generating a random string, and of events which may occur when sampling said 3 bit generator.

Reference is now made to FIG. 23 which is a simplified self-explanatory flowchart illustration of a preferred method for generating a string of random numbers, and to FIG. 24 which shows the results of performing the method of FIG. 23 on an example input. FIG. 24 is a simplified pictorial representation of a sequence which may be generated by the nLFSR of FIGS. 25 and 26, and of the method and triggered events which may occur when generating a random string, and of events which may occur when sampling said 3 bit generator.

As shown, an nLFSR (not shown) is employed (step 4300) to generate an nLFSR generated string 4350. Next (step 4310), a random slip actuating triggering process randomly, and without correlation to the nLSFR, generates at least one slip actuating triggers 4360. The slip actuating triggers 4360 respectively trigger at least one slip generating process 4370, thereby defining a modified string 4380 comprising the nLFSR generated string to which the at least one slip generating processes 4370 have been applied. In step 4320, responsive to occurrence of a slip actuating trigger 4360, each slip generating process 4370 reverses the most significant bit of a current number in the nLFSR generated string 4350.

In step 4330, a random sampling triggering process is operated which, randomly and without correlation to the nLSFR and without correlation to the random slip actuating triggering process, generates at least one sampling triggers 4380. Each trigger 4380 triggers a sampling event 4390 each of which (step 4340) samples the modified string 4380, thereby to generate a subsequence 4400 of the modified string 4380, the subsequence comprising an output string of random numbers 4410.

Figure 25:
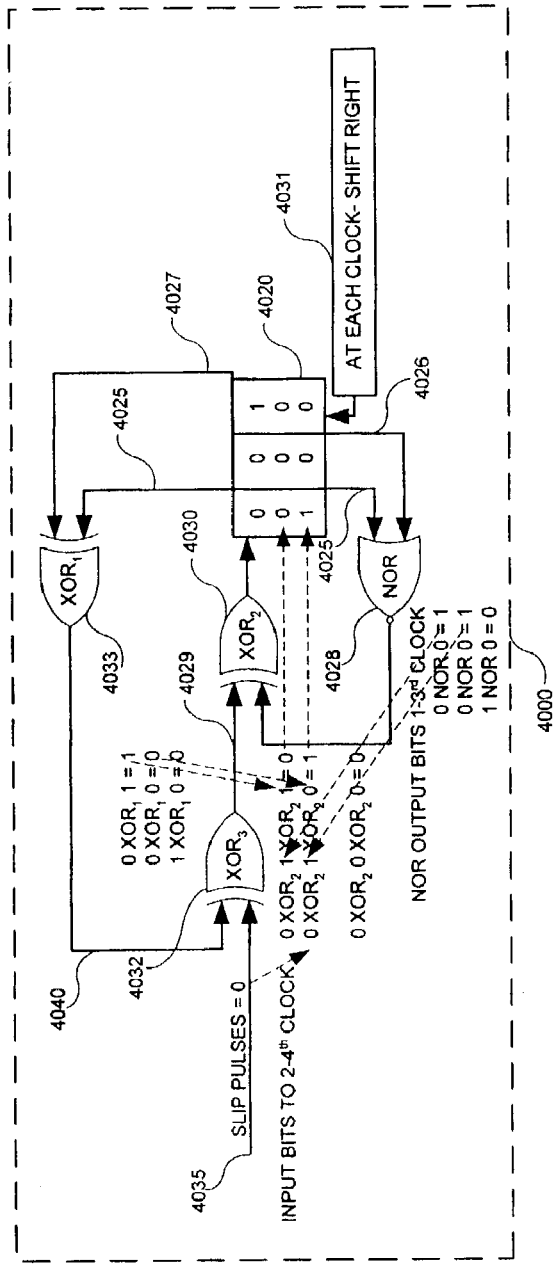
FIGS. 25 and 26 are pictorial representation of two non-linear events which may occur in the operation of the sequences of FIG. 24.
Figure 26:
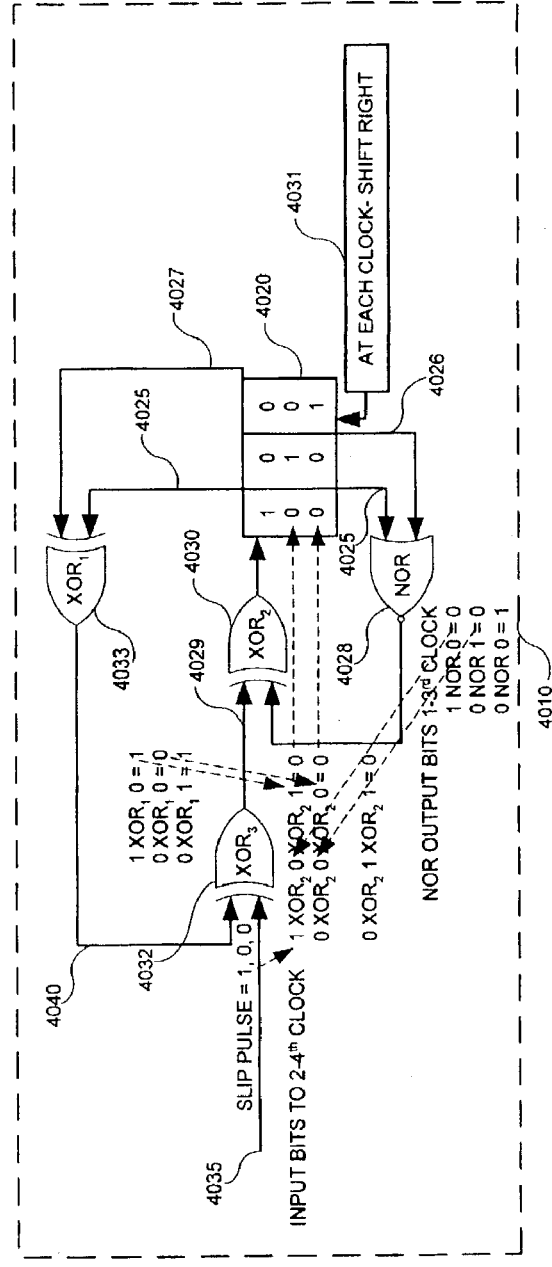

FIG. 24 is a pictorial representation of a sequence which may be generated by the nLFSR of FIGS. 23 and 24, and of the method and triggered events which may occur when generating a random string, and of events which may occur when sampling said 3 bit generator;

FIGS. 25 and 26 are pictorial representations of two non-linear events which occur in the generation of the illustrated sequences of FIG. 24. FIGS. 25–26 show two functions which differentiate this generator from the class of prior art maximum length linear feedback shift registers. FIG. 25 demonstrates the insertion of an all zero stage and the progress of forcing a most significant one into the sequence when the sequence is in an all zero state and FIG. 26 demonstrates the aberration caused by the occurrence of a slip pulse on the external input 4035;

FIG. 25 demonstrates the insertion of an all zero stage-between 001 and 100 in flip flop array output table 4020. 000 is not a stage in a linear LFSR sequence. This process forces a most significant one into a sequence typically when the output of array table is in an all zero state.

FIG. 26 illustrates an example of a typical aberration caused by the occurrence of a slip pulse on the external input on line 4035. The three outputs of the nLFSR are output 4025 from flip-flop FF1, output 4026 from flip-flop FF2, and output 4027 from flip-flop FF3 as shown in FIGS. 25 and 26.

The apparatus of FIG. 25 is non-linear because at the second clock, the NOR gate 4028 forces the nLFSR to an all zero state and at the 3rd clock, the NOR gate 4028 forces flip-flop FF1 to logic one, precluding the "stuck on zero" syndrome. The apparatus of FIG. 26 is non-linear because at the second clock, the feedback is complemented by the slip pulse, which is sampled at the end of the first clock, and thereby modifies the normal LFSR output from 110 to 010.

If XOR2 gate 4030 is replaced with an OR gate, 000 is no longer a valid value in the sequence of FIG. 25. The single maximum length sequence for a length 3 shift register has two taps, i.e., from flip-flop FF1 on line 4025, and from flip-flop FF3, on line 4027. In the block tables 4020 in both FIGS. 25 and 26, the rows represent three temporal states of flip-flops FF1, FF2 and FF3, respectively, during the example procedures of FIGS. 25 and 26.

XOR1 gate 4033 generates normal LFSR feedback which is output on line 4040. XOR3 gate 4032 is operative to cause a non-linear modification on line 4029, only when a Slip Pulse on line 4035 is logic one, as in FIG. 26.

NOR gate 4028 is operative to output a one when FF outputs on lines 4025 and 4026 are zeroes.

In the example of FIG. 25, the Slip Pulse is not activated and two changes of linearity occur in the second and third stages. At the first stage output 001 in flip flop output table 4020 in FIG. 25 the normal linear feedback activation is (0 on output line 4025) XORed to (1 on output line 4027). This causes a normal linear output of logic 1 on line 4040, which in linear operation averts a "stuck on zero" sequence. In this configuration, as there is no input into the NOR gate 4028 from the most significant flip-flop FF3, the NOR gate 4028 outputs a logic one, complementing the feedback one to a zero. This forces the circuit, at the next clock shifting, into an all zero non-linear configuration, 000. At the next stage, when all flip-flops are in zero logic state the NOR gate forces the output of XOR 4030 to one, enacting a binary value 100, the third stage of flip flop array table 4020 in FIG. 25 In the example of FIG. 26, the Slip pulse is activated, at stage one, XORed to the linear feedback on line 4040 also at logic 1, to output a zero on line 4029, which is the input at stage two in flip flop array 4020. The stage two nLFSR output is therefore 010 instead of the normal linear LFSR output, binary 110.

Figure 27:
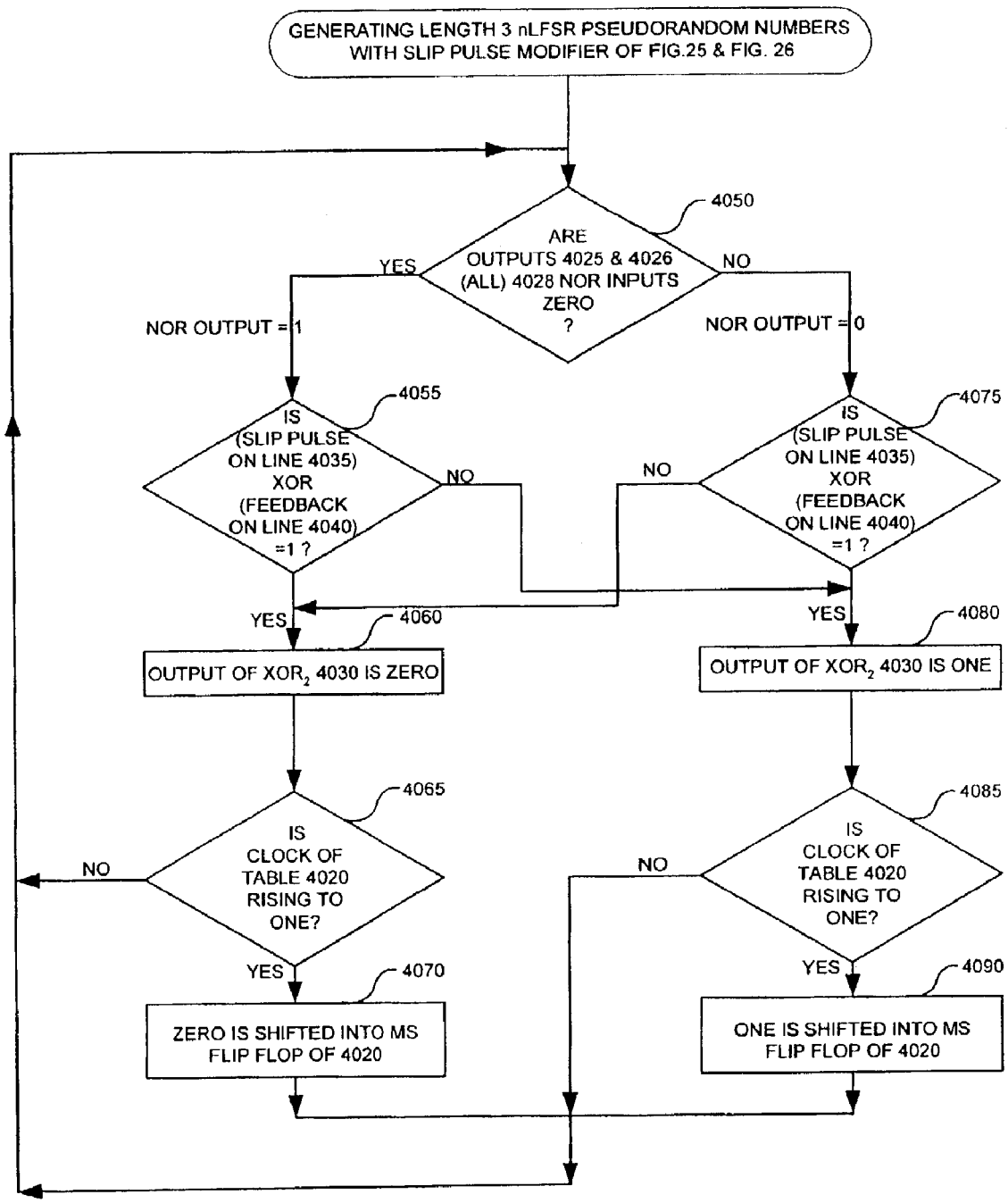
FIG. 27 is a simplified self-explanatory flowchart demonstrating a preferred method of complementing slip pulses and forcing a most significant one into the sequence when the sequence in the shift register is in a long run zero state as shown in FIGS. 25 and 26.

FIG. 27 is a simplified self-explanatory flowchart illustration of a preferred method for complementing slip pulses and forcing a most significant one into the sequence when the sequence in the shift register is in an all zero state as in FIGS. 25 and 26.

Figure 28:
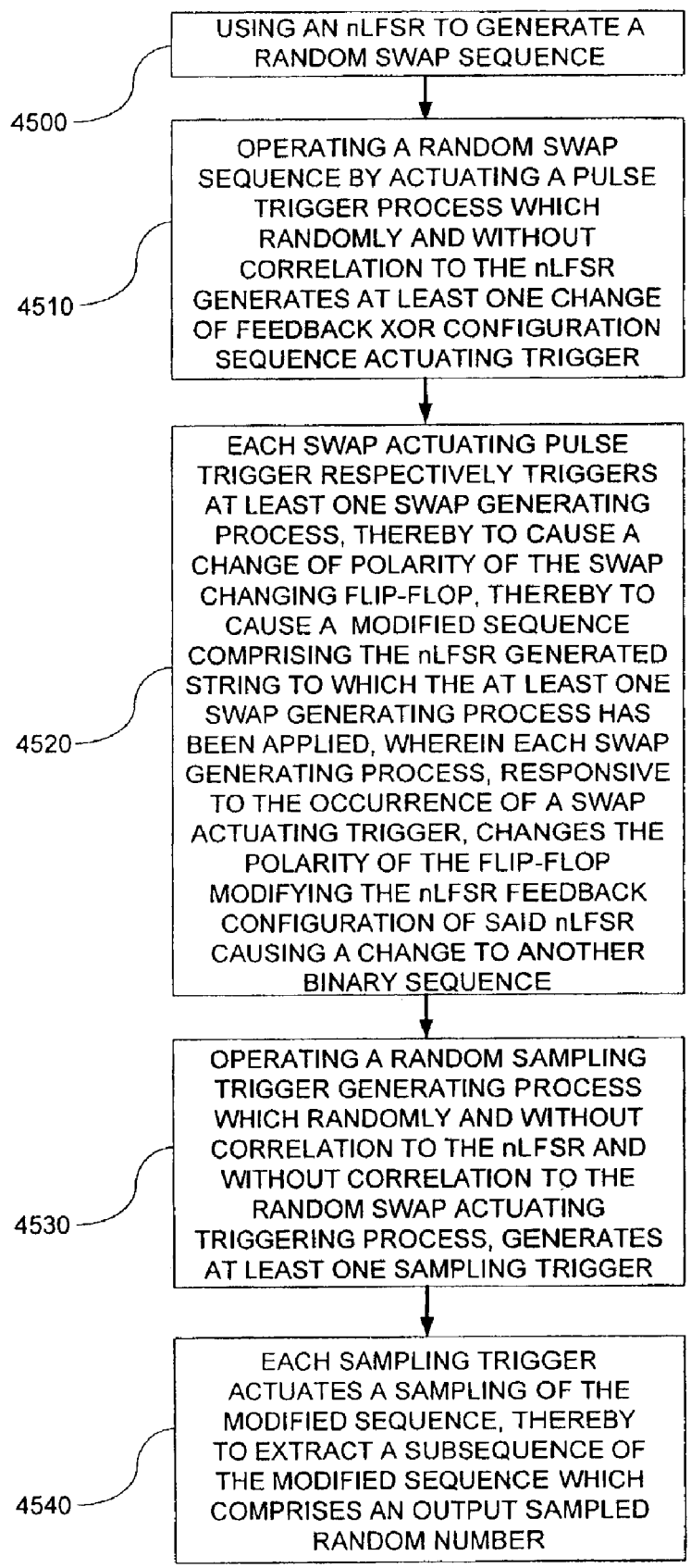
FIG. 28 is a simplified self-explanatory flowchart illustration of a preferred method for actuating a random swap in a binary string stored in a non-linear feedback shift register, responsive to a random swap change of feedback configuration command delivered to the non-linear feedback shift register.

FIG. 28 is a simplified self-explanatory flowchart illustration of a preferred method for actuating a random swap enabled by alternating between the two binary feedback configurations.

Figure 29:
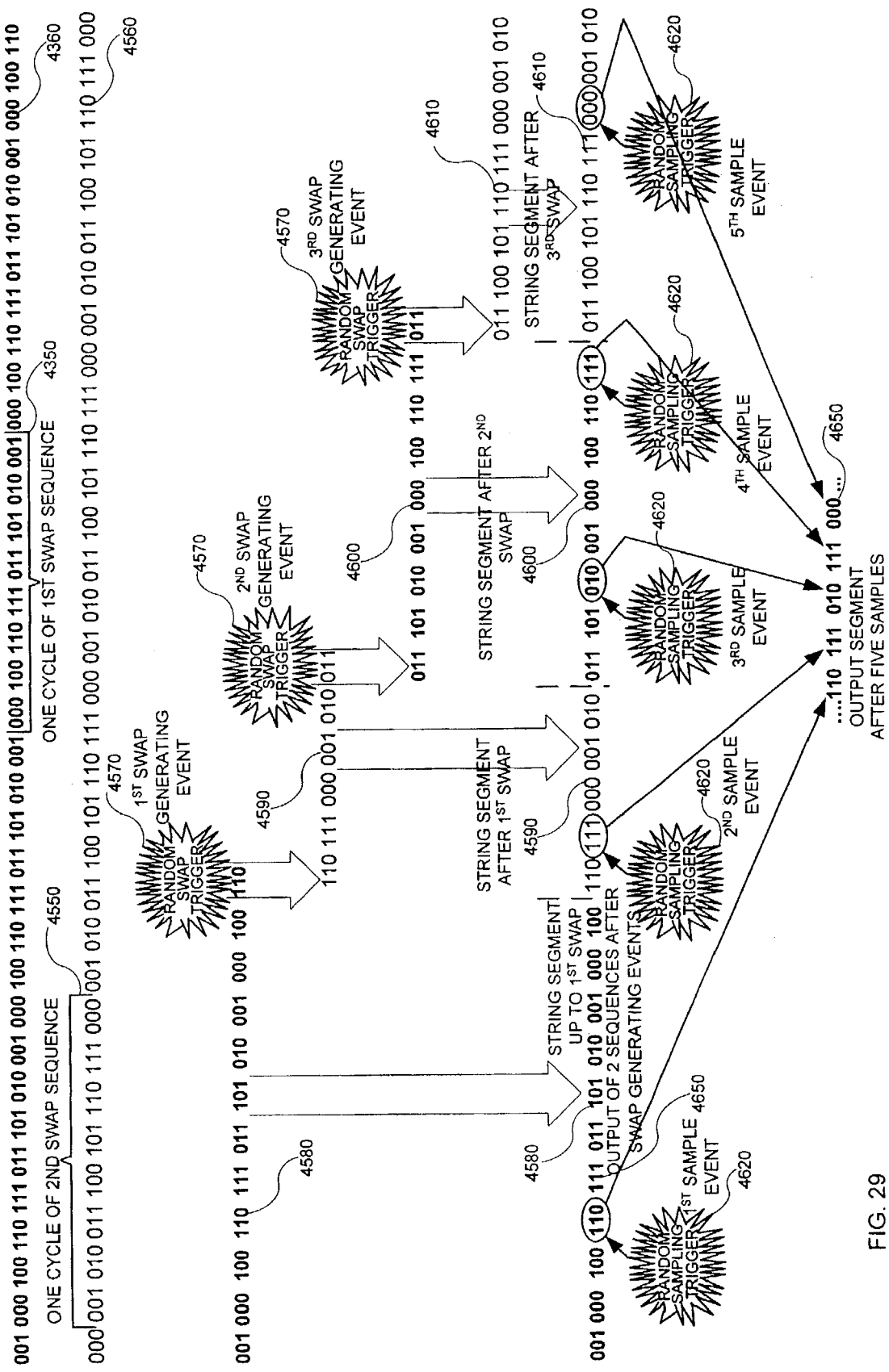
FIG. 29 is a pictorial representation of a preferred random swap manipulation of two pseudorandom sequences responsive to random swap events and to the random sampling triggered events operative to output a random string.

FIG. 29 is a pictorial representation of a preferred random swap manipulation between two pseudorandom sequences. The "swap" method of FIG. 29 generates a non-cyclic binary number sequence which is sampled at occurrences of random triggers.

FIG. 30 is a pictorial representation of a preferred word-wise XOR method for sampling an nLFSR generated random string. The method of FIG. 30 is preferably operative to mask the true value of the sampled binary number stream at the instant of sampling by enacting a word-wise XOR function. Word strings 4785 are sampled by trauma pulses 4720, 4722, 4724 and 4726. Word strings 4785 are stored in FF arrays 4762. Two randomly sampled strings, a previous one in FF array 4762 and a present sampling 4785, are word-wise XORed to the inputs 4765 to the FIPS 140-2 type filter 4745.

The two input strings 4785 and 4762 comprise a presently sampled binary value and a previously sampled binary value.

A typical cycle is demonstrated starting at instant T1, wherein a previous sampling 00010, marked with reference numeral 4785, is stored in intermediary register bank 4762. Sampling 00010 is bitwise XORed with T1 sampling 11101. 00010 bitwise XORed to 11101 produces a "long run of one" result on bus 4765. "Filter on 3" 4740 is operative to test whether bits 1, 2, 4, and 5 are same symbol; and to output a 1 to the status register, if such same symbols are detected. Filter 4740 forces a complementary symbol into the middle bit of output 4770, a segment of the output port, when the value in word-wise XORed output 4765 is suspect. The FIPS 140-2 type filter 4745 outputs a suspect logic 1 signal into FF 4780 as it senses four ones in 4765 output. As filter 4745 does not sense the middle bit (which may have been a one) in the output of 4765, the test is not conclusive. A READ command 4730 is received at instant T2, indicated by reference numeral 4705, thereby outputting 11011 to the Host Bus 4750.

FIG. 31 is a simplified diagram illustrating a preferred embodiment of a three section noise emulator receiving random outputs 1310, 1810, and 1303 from the nLFSR 1300 of FIG. 10.

Logic inverter loads in Levels I to VII generate current consumption noise only when an input to a corresponding one of NAND gates 1740–1746 changes polarity (zero to one or one to zero). Coprocessors 1730–1736 are typically all or part of an unused SHA-1 Hash generator, typically depicted in FIG. 33.

FIGS. 32A–32G are simplified diagrams of example contents of the random logic current emulation device 1004 of FIG. 31, after temporally adjacent clock cycles i–vii respectively, as a result of shifting an example clocked random vector, as shown, through the noise emulation device 1004. As shown in the example illustrated in FIG. 31, the level I cell (cell i+6) of shift register 1725 is associated with a single toggled gate and the level II–VI cells (cells i+5, i+4, i+3, i+2, i+1 and i, respectively) of shift register 1725 are respectively associated with 4, 6, 7, 3, 5 and 2 toggled gates.

FIG. 32A illustrates the contents of cell subarray 1727 in FIG. 31 after clock cycle i. The toggled loads are indicated by black dots. As shown, the toggled loads in FIG. 32A belong to cells associated with 1, 4, 6, 5 and 2 gates respectively and therefore, the total number of toggled noise gates after clock cycle i is 1+4+6+5+2=18 toggled noise gates.

Similarly, for FIGS. 32B to 32G, the total numbers of toggled noise gates after clock cycles i+1 to i+6, respectively are 15, 18, 21, 22, 23 and 14, respectively.

It is appreciated that the example shown in FIGS. 31 and 32A–32G is based, for simplicity, on a very small number of load gates associated with each cell. More typically, a much larger number of load gates is associated with each cell, e.g. thousands of load gates may be associated with each cell.

FIG. 33 is a simplified block diagram of a preferred embodiment of a random number generating device. The device includes the device of FIG. 10 and a Secured Hash Standard Coprocessor, operative to receive the output of unprocessed sequences from the two nLFSRs of FIG. 10, operative to compress the data into 160 bit random strings.

Figure 34:
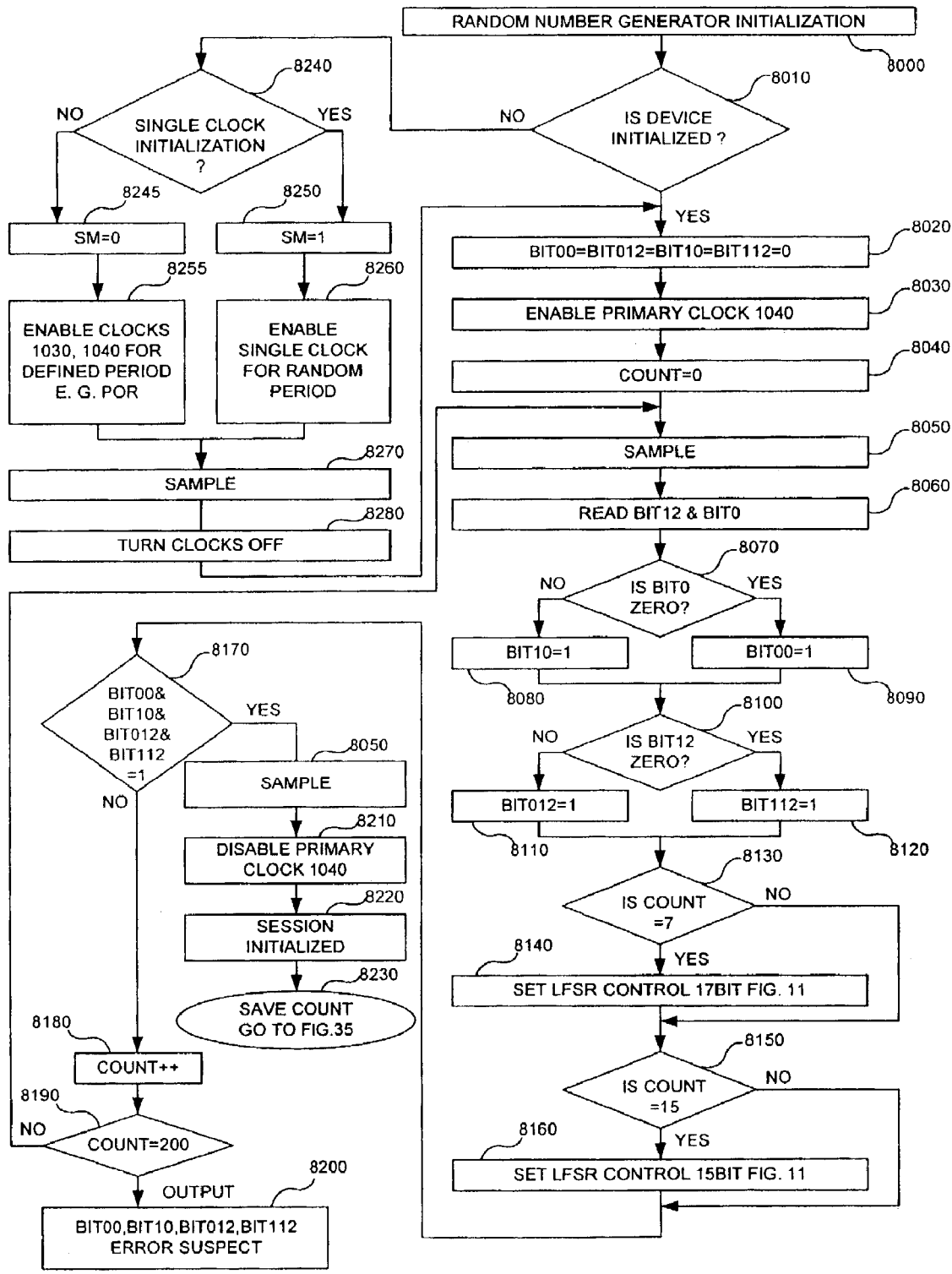
FIG. 34 is a simplified self-explanatory flowchart illustration of a preferred method for two step initialization of random number generators such as the random number generator of FIG. 10.

FIG. 34 is a simplified self-explanatory flowchart demonstrating the methods of two step initialization of the preferred embodiment of FIG. 10. In the first step, a condition of unpredictability is achieved, either by single clock mode activation for a known random time interval, or in the dual clock mode for a typically shorter time interval. The second non-deterministic pre-session test and initialization sequence is operative to ascertain that the least significant observable output bits of the 15 and 17 bit nLFSRs are toggled, thereby proving that the primary clock is operative. Assuming that the first step output is unpredictable, the second step test procedure, maintains unpredictability and assures that the primary clock is shifting both nLFSRs.

Methods for processing of two step initialization of the preferred embodiment of FIG. 10, wherein the second uncorrelated clock is enabled at most for a short initialization, interval, typically operative in wireless communication environments.

In the first step, a condition of unpredictability is achieved, either by single clock mode activation for a known random time interval, or in the dual clock mode for a typically shorter time interval.

The second non-deterministic pre-session test and initialization sequence is operative to ascertain that the least significant observable output bits of the 15 and 17 bit nLFSRs are toggled, thereby proving that the primary clock is operative. Assuming that the first step output is unpredictable, the second step test procedure maintains unpredictability and assures that the primary clock is functioning properly therefore operative to shift both nLFSRs at full clock frequency.

Session unpredictability is assured in devices with finger operated keypad switches, actuated for short random intervals. For such intervals the primary clock is enabled for the length of the keystroke, if at start of the interval the primary clock was not enabled; and conversely, for the interval of the keystroke is disabled, if before the key stroke, the primary clock was enabled, then for the interval of the keystroke, the primary clock is disabled.

Figure 35:
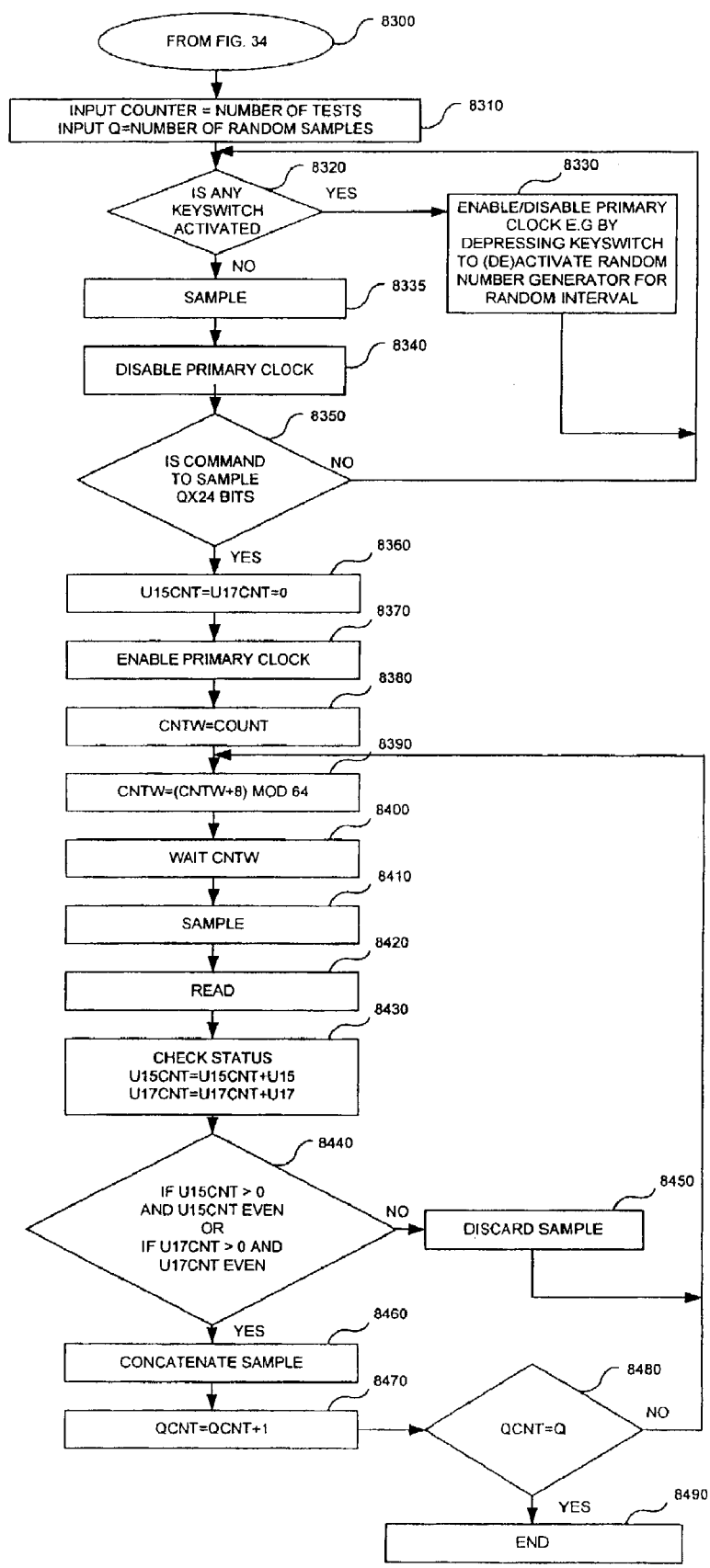
FIG. 35 is a simplified self-explanatory flowchart illustration of a preferred method for iteratively reinitializing a random number generator in a wireless communication device having a keypad in response to a user's activation motion such as pressing of a key on the wireless communication device's keypad, the number of iterations performed being a function of the random interval of time for which the key remains depressed.

FIG. 35 is a simplified self-explanatory flowchart illustration of a preferred method for iteratively reinitializing a random number generator in a wireless communication device having a keypad in response to a user's activation motion such as pressing of a key on the wireless communication device's keypad, the number of iterations performed being a function of the random interval of time for which the key remains depressed;

FIGS. 34 and 35 together demonstrate preferred methods of two step initialization of the preferred embodiment of FIG. 10 in a typical wireless communication keypad activated implementation.

In the first step, a condition of unpredictability is achieved, either by single clock mode activation for a known random time interval, or by activating in dual clock mode for a typically shorter time interval. In the second non-deterministic pre-session test a re-initialization of internal variables to an unpredictable status is effected by the random intervals of users' keystrokes.

Figure 36A:
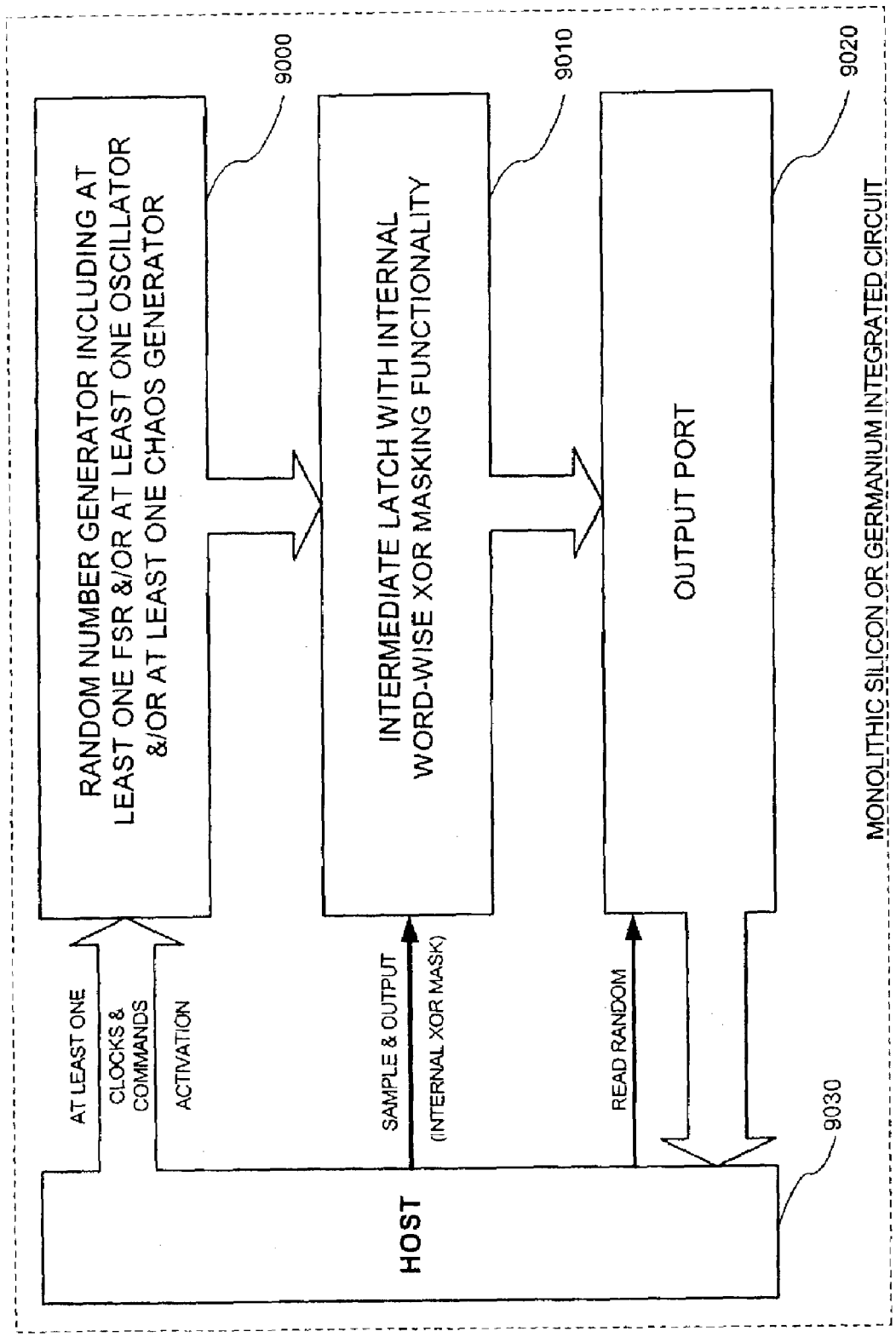
FIG. 36A is a simplified functional block diagram of a preferred random number generating integrated circuit with internal XOR masking to mask internal variables therewithin.

FIG. 36A is a simplified functional block diagram of a random number generating integrated circuit with internal XOR masking to mask internal variables therewithin constructed and operative in accordance with a preferred embodiment of the present invention. The apparatus of FIG. 36A typically comprises a monolithic silicon or germanium integrated circuit having therein a host 9030, a random number generator 9000, a latch 9010 with internal wordwise XOR masking functionality and an output port 9020. The term "internal XOR masking" refers to masking of internal variables of a random number generating process by word-wise XOR. For example, use of at least one word-wise XOR function, e.g. as in FIG. 14, to mask the internal state of nLFSR variables in a random number generator. At least one word-wise XOR function and typically many, may be employed, e.g. if the random number generator includes more than one internal source of randomality or pseudorandomality (such as one or more nLFSRs and/or one or more oscillators and/or one or more chaos generators). Each word-wise XOR function is typically applied to at least one pair of random samples generated by at least one of internal sources of randomality or pseudorandomality in the random number generator. Internal XOR masking may comprise use of nLFSR masking XOR, use of oscillator masking XOR or use of chaos generator masking XOR, or any combination thereof.

A particular feature of a preferred embodiment of the present invention is that at least one attribute of a user's key-pressing behavior, such as key-press duration, is used to enhance the unpredictability of a random number generator associated with a keyboard being employed by the user such as a wireless communication device keypad. For example, the random number generator may be reinitializable by means of an iterative reinitialization procedure and the duration of each key-press may be used to activate the iterative reinitalization procedure and to determine, randomly, the number of iterations of the procedure. The flowchart of FIG. 18 illustrates an example of an iterative procedure for reinitializing a random number generator (the loop of steps 3000–3069).

Figure 36B:
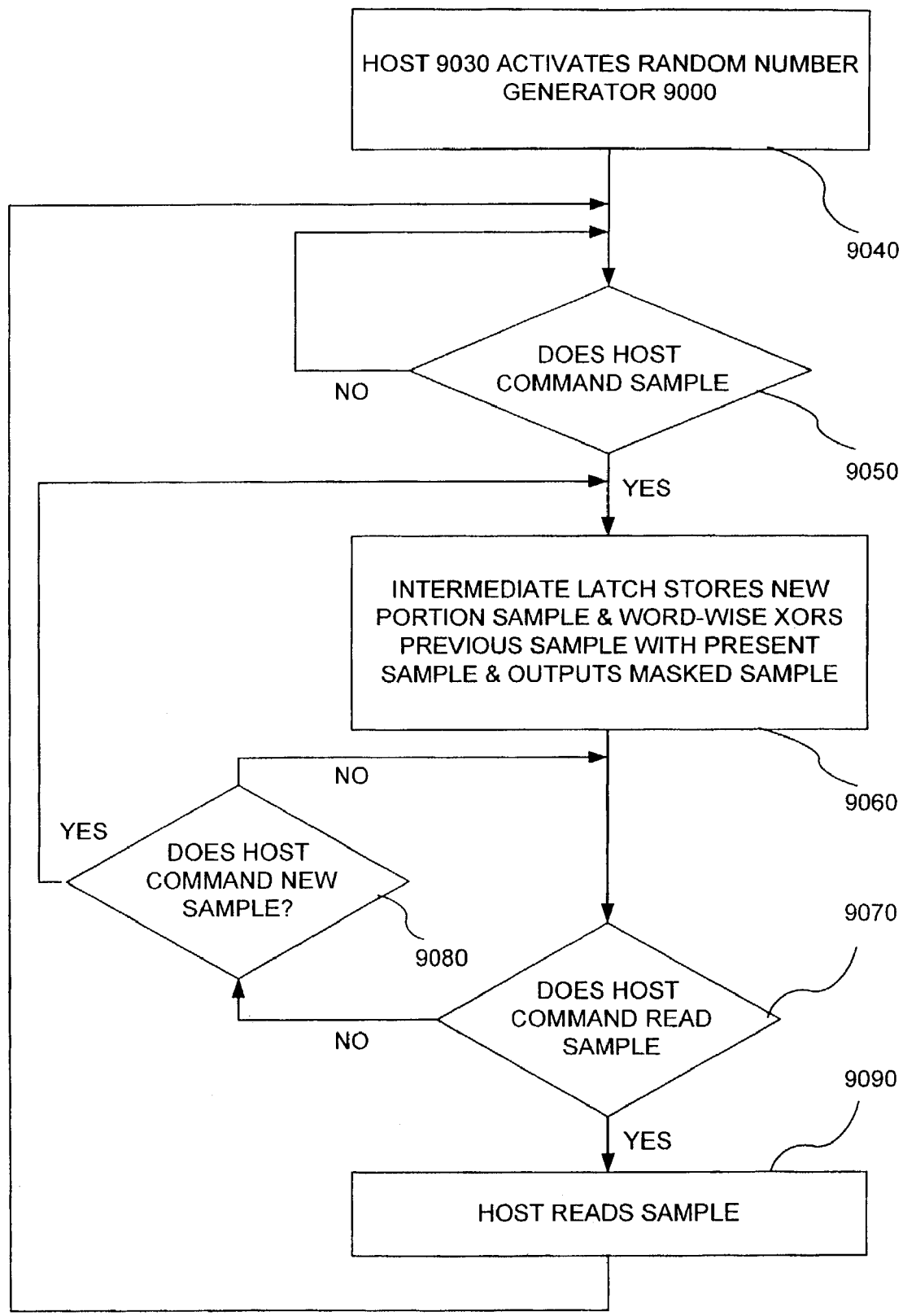
FIG. 36B is a simplified flowchart illustration of a preferred method of operation for the apparatus of FIG. 36A which is preferably implemented by suitable programming of the host in the apparatus of FIG. 36A.

FIG. 36B is a simplified flowchart illustration of a preferred method of operation for the apparatus of FIG. 36A which is preferably implemented by suitable programming of the host in the apparatus of FIG. 36A.

It is appreciated that the software components of the present invention may, if desired, be implemented in ROM (read-only memory) form. The software components may, generally, be implemented in hardware, if desired, using conventional techniques.

It is appreciated that the particular embodiment described is intended only to provide an extremely detailed disclosure of the present invention and is not intended to be limiting.

It is appreciated that various features of the invention which are, for clarity, described in the contexts of separate embodiments may also be provided in combination in a single embodiment. Conversely, various features of the invention which are, for brevity, described in the context of a single embodiment may also be provided separately or in any suitable subcombination.

It will be appreciated by persons skilled in the art that the present invention is not limited to what has been particularly shown and described hereinabove. Rather, the scope of the present invention is defined only by the claims that follow:

The invention claimed is:

1. A microelectronic apparatus for generating random binary words comprising:
    at least one clocked pseudorandom binary number sequence generator normally operative to generate a cyclic output sequence of binary numbers, each number comprising a string of binary symbols, the cyclic output sequence comprising a basic sequence which is generated repeatedly;
    at least one bit stream generator generating a clocked bit stream including a stream of binary symbols of a first type occasionally interrupted by a binary symbol of a second type, wherein a first varying time interval between the occasional interruptions is intractably correlated to the output sequence of said number sequence generator, wherein each occurrence of an interruption of the stream of binary symbols of the first type by a binary symbol of the second type causes a pseudorandom modification of the cyclic output sequence of said number sequence generator; and
    a sampling device operative to sample said cyclic output sequence of binary numbers thereby to generate a sampled output sequence comprising at least one sampled binary word.

2. Apparatus according to claim 1 wherein the sampling device is operative to sample responsive to receipt of CPU requests and wherein sampling responsive to at least one CPU request occurs a random waiting interval after the CPU request has been made.

3. Apparatus according to claim 1 wherein the sampling device is operative to sample responsive to receipt of CPU requests and wherein sampling responsive to at least one CPU request occurs during the clock cycle immediately following the CPU request.

4. Apparatus according to claim 1 wherein the pseudorandom modification comprises a pseudorandom displacement.

5. Apparatus according to claim 4 wherein the clocked pseudorandom binary number sequence generator comprises a feedback shift register and wherein the pseudorandom displacement is caused by complementing the serial feedback bit in the feedback shift register using pulsed "1" bits which are externally generated at intractably difficult to estimate intervals of time.

6. Apparatus according to claim 1 wherein the pseudorandom modification of the cyclic output sequence comprises a pseudorandom cycle rearrangement.

7. Apparatus according to claim 6 wherein the pseudorandom cycle rearrangement is caused by a Random Swap of the set of feedback taps actuated by an externally generated pulsed "1" bit at an intractably difficult to estimate clock period.

8. Apparatus according to claim 1 wherein said pseudorandom modification comprises a random slip in which a portion of the cyclic output sequence is omitted.

9. Apparatus according to claim 1 wherein said pseudorandom modification comprises a random swap in which the basic sequence is modified.

10. Apparatus according to claim 9 wherein said random swap comprises a permutation of the basic sequence.

11. Apparatus according to claim 1 wherein said at least one bit stream generator comprises at least two bit stream generators generating first and second streams, wherein each occurrence of an interruption of the first stream by a binary symbol of the second type causes a random slip in which a portion of the cyclic output sequence is omitted and each occurrence of an interruption of the second stream by a binary symbol of the second type causes a random swap in which the basic sequence is modified.

12. A microelectronic apparatus according to claim 1 and also comprising an apparatus for enhancing the randomness of said random binary words including apparatus for generating an output binary stream by combining a plurality of n-bit samplings of said sampled output sequence.

13. A microelectronic apparatus according to claim 12 wherein said apparatus for generating comprises XOR apparatus for XORING the plurality of n-bit samplings.

14. A microelectronic apparatus according to claim 1 and also comprising:
an internal XOR masking intermediate latch operative to receive said sampled output sequence and at least a portion of at least one of said cyclic output sequence and said clocked bit stream and to mask at least one of said at least one of said cyclic output sequence and said clocked bit stream by word-wise XOR, thereby to generate an internal XOR masked output; and
an output port for receiving the internal XOR masked output.

15. A microelectronic apparatus for generating binary words comprising:
at least one clocked pseudorandom binary number sequence generator normally operative to generate a cyclic output sequence of binary numbers, each number comprising a string of binary symbols, the cycling output sequence comprising a basic sequence which is generated repeatedly;
at least one bit stream generator generating a clocked bit stream including a stream of binary symbols of a first type occasionally interrupted by a binary symbol of a second type,
wherein each occurrence of an interruption of the stream of binary symbols of the first type by a binary symbol of the second type causes a pseudorandom modification of the cyclic output sequence of said number sequence generator,
wherein said pseudorandom modification comprises a random slip in which a portion of the cyclic output sequence is omitted.

16. A microelectronic apparatus for generating binary words comprising:
at least one clocked pseudorandom binary number sequence generator normally operative to generate a cyclic output sequence of binary numbers, each number comprising a string of binary symbols, the cycling output sequence comprising a basic sequence which is generated repeatedly;
at least one bit stream generator generating a clocked bit stream including a stream of binary symbols of a first type occasionally interrupted by a binary symbol of a second type,
wherein each occurrence of an interruption of the stream of binary symbols of the first type by a binary symbol of the second type causes a pseudorandom modification of the cyclic output sequence of said number sequence generator,
wherein said pseudorandom modification comprises a random swap in which the basic sequence is modified.

17. Apparatus according to claim 16 wherein said pseudorandom modification also comprises a random slip in which a portion of the cyclic output sequence is omitted.

18. A sampling device comprising:
an interface for receiving a CPU request to sample an at least pseudorandom binary stream; and
a sampler operative to sample the binary stream, responsive to at least one CPU request received by the interface, after a random waiting interval has elapsed.

19. A method for generating a sequence of random numbers comprising:
using an nLFSR to generate an nLFSR generated string;
operating a random slip actuating triggering process which randomly and without correlation to the nLSFR generates at least one slip actuating triggers respectively triggering at least one slip generating process, thereby to define a modified string comprising the nLFSR generated string to which the at least one slip generating processes have been applied, wherein each slip generating process, responsive to occurrence of a slip actuating trigger, reverses the most significant bit of a current number in said nLFSR generated string; and
operating a random sampling triggering process which, randomly and without correlation to the nLSFR and without correlation to the random slip actuating triggering process, triggers a sampling of the modified string, thereby to generate a subsequence of the modified string which comprises an output string of random numbers.

20. A method according to claim 19 and also comprising:
masking internal variables of at least one of said nLFSR and said at least one slip actuating trigger by word-wise XOR.

* * * * *